United States Patent
Tokuyama et al.

(10) Patent No.: US 7,968,925 B2
(45) Date of Patent: Jun. 28, 2011

(54) POWER SEMICONDUCTOR MODULE FOR INVERTER CIRCUIT SYSTEM

(75) Inventors: Takeshi Tokuyama, Hitachi (JP); Kinya Nakatsu, Hitachinaka (JP); Ryuichi Saito, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/886,904

(22) Filed: Sep. 21, 2010

(65) Prior Publication Data
US 2011/0069455 A1 Mar. 24, 2011

Related U.S. Application Data

(63) Continuation of application No. 12/060,629, filed on Apr. 1, 2008, now Pat. No. 7,812,443.

(30) Foreign Application Priority Data

Apr. 2, 2007 (JP) ................................. 2007-096536

(51) Int. Cl.
H01L 29/76 (2006.01)
(52) U.S. Cl. ........ 257/299; 257/706; 257/717; 257/720; 257/796; 257/E31.097
(58) Field of Classification Search .................. 257/299, 257/706, 717, 720, 796, E31.097
See application file for complete search history.

(56) References Cited

U.S. PATENT DOCUMENTS

| 2004/0222515 A1 | 11/2004 | Choi et al. |
| 2005/0040515 A1 | 2/2005 | Inoue et al. |
| 2007/0096278 A1 | 5/2007 | Nakatsu et al. |

FOREIGN PATENT DOCUMENTS

| JP | 2005-175163 A | 6/2005 |
| JP | 2005-237141 A | 9/2005 |
| JP | 2006-202899 A | 8/2006 |
| JP | 2007-53295 A | 3/2007 |
| JP | 2007-299781 A | 11/2007 |
| JP | 4039339 B2 | 1/2008 |

*Primary Examiner* — Thanh V Pham
(74) *Attorney, Agent, or Firm* — Crowell & Moring LLP

(57) ABSTRACT

A double-face-cooled semiconductor module with an upper arm and a lower arm of an inverter circuit includes first and second heat dissipation members, each having a heat dissipation surface on one side and a conducting member formed on another side through an insulation member. On the conducting member on the first dissipation plate is provided with a fixing portion that fixes a collector surface of the semiconductor chip and a gate conductor connected to a gate terminal of the semiconductor module. The gate electrode terminal and the gate conductor are wire bonded. The conducting member on the second heat dissipation member is connected to an emitter surface of the semiconductor chip connected to the first heat dissipation member. The productivity and reliability are improved by most of formation operations for the upper and lower arms series circuit on one of the heat dissipation member.

8 Claims, 36 Drawing Sheets

POWER SEMICONDUCTOR MODULE FOR INVERTER CIRCUIT SYSTEM

CROSS-REFERENCE TO RELATED APPLICATIONS

This application is a continuing application of U.S. application Ser. No. 12/060,629, filed Apr. 1, 2008, which claims priority under 35 U.S.C. §119 to Japanese Patent Application No. 2007-096536, filed Apr. 2, 2007, the entire disclosure of which are herein expressly incorporated by reference. Additionally, this application contains related subject matter to Assignee's U.S. application Ser. No. 12/019,990, filed Jan. 25, 2008, and entitled "Power Conversion Apparatus".

BACKGROUND OF THE INVENTION

1. Field of the Invention

The present invention relates to a power conversion device equipped with an inverter circuit and more particularly to a power semiconductor module for an inverter circuit system having a heat dissipation member.

2. Description of Related Art

Some types of conventional technology intended to increase heat dissipation efficiency of a semiconductor module by efficiently transferring heat from the semiconductor module include, for example, the cooling structure are disclosed in Japanese Laid-Open Patent Application No. 2005-175163. According to the description of Japanese Laid-Open Patent Application No. 2005-175163, a semiconductor module is inserted in a hole formed in a radiator for inserting a semiconductor module to allow heat to be released from a surface of the semiconductor module that abuts the hole for inserting the module. More particularly, a layer of soft metal is applied on the surface of the semiconductor module that abuts the hole for inserting the module to allow heat to be released to the radiator through the layer of the soft metal.

A conventional technology intended to balance the cooling efficiency and the assemblability of a semiconductor element for use in an inverter includes, for example, the inverter disclosed in Japanese Laid-Open Patent Application No. 2005-237141. According to the description of Japanese Laid-Open Patent Application No. 2005-237141, accommodating portions that accommodate power cards of which both sides of the semiconductor elements are sandwiched by the heat dissipation members and recycling paths that recycle a coolant around the power cards are formed, and an insulating resin is filled between the power cards and the accommodating portions and the insulating resin is cured to fix the power cards.

A conventional technique intended to improve cooling capacity with a decreased burden of assembling semiconductor modules is disclosed in, for example, Japanese Laid-Open Patent Application No. 2006-202899. According to the description of Japanese Laid-Open Patent Application No. 2006-202899, a block is provided in which a semiconductor module is housed inside thereof and heat dissipation planes are provided on its front and rear sides to dissipate Joule heat generated in the semiconductor module. The block is inserted into the cooling water channel formed in the case so as to cause the front and rear sides of the block to face the cooling water channel.

SUMMARY OF THE INVENTION

In recent years, in automobiles, for example, motorization has been in progress in various in-vehicle systems for vehicles inclusive of in-vehicle drive systems. In the motorization of the in-vehicle systems, it becomes necessary to add freshly or in place of a component of the conventional system a power conversion device that controls the power supplied to a rotating machine from an electrical machine that drives a body to be driven and an in-vehicle power source in order to control driving of the rotating machine.

The power conversion device, for example, an automobile has a function to convert direct current supplied from the in-vehicle power source to alternating current power for driving a rotating machine or alternating current power generated by the rotating machine to direct current power.

The power conversion device includes an inverter circuit and performs power conversion between direct current power and alternating current power by the operation of the inverter circuit. In order to perform this power conversion, it is necessary to repeat action of switching between a blocked state and a conduction state of a power semiconductor that constitutes the inverter circuit (switching action). When the switching action is performed, a large amount of heat is generated in the power semiconductor. Because of the heat generated by a semiconductor chip, which is the power semiconductor of the inverter circuit, upon the switching action, the temperature of the semiconductor chip is increased. For this reason, it is an important problem to prevent this temperature increase.

According as power to be converted increases, the amount of heat generated in the semiconductor chip increases. To cope with this, it is necessary to increase the size of the semiconductor chip or the number of the semiconductor chips to be used, so that the power conversion device has a larger size. As a measure of preventing such an increase in size of the power conversion device, it is conceivable to improve cooling efficiency of the semiconductor chips. For example, the above-mentioned three patent references present proposals to increase the cooling efficiency of the semiconductor chips.

Semiconductor module to be used for constituting the inverter circuit of the power conversion device preferably has a structure of the type having high cooling efficiency. Moreover, it is necessary that the semiconductor module can maintain high reliability. In particular, the in-vehicle power conversion device to be mounted on an automobile is required to be accommodated in a relatively small space and despite this convert a large amount of power. In spite of the fact that the power conversion device is used in a situation where vibration is always applied thereto, it is used for a long period of time. In addition, a driver is supposed to have to be versed in the technology. Taking these into consideration, the power conversion device must have high reliability as well as high cooling efficiency. Although the inventions disclosed in the above-mentioned three patent references are intended to improve the cooling efficiency, further improvement in reliability is required before they can be commercialized.

It is an object of the present invention to improve cooling efficiency and in reliability of semiconductor module for use in converter circuit to be used in a power conversion device required when it is commercialized.

One of basic features of the present invention for solving the above-mentioned problem is that a semiconductor module incorporates therein a series circuit including an upper arm and a lower arm of an inverter circuit. The semiconductor module includes a heat dissipation member on each side thereof and a conducting member is fixed to one of the heat dissipation members through an insulating member. The series circuit is mounted on the conducting member. With this construction, most of works for forming the inverter circuit can be performed on one of the heat dissipation member side, so that productivity and reliability can be increased.

To increase the productivity and reliability required for commercialization as mentioned above, the semiconductor module according to one embodiment of the present invention as detailed hereinbelow is constructed as follows.

A double-face-cooled semiconductor module having incorporated therein an upper arm and a lower arm of an inverter circuit comprises: a first and a second heat dissipation members each having a heat dissipation surface on one side and a conducting member formed on another side through an insulation member, the first and the second dissipation plates disposed with the heat dissipation surfaces thereof facing each other; a fixing portion provided on the heat dissipation surface of the first heat dissipation member that fixes collector surfaces of semiconductor chips of the upper and lower arms of the semiconductor module, and a gate conductor connected to a gate terminal of the semiconductor module provided on the conductor formed on the first heat dissipation member; the gate electrode terminal of the semiconductor chip and the gate conductor being electrically connected to each other; and the conducting member formed on the second heat dissipation member being connected to an emitter surface of the semiconductor chip fixed to the first heat dissipation member.

Also, a double-face-cooled semiconductor module having incorporated therein an upper arm and a lower arm of an inverter circuit, comprises: a first and a second heat dissipation members each having a heat dissipation surface on one side and a conducting member formed on another side through an insulation member, the first and the second dissipation plates disposed with the heat dissipation surfaces thereof facing each other; a fixing portion provided on the heat dissipation surface of the first heat dissipation member that fixes collector surfaces of semiconductor chips of the upper and lower arms of the semiconductor module, and a gate conductor connected to a gate terminal of the semiconductor module provided on the conductor formed on the first heat dissipation member; the gate electrode terminal of the semiconductor chip and the gate conductor being electrically connected to each other; the conducting member formed on the second heat dissipation member being connected to an emitter surface of the semiconductor chip fixed to the first heat dissipation member; and a bottom case of a concave shape to sandwich and fix the first and the second heat dissipation members therein, a side case of a convex shape to be inserted between the first and the second heat dissipation members to fix the first and the second heat dissipation members, and a top case to sandwich and fix the first and the second heat dissipation members from above.

According to the present invention, improvement in cooling efficiency as well as improvement in reliability can be achieved.

For example, the semiconductor module according to the following embodiment assumes a construction in which a semiconductor chip is sandwiched by heat dissipation metal plates on both sides thereof, so that the semiconductor module has improved cooling efficiency. Further, the semiconductor module is completed on a production line and tests are conducted as necessary in order to confirm their reliability. Those semiconductor modules of which it is confirmed that the reliability can be maintained can then be sent to a production line fixing semiconductor modules to a cooling case. The production line for fixing semiconductor modules is technically different from the production line for completing semiconductor modules. Accordingly, it is desirable that first basic reliability is secured for semiconductor modules and then the semiconductor modules are assembled. The structures of the semiconductor modules described in the following embodiments enable the above-mentioned production method.

Other objects, advantages, and novel features of the present invention will become apparent form the following description with reference to the attached drawings.

DETAILED DESCRIPTION OF THE INVENTION

Figure 1:
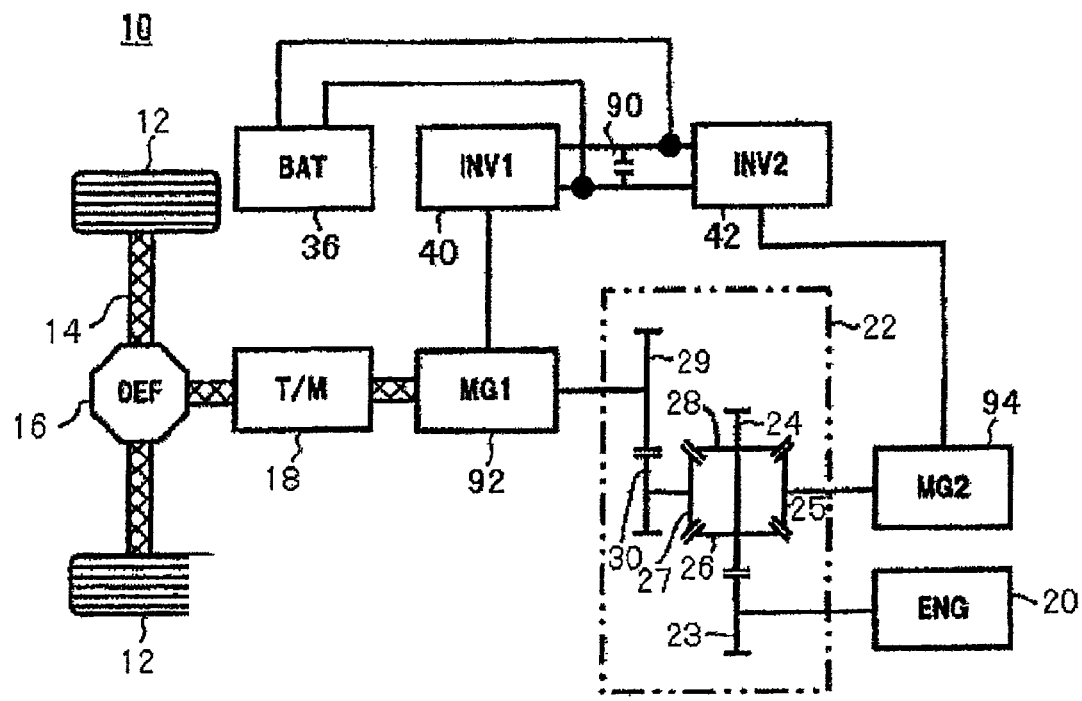
FIG. 1 is a block diagram presenting a control block of a hybrid automobile.

The following is a detailed description of the semiconductor module according to an embodiment of the present invention with reference to the attached drawings. First, technical problems on improvements and innovations on power conversion device according to an embodiment of the present invention and outline of the technology to solve the technical problems are described.

The power conversion device according to one embodiment of the present invention is made taking into consideration the following technical viewpoints so that they meet needs. One of the viewpoints is a technology of downsizing, that is, a technology of preventing the size of power conversion device with an increasing power to be converted as much as possible. Another viewpoint is a technology relating to improvement of reliability of the power conversion device. Still another viewpoint is a technology relating to improvement of productivity of the power conversion device. The power conversion device according to the present embodiment has the above-mentioned viewpoints. Further, the power conversion device according another embodiment of the present invention has a viewpoint that is obtained by combining at least two of these viewpoints or a viewpoint obtained by combining the three viewpoints and is commercialized based on these viewpoints. The features of the power conversion device in the respective viewpoints are outlined hereinbelow.

(1) Explanation on Downsizing Technology

The power conversion device according to the present embodiment has the following structure. That is, a series circuit of the upper and lower arms of the inverter is housed in a semiconductor module with a cooling metal on each side (one designated by reference numeral 500 shown in FIG. 18 detailed later on, which is an embodiment of the present invention). The semiconductor module is immersed in cooling water to cool the cooling metal on each side of the semiconductor module with the cooling water. With this structure, cooling efficiency is improved, so that downsizing of the semiconductor module is possible. As a specific structure, an insulation member such as an insulation sheet or an insulation plate made of a ceramic plate is provided on the inner side of the cooling metal on each side of the semiconductor module, and semiconductor chips of the upper arm and the lower arm that constitute the upper and lower arms series circuit are sandwiched between the conductor metals fixed to the respective insulation members. With this structure, a good heat conduction path is established between the both sides of the semiconductor chips of the upper and the lower arms and the cooling metal, so that the cooling efficiency of the semiconductor module is much improved.

In the semiconductor module, the semiconductor chips of the upper and the lower arms are arranged with a shift in a direction vertical to an axis of flow of the cooling water, so that the cooling water in the cooling water channel can be utilized more efficiently to improve the cooling effect.

The semiconductor chips of the upper and the lower arms of the semiconductor module are arranged with a shift in a direction vertical to the axis of flow of the cooling water. In addition, the channel is divided into two, i.e., a channel in a position corresponding to the semiconductor chip of the upper arm and a channel in a position corresponding to the semiconductor chip of the lower arm, and these channels are connected in series to each other. With this structure, the channels can be made to have a decreased cross-section in accordance with the semiconductor chips to be cooled. As a result, the flow rate of the cooling water in the channel can be increased. An increase in flow rate means an increase in amount per unit time of water that contributes to cooling, leading to a considerable improvement of cooling efficiency. The structure in which the channel is divided into two parts at positions corresponding to the positions of the semiconductor chips neither makes the cooling structure in whole so complex nor makes the cooling case so big in size, so that it is effective to improve the cooling efficiency considerably.

The both sides of each of the semiconductor chips of the upper and the lower arms are connected to respective conductor metals (conducting members) on the inner side of the cooling metal. The respective conductor metals are fixed to the cooling through the insulation members. The thickness of insulation members is as small as, for example, 350 µm or less in the case of a ceramic plate or from 50 µm to 200 µm in the case of an insulation sheet. The insulation sheet may be, for example, a sheet of thermocompressed resin sheet. Since the conductor metal is provided close to the cooling metal, eddy current is generated due to current that flows in the conductor metal flows in the cooling metal to generate heat. The heat can be efficiently conducted to the cooling water.

The eddy current decreases inductance in the semiconductor module. The decrease in inductance decreases jumping up of voltage due to switching action of the semiconductor chips of the upper and the lower arms, which leads to improvement of the reliability of the semiconductor module. That it is possible to suppress the increase in voltage allows the switching action of the semiconductor chips of the upper and the lower arms to be performed at high rates, so that the time for the switching action can be reduced, resulting in a decrease in the amount of heat generated by the switching action.

In the power conversion device according to the present embodiment, the upper and the lower arms series circuit of the inverter is housed in the inside of the semiconductor module. This makes the structure in which the direct current terminal is connected to the capacitor module and the structure of the connection terminal of the capacitor module very simple. This greatly contributes to downsizing of the inverter device in whole and leads to improvement of reliability and improvement of productivity of the inverter device.

The structure of the direct current terminal of the semiconductor module and the structure of the terminal of the capacitor module as well as the structure that connects these can be configured such that terminals on the positive electrode side and the negative electrode side as well as conductors connected to the terminals are arranged close to each other and facing each other. This can decrease inductance between the semiconductor module and the capacitor. Accordingly, the jumping up of voltage due to the switching action of the semiconductor chips of the upper and the lower arms can be decreased to improve the reliability the power conversion device. That it is possible to suppress the increase in voltage allows the switching action of the semiconductor chips to be performed at high rates, resulting in a decrease in the amount of heat generated by the switching action due to a reduction in time of the switching action. The amount of generated heat can be decreased, or the connection structure can be prevented from becoming complex. This makes it possible to downsize the power conversion device.

In the power conversion device according to the present embodiment, the cooling efficiency is considerably improved, so that engine cooling water that cools the engine can be used as the cooling water. When cooling is performed with cooling water different from the engine cooling water, the automobile requires a new cooling system and even though the power conversion device can be downsized, the system becomes of the automobile in whole becomes complex. In the present embodiment, even if the power conversion device becomes larger, the vehicle in whole can be downsized and exhibit many advantages because the engine cooling water can be utilized.

Since the power conversion device according to the present embodiment is configured such that the semiconductor module and capacitor module are fixed to the cooling case, the cooling efficiency of the power conversion device is considerably improved, so that the surface of the cooling case equipped with the semiconductor module can be utilized as a surface to which the capacitor module is fixed. This makes it possible to downsize the power conversion device. In addition, since the cooling efficiency of the capacitor module is improved and the capacitor module can be firmly held by the cooling case, the power conversion device is resistant to vibrations. Thus, the present embodiment is effective in downsizing and increasing the reliability of the power conversion device.

(2) Explanation on Improvement of Reliability

In the power conversion device according to the present embodiment, the semiconductor chip is configured such that it is sandwiched by heat dissipation metal plates on both the collector and emitter surface thereof, so that the cooling efficiency of the semiconductor module can be improved to a greater extent. As a result, an increase in temperature of the semiconductor chip can be suppressed, which leads to improvement of the reliability of the semiconductor module.

The semiconductor chip is configured such that in addition to the structure in which it is sandwiched by two heat dissipation metal plates on both sides thereof, the semiconductor chip is sealed between the two heat dissipation metal plates. The configuration of the semiconductor module is useful to obtain necessary reliability such as protection from a coolant such as water. In a production line for semiconductor modules, it is possible to perform confirmation tests for completed products as necessary. The production technology in the production line for cooling cases and assembling line in which the semiconductor modules are attached to the cooling cases differs greatly from the technology in the production line for semiconductor modules, so that it leads to improvement of the reliability of the power conversion device to provide separate production lines one from another. Also, damages upon transportation of completed products from the production line for the semiconductor modules to a next production line can be prevented from occurring, so that the reliability of the semiconductor modules can be maintained. For example, in the case of the structure in which sealing and the like of the semiconductor chip in a semiconductor module are completed by fixing semi-completed products of semiconductor module to the cooling medium, the semiconductor modules are completed in the production line for cooling cases. In this case, many problems arise in preventing damages of semiconductor chips and it becomes difficult to produce semiconductor modules having high reliability.

In the following embodiment, the semiconductor module can be configured to have low inductance, or inductance between the semiconductor module and the capacitor module can be decreased. Accordingly, the jumping up of voltage due to switching action can be decreased, which leads to improvement of reliability of the semiconductor modules. That it is possible to suppress the increase in voltage allows the switching action of the semiconductor chips of the upper and the lower arms to be performed at high rates, so that the time for the switching action can be reduced. This results in a decrease in the amount of heat generated by the switching action. This in turn leads to suppression of an increase in temperature, leading to improvement of the reliability of the semiconductor module.

The structure with which the direct current terminal of the semiconductor module is connected to the capacitor module and the terminal structure of the capacitor module become simpler. This leads not only to improvement of productivity and downsizing but also to improvement of the reliability of the semiconductor module.

In the power conversion device of the present embodiment, the cooling efficiency is improved to a greater extent so that the engine cooling water can be used as the cooling water. Therefore, the automobile does not need any dedicated cooling water system and the system of the automobile in whole can be made simpler, thus presenting improvement with high reliability.

The power conversion device of the present embodiment is configured such that the semiconductor module that houses the series circuit of the upper and lower arms of the inverter is inserted in the cooling water channel through an opening provided in the cooling water channel and fixed to the cooling water channel. There can be performed a process in which the semiconductor module and the channel case separately produced in different production lines are separately checked and then the semiconductor module is fixed to the channel case. In this manner, the semiconductor module, which is an electric component, and the channel case, which is a mechanical component, can be separately produced and checked, so that not only improvement of productivity but also improvement of reliability can be obtained.

It is possible to adopt a method in which a conductor or a semiconductor chip as necessary is fixed to a first and a second heat dissipation metals and then the first and the second heat dissipation metals are integrated to produce a semiconductor module. It is possible to perform the process of integrating the heat dissipation metals after the state of production of the first and the second heat dissipation metals is confirmed. This leads not only to improvement of productivity but also to improvement of reliability of the semiconductor module.

In the embodiment detailed hereinbelow, a collector electrode of an IGBT chip, which is a semiconductor element, and a cathode of a diode are fixed to a conductor that is fixed to one of the first and the second heat dissipation metal plates through an insulation material, and also a signal conductor of the IGBT chip is fixed to the same heat dissipation metal plate. Therefore, connection by wire bonding, which is connection for signals of the IGBT chip, can be completed in the production process of one of the heat dissipation metal plates, so that the reliability of the semiconductor module is improved.

The semiconductor module is configured such that the direct current terminal, alternate current terminal, signal terminal (emitter terminal for signals), and gate terminal are fixed to either one of the first or the second heat dissipation metals in the semiconductor module. Accordingly, the semiconductor module is resistant to vibrations and the reliability thereof is improved.

The power conversion device according to the present embodiment is configured such that when the collector surface of the semiconductor chip of the upper arm is fixed to the first heat dissipation metal, the collector surface of the semiconductor chip of the lower arm is fixed to the same first heat dissipation metal, so that the collector surface and the emitter surface of the semiconductor chips of the upper and the lower arms are in the same direction. With this configuration, the productivity and reliability of the semiconductor module is improved.

The power conversion device according to the present embodiment is configured such that the semiconductor chip of the upper and the lower arms as well as the signal terminals of and the gate terminals of the upper and the lower arms are fixed to the same heat dissipation metal. For this reason, the process of wire bonding to connect the semiconductor chip with the signal terminal and the gate terminal can be concentrated on one of the heat dissipation metal, which makes it easier to perform the tests. This improves not only productivity but also reliability of the power conversion device.

(3) Explanation on Improvement of Productivity

As mentioned above, the power conversion device according to the present embodiment may be configured such that the semiconductor module and the cooling case are separately produced and then a process of fixing the semiconductor modules to the cooling case is performed, so that the semiconductor modules can be produced on the production line for an electrical system. This improves the productivity and reliability of the power conversion device. Also, the capacitor module can be separately produced in another production process in the same manner as above and then fixed to the channel case, so that the productivity thereof is improved.

The semiconductor module and the capacitor module can be fixed to the channel case and then the terminals of the semiconductor module and the capacitor module can be connected to each other. Moreover, a space in which a welding unit of a welding machine for the connection can be secured. This leads to improvement of the productivity. In this connection process, the terminals of the semiconductor module are fixed to the heat dissipation metals, and the heat upon welding the terminals diffuses to the heat dissipation metals, so that adverse influences to semiconductor chips can be avoided, resulting in improvement in the productivity and reliability of the power conversion device.

The semiconductor chip of the upper and the lower arms as well as the signal terminals of and the gate terminals of the upper and the lower arms can be fixed to one of the heat dissipation metals, so that wire bonding for both the upper and the lower arms can be performed on the production line of one of the heat dissipation metals. This improves the productivity of the heat conversion device.

The power conversion device according to the present embodiment enables mass production of semiconductor modules of the same structure and enables one to adopt a method in which a necessary number of semiconductor modules are used based on the specification required for the power conversion device. This makes it possible to perform mass production of standardized semiconductor modules to improve the productivity, reduce the cost, and improve the reliability of the semiconductor module. With the above, explanation on the structural features and effects of the power conversion device according to the embodiment of the present invention from the three technical viewpoints is concluded.

Figure 2:
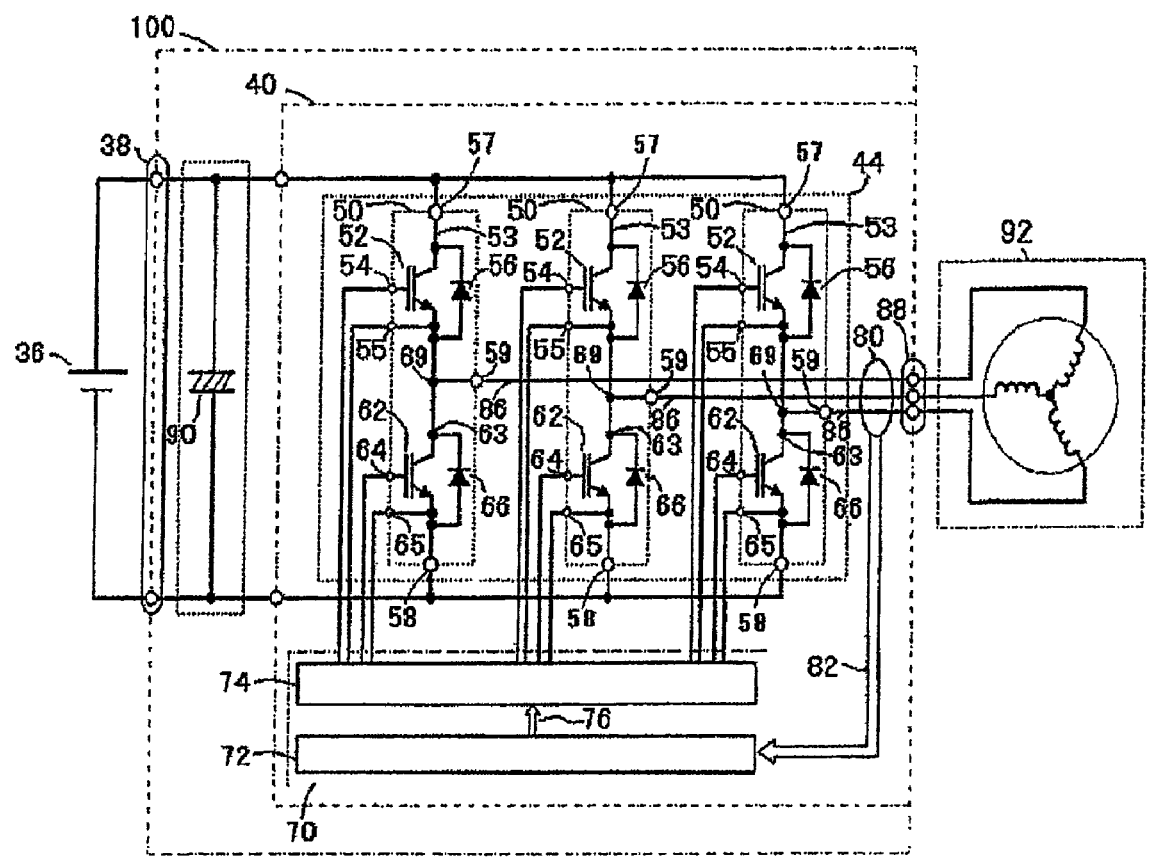
FIG. 2 is a diagram illustrating circuitry of an electric system for driving a vehicle that includes an inverter device having an upper and lower arms series circuit, a power conversion device comprised by capacitors connected to the upstream side of the inverter device, a battery, and a motor generator.

Now, referring to the attached drawings, the power conversion device according to an embodiment of the present invention is described in detail. The power conversion device of the embodiment present invention is applicable to hybrid automobiles and genuine electric cars. A typical example of control mechanism and circuitry of the power conversion device when the power conversion device according to the present embodiment is applied to the hybrid automobile is described with reference to FIGS. 1 and 2. FIG. 1 is a diagram presenting a control block of a hybrid automobile. FIG. 2 is a diagram illustrating circuitry of an electric system for driving a vehicle that includes an inverter device having an upper and lower arms series circuit, a power conversion device comprised by capacitors connected to the upstream side of the inverter device, a battery, and a motor generator.

The power conversion device according to the present embodiment is described taking as an example an in-vehicle power conversion device for an in-vehicle electric system to be mounted on an automobile, in particular an inverter device for driving a vehicle for use in an electric system for driving a vehicle and placed under severe mounting and operating environments. The inverter device for driving a vehicle is equipped in an electric system for driving a vehicle as a control device that controls driving of the motor for driving a vehicle. The inverter device converts direct current supplied from an in-vehicle battery that constitutes an in-vehicle power source or an in-vehicle power generation device to predetermined alternate current power and supplies the obtained alternate current power to the motor for driving the vehicle to control the driving of the motor for driving the vehicle. The motor for driving the vehicle also has the function to serve as a power generation device, so that the inverter device for driving the vehicle has a function to convert the alternate power generated by the motor for driving the vehicle to direct current power. The converted direct current is supplied to the in-vehicle battery.

While the configuration of the power conversion device according to the present embodiment is applicable to the inverter device for use as a control device that controls inverter devices other than those for driving vehicles, for example, an electrically-operated braking device or an electrically-operated power steering device, the power conversion device exhibits most desirable effect when applied to the inverter device for driving the vehicle. The concept of the power conversion device is applicable to other in-vehicle power conversion devices, for example, a direct current-direct current power conversion device or an alternate current-direct current power conversion device, such as a DC/DC converter or a direct current chopper. However, when applied to the power conversion device for driving vehicles, the power conversion device according to the present embodiment exhibit the most desirable effects.

Explanation is made on the power conversion device according to the present embodiment taking as an example in which the electric system for driving a vehicle equipped with the inverter device for driving the vehicle to which the present embodiment is applied is mounted on a hybrid automobile. The hybrid automobile is configured to use an engine, which is an internal combustion engine, and a motor for driving a vehicle as driving power sources and either one of front and rear wheels is driven. Hybrid automobiles include those in which the engine drives one of the front and rear wheels and the motor for driving the vehicle drives the other of the front and rear wheels. The present embodiment is applicable to any of the types of the hybrid automobile. As mentioned above, the present embodiment is applicable to genuine electric automobiles such as a fuel battery car. In the genuine electric vehicles, the power conversion device detailed hereinbelow operates substantially in the same manner and substantially the same effects can be obtained.

Referring to FIG. 1, a hybrid electric vehicle (hereinafter, referred to as "HEV") 10 is an electric vehicle that includes two systems for driving the vehicle. One is an engine system that uses an engine 20, an internal combustion engine, as a power source. The engine system is used mainly as a driving power source for HEV. The other is an in-vehicle electric system that uses motor generators 92 and 94 as a driving power source. The in-vehicle electric system is used mainly as a driving power source for HEV and an electric power generation source for HEV. The motor generators 92 and 94, for example, permanent magnet synchronous motors, can operate either as motors or generators depending on the operation method. Accordingly, the device is referred to as "motor generator".

In the front part of the body is rotatably journaled a front wheel shaft 14. On both ends of the front wheel shaft 14 are provided a pair of front wheels 12. On the rear part of the body is rotatably journaled a rear wheel shaft (not shown). On the both ends of the rear wheel shaft are provided a pair of rear wheels. In the HEV according to the present embodiment, a so-called front wheel driving method is used. In the front wheel driving method, a main wheel that is power-driven is the front wheel 12 and the trailing wheel is the rear wheel. A reversed driving method, that is, a so-called rear wheel driving method may also be adopted.

In the center of the front wheel shaft 14 is provided a differential gear (hereinafter, referred to as "front wheel DEF") 16. The front wheel shaft 14 is mechanically connected with an output side of the front wheel DEF 16. An input side of the front wheel DEF 16 is mechanically connected with an output shaft of a transmission 18. The front wheel DEF 16 is a differential motive energy distribution mechanism 22 that distributes torque transmitted with shift by the transmission 18 to both front wheel shafts 14. An input side of the transmission 18 is mechanically connected with an output side of the motor generator 92. An input side of the motor generator 92 is mechanically connected with an output side of the engine 20 and an output side of the motor generator 94 through the motive energy distribution mechanism 22. The motor generators 92 and 94 and the motive energy distribution mechanism 22 are housed in the casing of the transmission 18.

The motive energy distribution mechanism 22 is a differential mechanism that includes gears 23 to 30. The gears 25 to 28 are bevel gears. The gears 23, 24, 29, and 30 are spur gears. The motive energy of the motor generator is directly transmitted to the transmission 18. The shaft of the motor generator is coaxial with the shaft of the gear 29. With this configuration, when no drive power is supplied to the motor generator 92, the power transmitted to the gear 29 is directly transmitted to the input side of the transmission without any change.

When the engine 20 is fired up to drive the gear 23, the motive energy of the engine 20 is transmitted from the gear 23 to the gear 24, from the gear 24 to the gears 26 and 28, and then from the gears 26 and 28 to the gear 30, and finally to the gear 29. When the motor generator 94 is fired up to drive the gear 25, the rotation of the motor generator 94 is transmitted from the gear 25 to the gears 26 and 28 and then from the gears 26 and 28 to the gear 30, and finally to the gear 29. The motive energy distribution mechanism 22 may be other mechanisms including a planetary gear mechanism in place of the above-mentioned differential mechanism.

The motor generators 92 and 94 are synchronous machines each including a rotor of a permanent magnet. The driving of the motor generators 92 and 94 is controlled by controlling alternate current supplied to an armature coil of the stator by inverter devices 40 and 42. The inverter devices 40 and 42 are electrically connected with a battery 36. Power can be supplied and received between the battery 36 and the inverter devices 40 and 42.

In the present embodiment, there are provided a first motor generator unit constituted by the motor generator 92 and the inverter device 40 and a second motor generator unit constituted by the motor generator 94 and the inverter device 42, which are selectively used depending on the situation. That is, assuming that the vehicle is driven through motive energy from the engine 20, if the drive torque of the vehicle is to be assisted, the second motor generator unit is actuated as a generator unit by the motive energy from the engine 20 to generate electric power, and the first motor generator is actuated as a motor unit by the generated electric power. Similarly, if the speed of the vehicle is to be assisted, the first motor generator unit is actuated as a generator unit by the motive energy of the engine 20 to generate electric power, and the second motor generator unit is actuated as a motor unit by the generated electric power.

In the present embodiment, the vehicle can be driven only by the motive energy of the motor generator 92 by actuating the first motor generator unit as a motor unit by the electric power from the battery 36. In the present embodiment, the battery 36 can be charged by actuating the first or the second generator unit as a generator unit by the motive energy from the engine or the motive energy from the wheels to perform power generation.

Now, referring to FIG. 2, the electric circuit configurations of the inverter devices 40 and 42 are described. In the embodiments shown in FIG. 1 and FIG. 2, explanation is made, for example, on a case where the inverter devices 40 and 42 are separately constructed. However, as described later on referring to FIG. 7 and so on, the inverter devices 40 and 42 may be housed in one device. The inverter devices 40 and 42 have the same construction to exhibit the same action and have the same function, and hence explanation is made on the inverter device 40.

The power conversion device 100 includes the inverter device 40 and a capacitor 90. The inverter device 40 includes an inverter circuit 44 and a control unit 70. The inverter circuit 44 includes a plurality of upper and lower arms series circuits 50 (in the example shown in FIG. 2, three upper and lower arms series circuits 50, 50, 50). Each of the upper and lower arms series circuit includes an IGBT (Insulated Gate type Bipolar Transistor) 52 acting as an upper arm, a diode 56, an IGBT 62 acting as a lower arm, and a diode 66. Each upper and lower arms series circuits 50 is configured such that an alternate current power line 86 extends from a middle point (intermediate electrode 69) of the upper and lower arms series circuits 50 to the motor generator 92 through an alternate current terminal 59. The control unit 70 includes a driver circuit 74 that drives and controls the inverter circuit 44 and a control circuit 72 (incorporated in the control substrate) that supplies control signals to the driver circuit 74 through a signal line 76.

The IGBTs 52 and 62 of the upper arm and the lower arm, respectively, are power semiconductor elements that are usable for switching. The IGBTs 52 and 62 operate when they receive drive signals output from the control unit 70 and convert direct current power supplied from the battery 36 into three phase alternate current power. The converted power is supplied to the armature coil of the motor generator 92. Also, as mentioned above, the three phase alternate current power generated by the motor generator 92 can be converted into direct current power.

The power conversion device 100 according to the present embodiment is constituted by a three-phase bridge circuit that and the upper and lower arms series circuits 50, 50, and 50 for three phases, respectively, are electrically connected in parallel between the positive side and the negative side of the battery 36. The upper and lower arms series circuit 50, which is called "arm" herein, includes the power semiconductor element 52 for switching on the upper arm side and the diode 56 as well as the power semiconductor element 62 for switching on the lower arm side and the diode 66.

In the present embodiment, use of IGBTs (Insulated Gate type Bipolar Transistors) 52 and 62 as the power semiconductor element for switching is exemplified. The IGBTs 52 and 62 include collector electrodes 53 and 63, emitter electrodes, gate electrodes (gate electrode terminals 54 and 64), and signal emitter electrodes (signal emitter electrode terminals 55 and 65). The diodes 56 and 66 are electrically connected to between the collector electrodes 53 and 63 and the emitter electrodes of the IGBT 52 and 62, respectively, as shown in the figures. The diodes 56 and 66 include each two electrodes, i.e., cathode and anode. The cathodes of the diodes are connected to the collector electrodes of the IGBTs 52 and 62 and the anodes of the diodes are electrically connected to the emitter electrodes of the IGBTs 52 and 62, respectively, so that a direction of current from the emitter electrodes to the collector electrodes of the IGBTs 52 and 62 is forward.

The power semiconductor for switching may be a MOSFET (Metal Oxide Semiconductor Field Effect Transistor). The MOSFET includes three electrodes, i.e., a drain electrode, a source electrode, and a gate electrode. The MOSFET includes a parasitic diode between the source electrode and the drain electrode such that a direction of current from the drain electrode to the source electrode is forward. For this reason, it is unnecessary to provide a diode separate unlike the IGBT.

There are provided three upper and lower arms series circuit 50. The three circuits 50 correspond to respective phases of armature coils of the motor generator 92. The three upper and lower arms series circuit 50, 50, and 50 form U, V, and W phases to the motor generator 92 through the intermediate electrodes 69, each of which connects the emitter electrode of the IGBT 52 and the collector electrode 63 of the IGBT 62, and the alternate current terminals 59, respectively. The upper and lower arms series circuits are electrically connected to each other in parallel. The collector electrode 53 of the upper arm IGBT 52 is electrically connected to the capacitor electrode on the positive electrode side of the capacitor 90 through the positive electrode (P terminal) 57. The emitter electrode of the lower arm IGBT 62 is electrically connected to the capacitor electrode on the negative electrode side through the negative electrode (N terminal) 58. The intermediate 69, which corresponds to a midpoint part of each arm (a connecting part between the emitter electrode of the upper arm IGBT 52 and the collector electrode of the lower arm IGBT 62), is electrically connected to a corresponding phase coil among the armature coils of the motor generator 92 through an alternate current connector 88. In the present embodiment, the single upper and lower arms series circuit 50 constituted by the upper and the lower arms serves as a main circuit component of the semiconductor module.

The capacitor 90 is to constitute a smoothing circuit that suppresses variation of direct current voltage generated by the switching action of the IGBTs 52 and 62. The positive side of the battery 36 is electrically connected to the capacitor electrode of the capacitor 90 on the positive electrode side through a direct current connector 38. The negative side of the battery 36 is electrically connected to the capacitor electrode of the capacitor 90 on the negative electrode side through the direct current connector 38. With this construction, the capacitor 90 is connected to between the collector electrode 53 of the upper arm IGBT 52 and the positive electrode of the battery 36 and to between the emitter electrode of the lower arm IGBT 62 and the negative electrode side of the battery 36, so that the capacitor 90 is electrically connected to the battery 36 and the upper and lower arms series circuit 50 in parallel.

The control unit 70 is provided in order to actuate the IGBTs 52 and 62. The control unit 70 includes a control circuit 72 (incorporated in the control substrate) that generates timing signals for controlling switching timings of IGBTs 52 and 62 based on input information input from other control units, a sensor, and so on and a river circuit 74 that generates drive signals for causing the IGBTs 52 and 62 to perform switching action based on the timing signals output from the control circuit 72.

The control circuit 72 includes a microcomputer that calculates switching timing of the IGBTs 52 and 62. To the microcomputer are input a target torque value required for the motor generator 92, a current value of the current to be supplied to the armature coils of the motor generator 92 from the upper and lower arms series circuit 50, and a position of a magnetic pole of the rotor of the motor generator 92. The target torque value is based on a command signal output from a superordinate control unit not shown in the figures. The current value is one detected based on the detection signal output from a current sensor 80. The position of magnetic pole is one detected based on the detection signal output from a rotating magnetic pole sensor (not shown) provided in the motor generator 92. In the present embodiment, explanation is made on an example in which current values for three phases are detected. However, it would also be acceptable that current values for two phases are detected.

The microcomputer in the control circuit 72 calculates current command values along d and q axes of the motor generator 92 based on the target torque value, calculates a voltage command values along the d and q axes of the motor generator 92 based on differences between the calculated current command values and the detected current values along the d and 9 axes, and convert the calculated voltage command values into the voltage command values for U, V, and W phases based on the detected positions of magnetic pole. The microcomputer generates a pulsed modulation wave based on comparison between a fundamental harmonic (sine wave) based on the voltage command values for U, V, and W phases and a carrier wave (triangle wave), and outputs the generated modulation wave to the driver circuit 74 as PWM (Pulse Width Modulated) signals. The microcomputer outputs to the driver circuit 74 six PWM signals corresponding to the upper and the lower arms for respective phases. The timing signals output from the microcomputer may be other signals such as square waves.

The driver circuit 74 is constituted by an integrated circuit, so-called driver IC, which is obtained by integrating a plurality of electronic circuit components into one. In the present embodiment, explanation is made taking an example in which each of the upper and lower arms for each phase is provided one IC (one arm in one module: "one in one"). It would also be acceptable to construct the driver circuit 74 such that one IC is provided so as to correspond to each arm of the upper and lower arms for each phase (two in one) or such that one IC is provided so as to correspond to all the arms (six in one). The driver circuit 74 amplifies PWM signals when the lower arm is driven and outputs the amplified PWM signals as drive signals to the gate electrode of the IGBT 62 of the corresponding lower arm. When the upper arm is driven, the driver circuit 74 amplifies PWM signals after shifting the level of a reference potential of the PWM signals to the level of a reference potential of the upper arm, and outputs the amplified signals as drive signals to the gate electrode of the IGBT 52 of the corresponding upper arm. With this, each of the IGBTs 52 and 62 performs a switching action based on the input drive signals.

The control unit 70 performs detection of abnormalities (overcurrent, overvoltage, overtemperature, and so on) to protect the upper and lower arm series circuit 50. For this purpose, sensing information is input to the control unit 70. For example, information on the current that flows through the emitter electrode of each of the IGBTs 52 and 62 is input from the emitter electrode terminals 55 and 65 for signals in each arm to the corresponding driving unit (IC). With this, each driving unit (IC) performs overcurrent detection and when overcurrent is detected, the driving unit (IC) stops the switching action of the corresponding one of the IGBTs 52 and 62 in order to protect the corresponding one of the IGBTs 52 and 62 from the overcurrent. Information on the temperature of the upper and lower arms series circuit 50 is input from the temperature sensor (not shown) provided in the upper and lower arms series circuit 50 into microcomputer. In addition, information on the voltage of the direct current positive electrode side of the upper and lower arms series circuit 50 is input to the microcomputer. The microcomputer performs overtemperature detection and overvoltage detection based on these pieces of information and when overtemperature or overvoltage is detected, and causes the switching actions of all of the IGBTs 52 and 62 in order to protect the upper and lower arms series circuit 50 (consequently, the semiconductor module including the circuit 50) from the overtemperature or the overvoltage.

In FIG. 2, the upper and lower arms series circuit 50 is a series circuit constituted by the IGBT 52 of the upper arm, the diode 56 of the upper arm, the IGBT 62 of the lower arm, and the diode 66 of the lower arm. The IGBTs 52 and 62 are semiconductor elements for switching. Conduction and blocking actions of the IGBTs 52 and 62 of the upper and the lower arms in the inverter circuit 44 are switched in a predetermined order and the current of the stator coil of the motor generator 92 upon the switching flows in a circuit formed by the diodes 56 and 66.

The upper and lower arms series circuit 50, as shown, includes the positive terminal (P terminal) 57, the negative terminal (N terminal) 58, the alternate current terminal 59 from the intermediate electrode 69 of the upper and the lower arms, signal terminal (signal emitter electrode terminal) 55 of the upper arm, the gate electrode terminal 54 of the upper arm, signal terminal (signal emitter electrode terminal) 65 of the lower arm, and the gate electrode terminal 64 of the lower arm. The power conversion device 100 includes the direct current connector 38 on the input side and the alternate current connector 88 on the output side and is electrically connected to the battery 36 and the motor generator 92 through the connectors 38 and 88, respectively.

Figure 3:
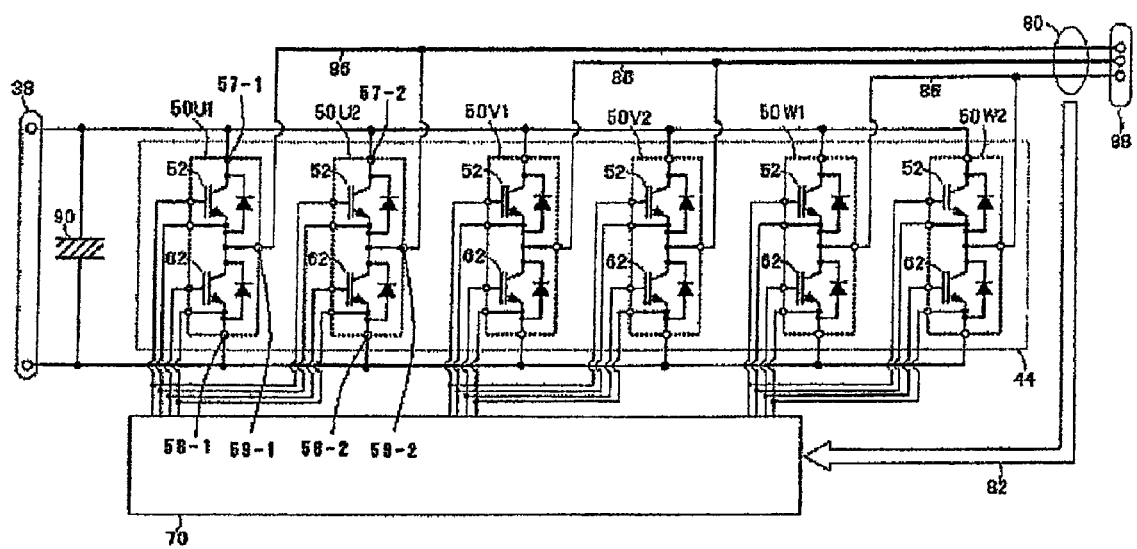
FIG. 3 is a diagram showing circuitry of a power conversion device in which two upper and lower arms series circuit are used to output alternating current to the motor generator.

FIG. 3 is a diagram that shows circuitry of a power conversion device in which the upper and lower arms series circuit is used in double as circuits that generate output of each phase of the three-phase alternate current to be output to the motor generator. When the capacity of the motor generator is increased, electric energy converted by the power conversion device increases, and the current value of the current that flows in the upper and lower arms series circuit for each phase of the inverter circuit 44 increases. The increase in power to be converted can be coped with by increasing the electrical capacity of the upper and the lower arms. However, it is preferred that the quantity of output of inverter modules is increased. The configuration shown in FIG. 3 is intended to cope with the increase in the electric energy to be converted by increasing the number of inverter modules used that are produced in a standardized fashion. FIG. 3 illustrates an example of circuitry in which each upper and lower arms series circuit of the inverter circuit 44 is used in double and connected in parallel to each other, so that the capacity of the inverter circuit 44 can be increased in accordance with the capacity of the motor generator.

In a specific configuration of the power conversion device, for the U phase, upper and lower arms series circuits 50U1 and 50U2 are connected in parallel and alternate current terminals 59-1 and 59-2 are connected thereto to obtain a U phase alternate current line. For the U phase of the motor generator, there are provided P terminals 57-1 (P1 terminal) and 57-2 (P2 terminal) and N terminals 58-1 (N1 terminal) and 58-2 (N2 terminal) as well as alternate current terminals 59-1 and 59-2. Similarly, P terminals, N terminals and alternate current terminals for V and W phases are connected in parallel.

With this circuitry, it is desirable that the voltage between each P terminal and each N terminal of the upper and lower arms series circuits connected in parallel for each phase, for example, the upper and lower arms series circuits 50U1 and 50U2, is equal and that current is always uniformly distributed to each of the upper and lower arms series circuit 50U1 and 50U2. For this purpose, it is desirable that distributed inductance and other electric conditions of the upper and lower arms series circuits 50U1 and 50U2 connected in parallel to each other are made identical as far as possible.

In the power conversion device according to the present embodiment detailed hereinbelow, a semiconductor module 50U1 having incorporated therein the upper and lower arms series circuit 50U1 and a semiconductor module 50U2 having incorporated therein the upper and lower arms series circuit 50U2 that constitute each phase, for example, U phase, are arranged adjacent to each other. The distances of each P terminal and each N terminal of these circuits from the terminal of the capacitor module are set the same. In addition, electric conditions such as connecting methods are made uniform (see FIG. 13). Accordingly, the current that flows through the semiconductor module 50U1 and the semiconductor module 50U2 are substantially equal. The semiconductor modules 50U1 and 50U2 have substantially equal terminal voltages. The upper and lower arms series circuits connected in parallel that constitute each phase of the inverter circuit 44 perform switching actions in similar timings, so that the signal that is sent from the control unit 70 to the upper and lower arms series circuits constituting each of the U, V, and W phases is the same phase by phase.

When two motor generators are present in the vehicle as shown in FIG. 1, the vehicle includes a pair of power conversion devices shown in FIG. 2 or FIG. 3. Whether the circuit shown in FIG. 2 or the circuit shown in FIG. 3 is used depends on the specification of the motor generator as mentioned above. When the single circuit system as shown in FIG. 2 is insufficient to the electric power required by the motor generator, the number of standardized semiconductor modules as shown in FIG. 3 to be used will be increased to cope with the insufficiency. Although it would be acceptable to provide the power conversion device as shown in FIG. 2 or FIG. 3 to each of the two motor generators, provision of two inverter circuits in one power conversion device and provision of two semiconductor modules each constituting an inverter device in one channel case results in a much more compact structure than providing two power conversion deices. Also, from the viewpoints of productivity and reliability, the former structure is superior to providing two power conversion devices. Such a power conversion device as including two inverter devices is explained later on with reference to FIG. 7.

Figure 18:
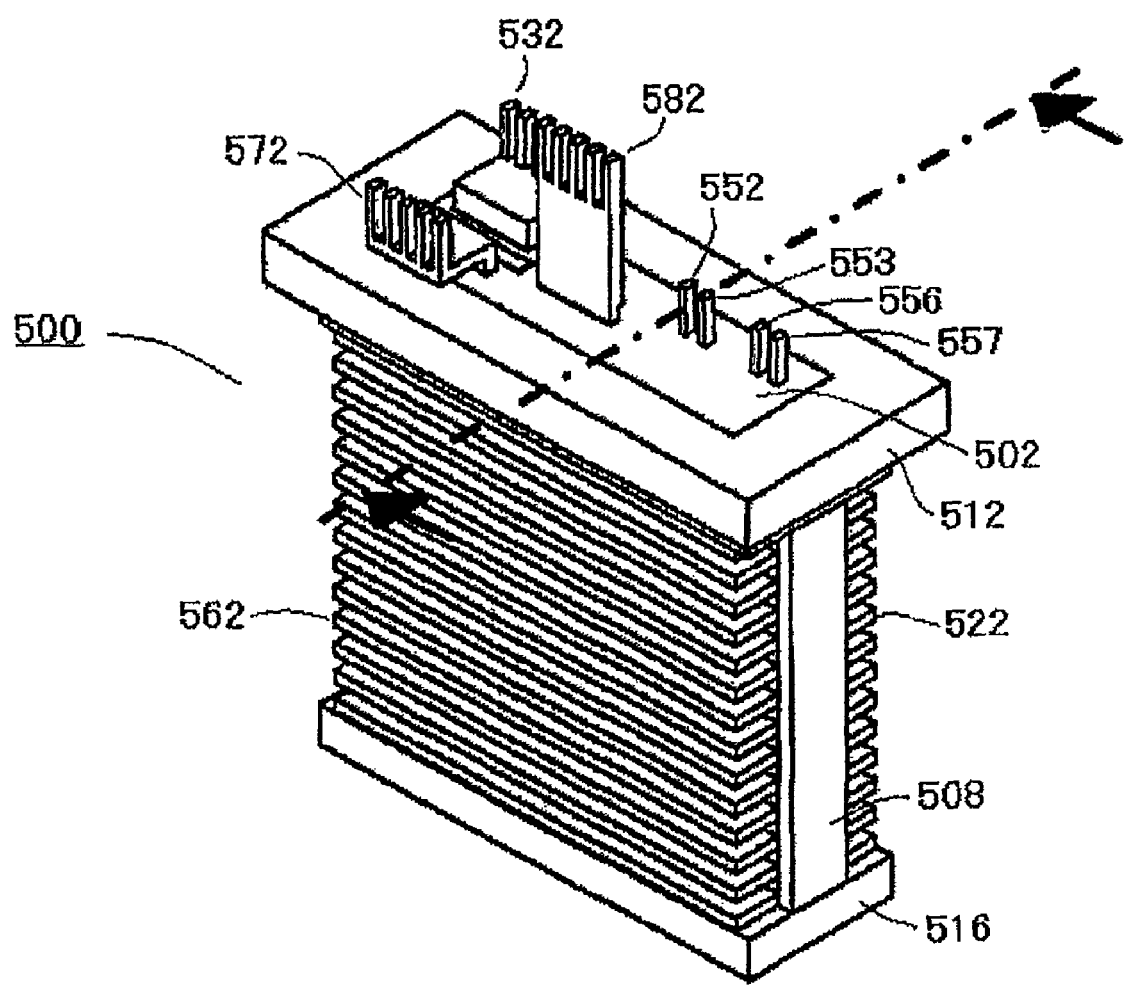
FIG. 18 is a diagram showing an appearance of the semiconductor module with heat dissipation fins having incorporated therein the upper and lower arms series circuit in the power conversion device according to an embodiment of the present invention.
Figure 19:
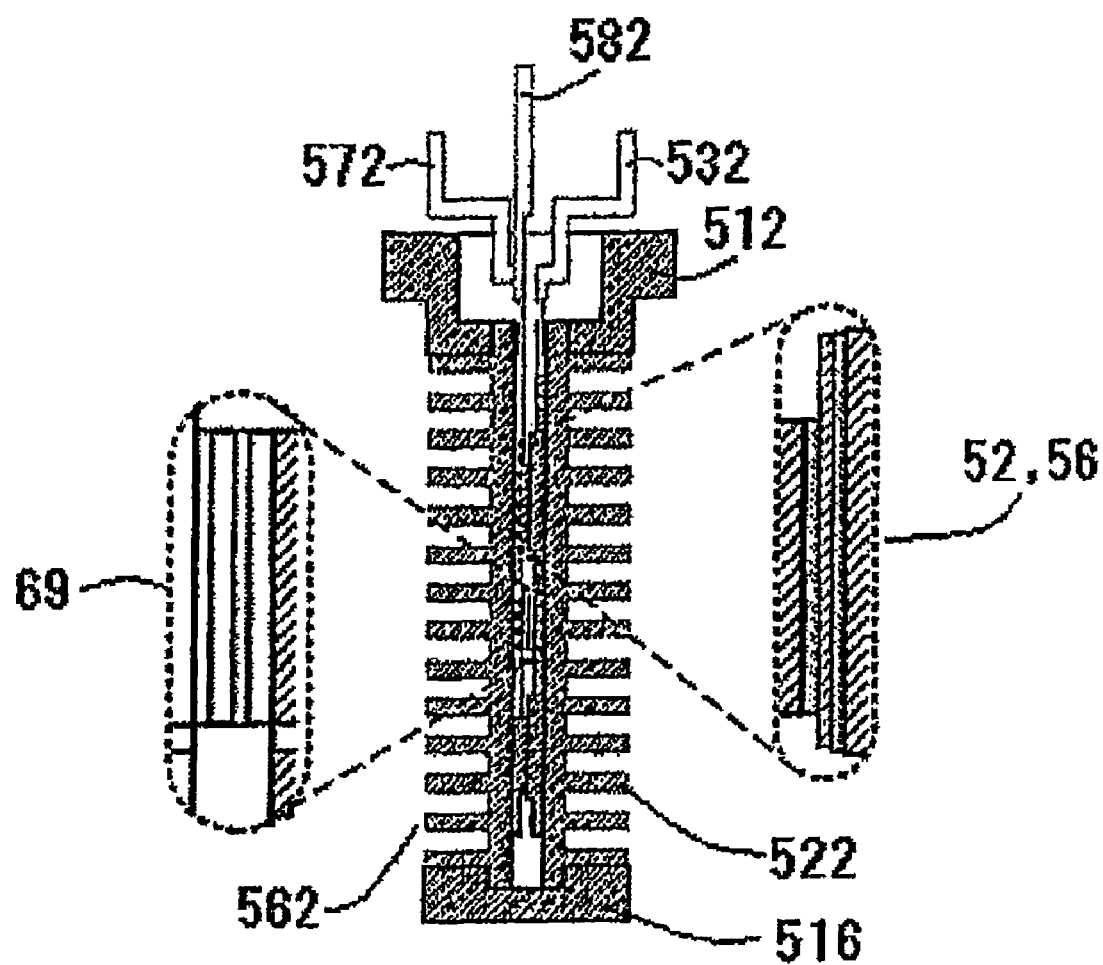
FIG. 19 is a cross-sectional view of the semiconductor module shown in FIG. 18.
Figure 20:
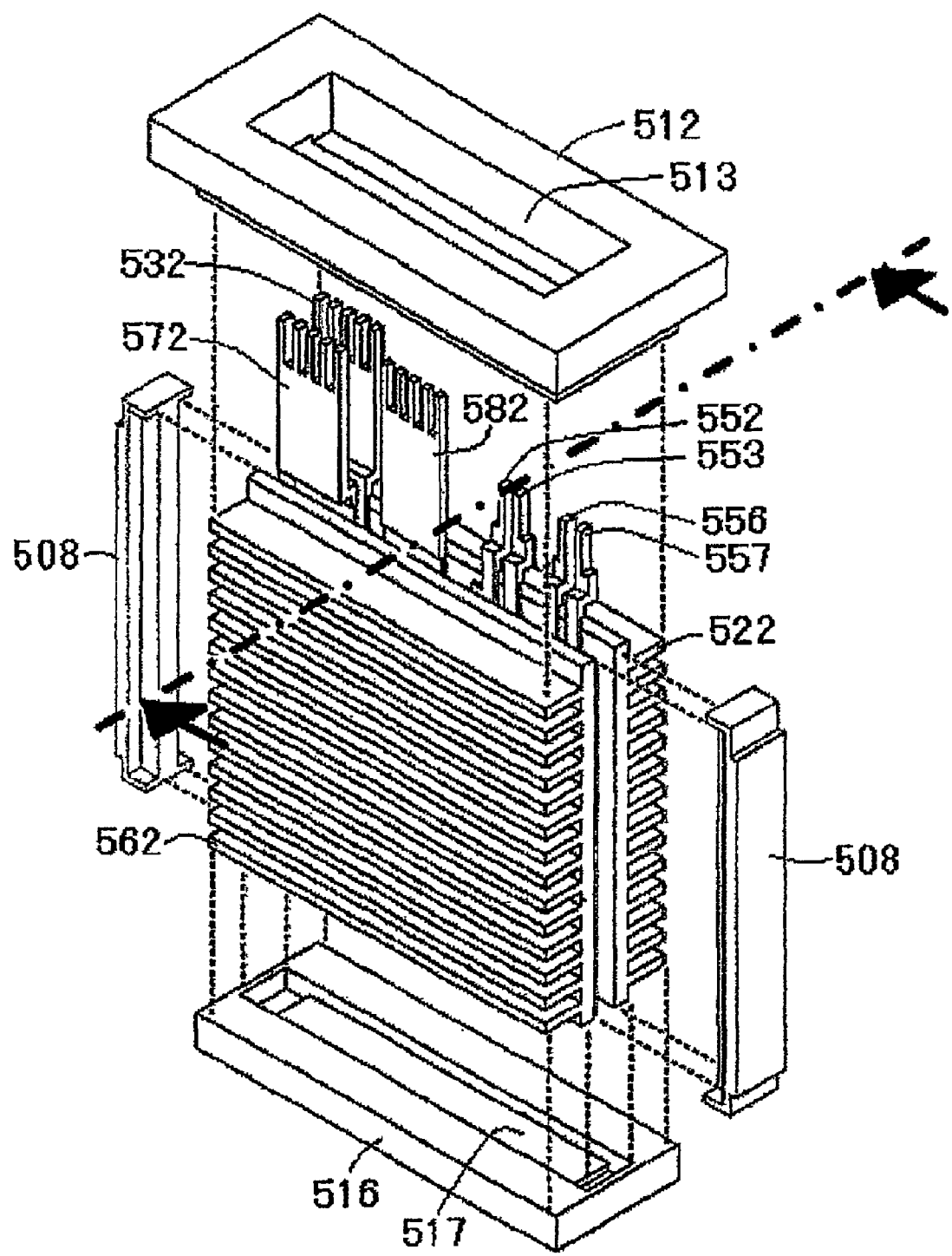
FIG. 20 is an exploded view of the semiconductor module including the case.
Figure 21:
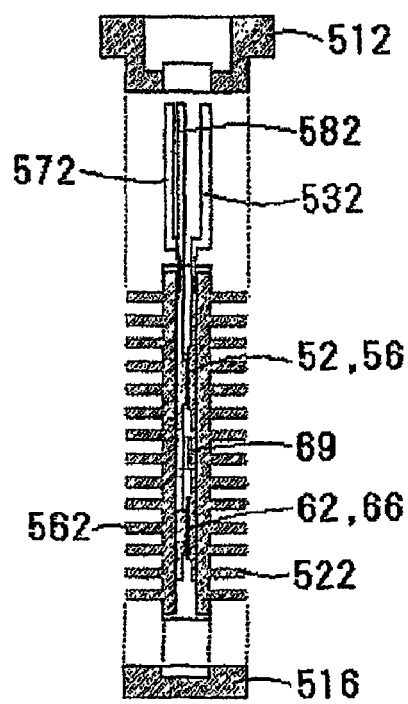
FIG. 21 is a cross-sectional view of the semiconductor module shown in FIG. 20.

Production method and structure of the semiconductor module used in the power conversion device according to the present embodiment are described in detail with reference to FIGS. 18 to 28. FIG. 18 is a diagram showing an appearance of the semiconductor module with heat dissipation fins having incorporated therein the upper and lower arms series circuit in the power conversion device according to an embodiment of the present invention. FIG. 19 is a cross-sectional view of the semiconductor module shown in FIG. 18. FIG. 20 is an exploded view of the semiconductor module including the case. FIG. 21 is a cross-sectional view of the semiconductor module shown in FIG. 20.

Figure 22:
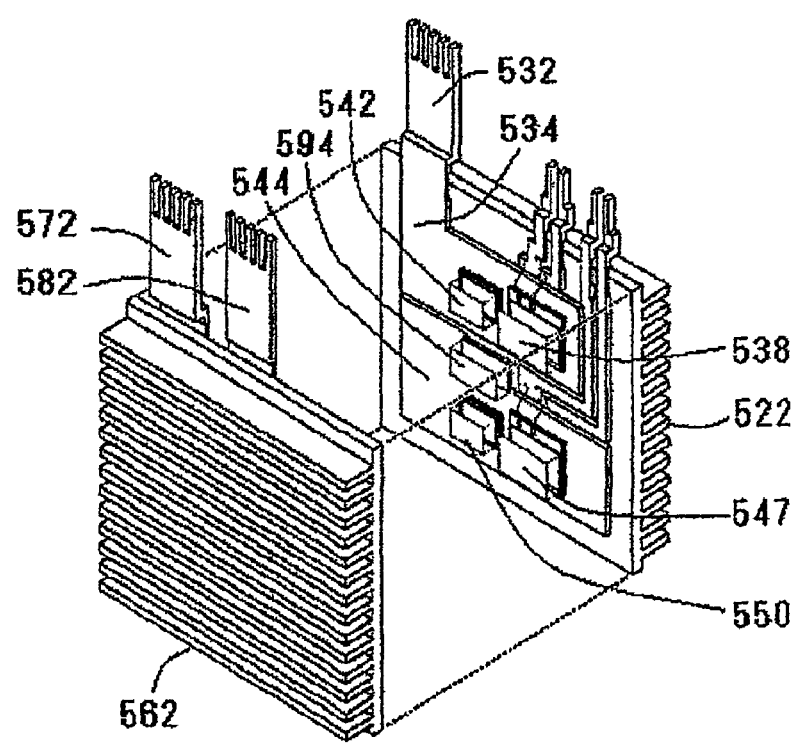
FIG. 22 is an exploded perspective view showing the inside structure of the semiconductor module according to an embodiment of the present invention with the heat dissipation fins on one side (side A) and the heat dissipation fins on the other side (side B) being expanded from each other.
Figure 23:
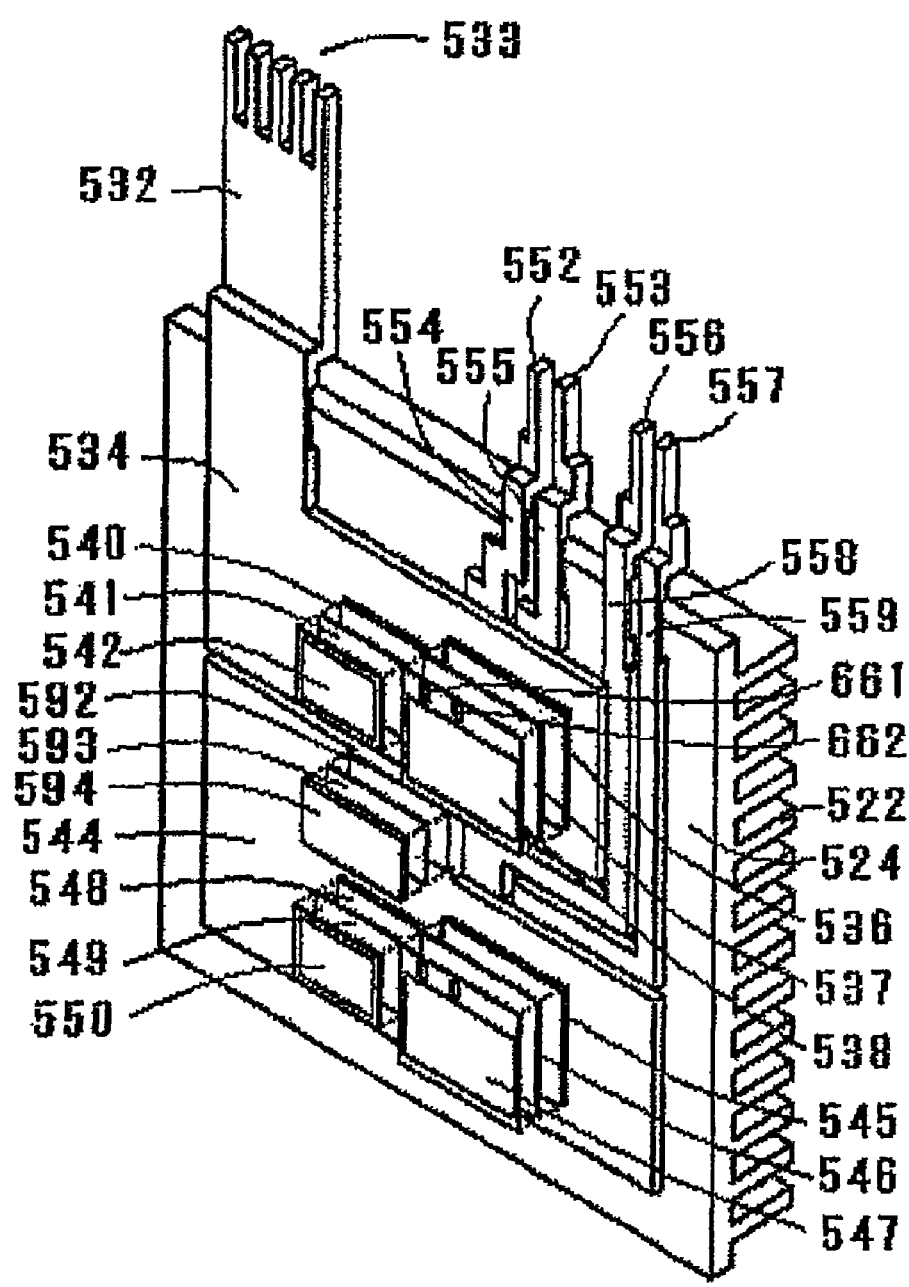
FIG. 23 is a diagram showing the structure of the upper and lower arms series circuit fixed to the inner side of the heat dissipation fins (side A) of the semiconductor module.
Figure 24:
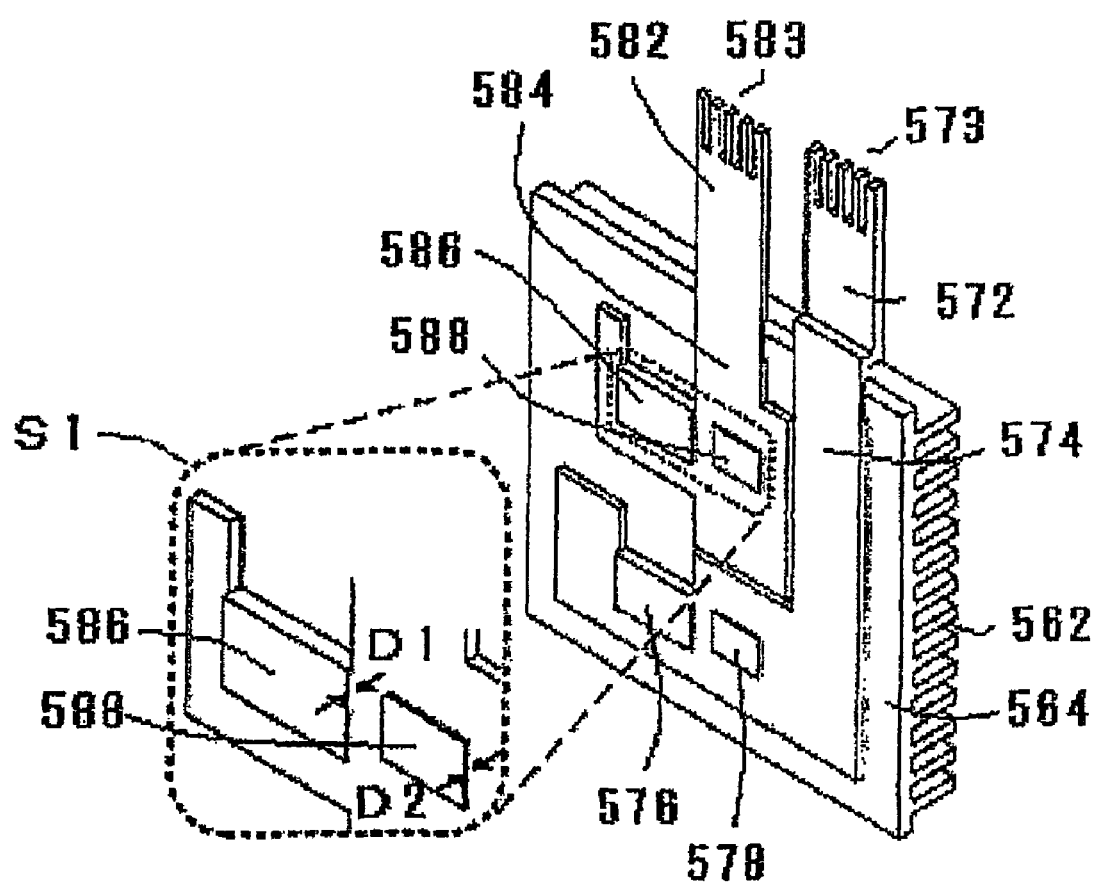
FIG. 24 is a perspective view showing the structure of the upper and lower arms series circuit fixed to the inner side of the heat dissipation fins (side B) of the semiconductor module.
Figure 25:
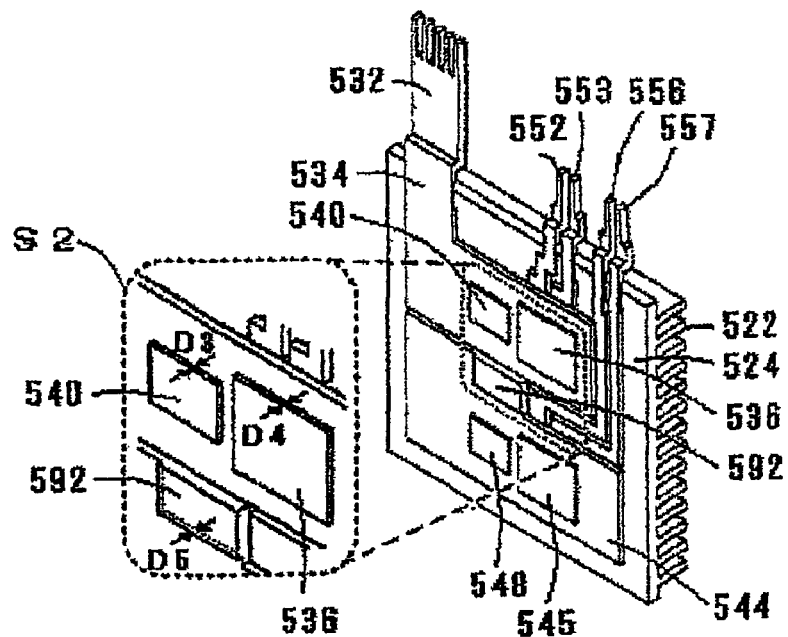
FIG. 25 is a perspective view showing the structure of the upper and lower arms series circuit fixed to the inner side of the heat dissipation fins (side A) of the semiconductor module.
Figure 26:
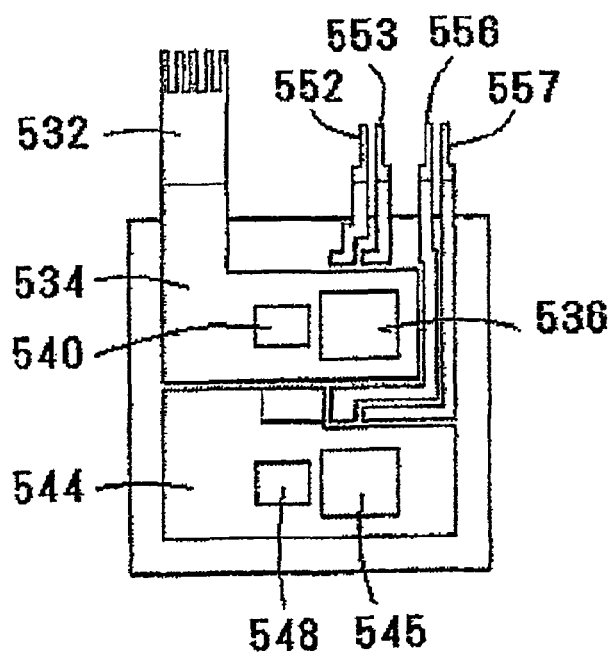
FIG. 26 is a front view of the semiconductor module of FIG. 25.
Figure 27:
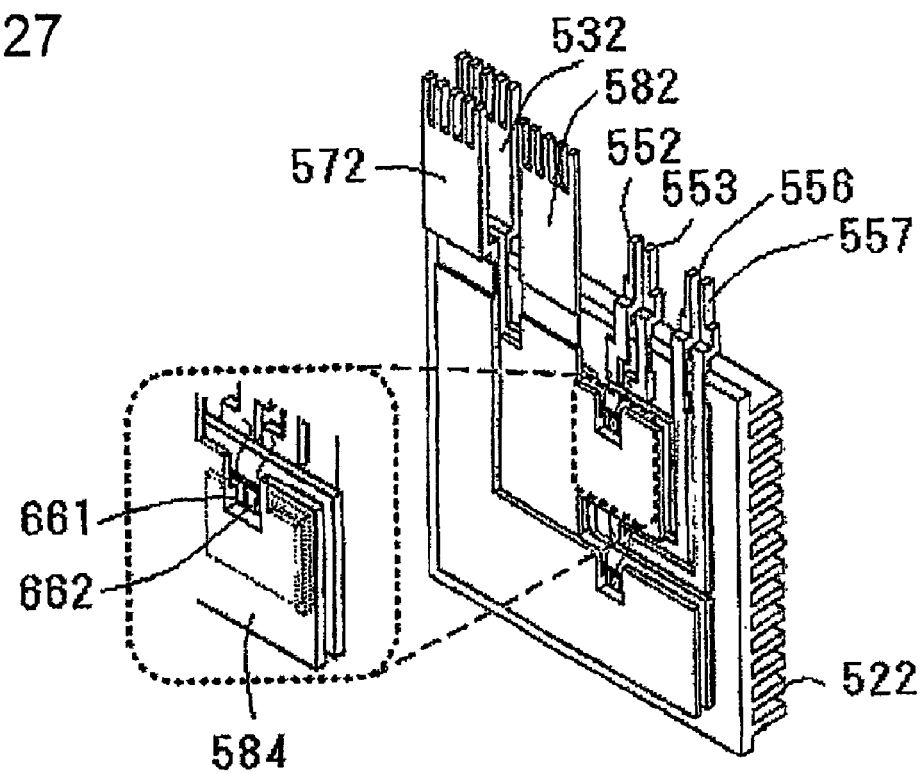
FIG. 27 is a perspective view showing the structure of the conducting member formed by vacuum thermocompression bonding on the inner side of the heat dissipation fins of the semiconductor module and the manner of wire bonding.
Figure 28:
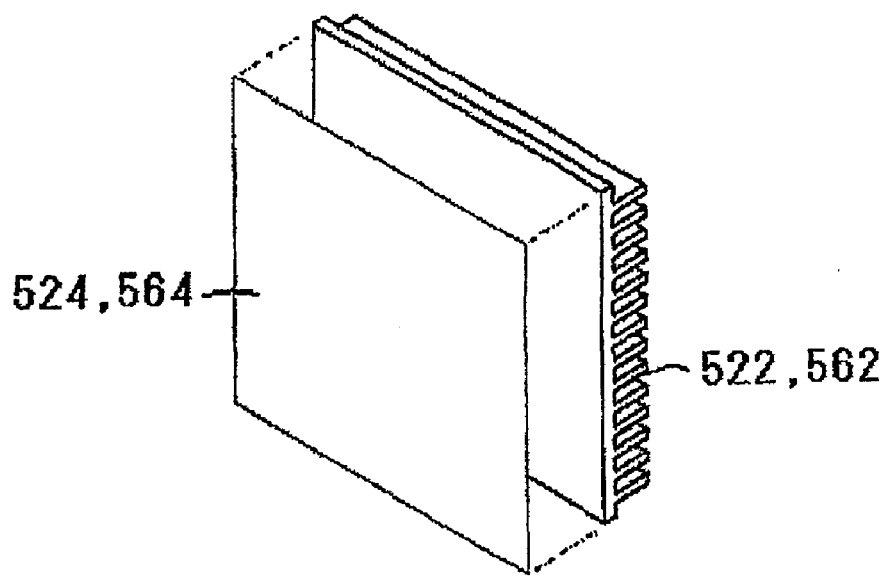
FIG. 28 is an illustration of vacuum thermocompression bonding of a conducting member to the heat dissipation fins of the semiconductor module through a heat dissipation sheet.

FIG. 22 is an exploded perspective view showing the inside structure of the semiconductor module according to an embodiment of the present invention with the heat dissipation fins on one side (side A) and the heat dissipation fins on the other side (side B) being expanded from each other. FIG. 23 is a diagram showing the structure of the upper and lower arms series circuit fixed to the inner side of the heat dissipation fins (side A) of the semiconductor module. FIG. 24 is a perspective view showing the structure of the upper and lower arms series circuit fixed to the inner side of the heat dissipation fins (side B) of the semiconductor module. FIG. 25 is a perspective view showing the structure of the upper and lower arms series circuit fixed to the inner side of the heat dissipation fins (side A) of the semiconductor module. FIG. 26 is a front view of the semiconductor module of FIG. 25. FIG. 27 is a perspective view showing the structure of the conducting member formed by vacuum thermocompression bonding on the inner side of the heat dissipation fins of the semiconductor module and the manner of wire bonding. FIG. 28 is an illustration of vacuum thermocompression bonding of a conducting member to the heat dissipation fins of the semiconductor module through a heat dissipation sheet.

In FIGS. 18 to 21, a semiconductor module 500 according to an embodiment of the present invention includes a heat dissipation fin on one side (side A) 522 (heat dissipation fin referring to not only a fin-shaped part having protrusion and depression but also heat dissipation metal in whole), a heat dissipation fin on another side (side B) 562, the upper and lower arms series circuit 50 sandwiched by the heat dissipation fins 522 and 562, various terminals including a positive terminal 532, a negative terminal 572, and an alternate current terminal 582, a top case 512, a bottom case 516, and a side case 508. As shown in FIGS. 19 and 20, the semiconductor module 500 is obtained as an integrated structure as follows. The upper and lower arms series circuit (whose production method is described later on) is provided on each of conducting members that are fixed to the heat dissipation fin (side A) 522 and the heat dissipation fin (side B) 562 through insulation sheets, respectively. In a state in which the upper and lower arms series circuits are sandwiched by the heat dissipation fin (side A) 522 and the heat dissipation fin (side B) 562 therebetween, the bottom case 516, the top case 512, and the side case 508 are attached to the resultant structure. Then a mold resin is filled between the heat dissipation fins 522 and 562 from the side of the top case 512 to obtain an integrated structure.

The semiconductor module 500 has an appearance as shown in FIG. 18. That is, the heat dissipation fin (side A) and the heat dissipation fin (side B) are formed so as to face the cooling water channel. Through the top case 512, there protrude the positive terminal 532 (corresponding to the P terminal 57 in FIG. 2), the negative terminal 572 (corresponding to the N terminal 58 in FIG. 2), the alternate current terminal 582 (corresponding to the alternate current terminal 59 in FIG. 2), the signal terminal (for the upper arm) 552, the gate terminal (for the upper arm) 553, the signal terminal (for the lower arm) 556, and the gate terminal (for the lower arm) 557 of the upper and lower arms series circuit 50.

The appearance configuration of the semiconductor module 500 is substantially rectangular parallelepiped. The heat dissipation fin (side A) 522 and the heat dissipation fin (side B) 562 have each a large area. Assuming that the face of the heat dissipation fin (side B) is a front face and the face of the heat dissipation fin (side A) is a rear face, both the sides, i.e., the side on which the side case 508 is provided and the side opposite thereto as well as the bottom face and the top face have areas smaller than the above-mentioned front face or the rear face. Since the basic shape of the semiconductor module is substantially rectangular parallelepiped and the heat dissipation fin (side B) and the heat dissipation fin (side A) are square, their cutting work is easy. In addition, the semiconductor has a shape such that it is difficult to be turned on the production line, so that excellent productivity is obtained. Moreover, since a ratio of heat dissipation area to the whole volume can be made large, the cooling effect can be improved.

In the present embodiment, in the heat dissipation fin (side A) 522 or the heat dissipation fin (side B) 562, the metal plates that sandwich the semiconductor chip and hold the conductor in the semiconductor module and the fin that dissipates heat are made of the same metal. This structure is excellent in that the heat dissipation efficiency of the semiconductor module is increased. Another structure may also be used although the heat dissipation efficiency is decreased to some extent. That is, the metal plates that sandwich the semiconductor chip and hold the conductor in the semiconductor module and the fin that dissipates heat may be made separately and affixed together.

On the top face, which is one of smaller faces of the substantially rectangular parallelepiped, there are assembled the positive terminal 532 (corresponding to the P terminal 57 in FIG. 2), the negative terminal 572 (corresponding to the N terminal 58 in FIG. 2), the alternate current terminal 582 (corresponding to the alternate current terminal 59 in FIG. 2), the signal terminal (for the upper arm) 552, the gate terminal (for the upper arm) 553, the signal terminal (for the lower arm) 556, and the gate terminal (for the lower arm) 557 of the upper and lower arms series circuit 50. This structure is excellent in that the semiconductor module 500 can be easily inserted in the channel case. The surface configuration of the top face on which the above-mentioned terminals are provided is made larger than the surface configuration of the bottom face as shown in FIG. 18, so that when the semiconductor module is moved on the production line or the like, the terminal parts that otherwise tend to be damaged can be protected. That is, since the surface configuration of the top case 512 is made larger than the surface configuration of the bottom case 516, there can be obtained the effect of providing excellent sealability of the opening of the cooling water channel to be detailed hereinbelow. Besides, there can be obtained the effect that the terminals of the semiconductor module are protected when the semiconductor module is produced, transported, and attached to the channel case.

With the above-mentioned arrange of the terminals, the positive electrode terminal 532 and the negative electrode terminal 572 are each a plate rectangular in cross-section and arranged so as to face each other and close to one of the sides. Since the positive electrode terminal 532 and the negative electrode terminal 572 are arranged close to one of the sides, wiring them to a capacitor module and the like is easy. The connecting ends of the positive electrode terminal 532 and the negative electrode terminal 572 are arranged with a shift from the connecting end of the alternate current terminal 582 in the direction of front and rear of the semiconductor module (direction connecting both the side faces to each other). With this, it is easy to secure a space in which a tool for connecting the connecting ends of the positive electrode terminal 532 and of the negative electrode terminal 572 to other components as well as for connecting the connecting end of the alternate current terminal 582 to other components is used, so that excellent productivity is obtained.

There is a possibility that the power conversion device for automobiles is cooled down to −30° C. or lower and near −40° C. On the other hand, there is a possibility that the temperature of the power conversion device reaches a temperature of 100° C. or higher, and in rare cases near 150° C. As mentioned above, the power conversion device to be mounted on an automobile is used at temperatures in a wide range and hence it is necessary to give due considerations to changes due to thermal expansion. The power conversion device is used in an environment in which vibration is always applied thereto. The semiconductor module 500 described with reference to FIGS. 18 to 21 has a structure in which the semiconductor chip is sandwiched by two heat dissipation metals. According to this embodiment, a metal plate having heat dissipation fins with excellent heat dissipation function is used as an example of the heat dissipation metal. This is described in the present embodiment as the heat dissipation fin 522 (side A) and the heat dissipation fin 562 (side B).

In the above-mentioned structure of sandwiching the semiconductor chip, there is provided a structure in which both sides of the two heat dissipation metals are fixed with the top case 512 and the bottom case 516. In particular, the top case 512 and the bottom case 516 have each a structure in which the two heat dissipation metals are sandwiched by the top case 512 and the bottom case 516 on the outer sides thereof. With this structure, a force is always applied to the heat dissipation metal from the outer side to the inner side thereof, so that occurrence of a large force in the direction in which the two heat dissipation metals move away from each other between the two heat dissipation metals due to vibration and thermal expansion can be prevented. Therefore, there can be obtained a highly reliable power conversion device that will not get out of order when it is mounted on an automobile for a long period of time.

In the present embodiment, a structure is adopted in which the top case 512 and the bottom case 516 sandwich the two heat dissipation metals above-mentioned as well as the side case on the outer sides therebetween to fix them, so that the reliability of the power conversion device is further increased.

The following structure may be adopted. That is, the positive electrode terminal 532, the negative electrode terminal 572, the alternate current terminal 582, signal terminals 552 and 554, and gate terminals 553 and 556 are configured to protrude to outside through a slot inside the top case 512 and the slot is sealed with a mold resin 502. The top case 512 is made of a material having high strength. Taking thermal coefficients of the two heat dissipation metals into consideration, the top case 512 may be made of a material, for example, a metal having thermal expansion coefficients close to that of the two metals. The mold resin 502 has a function to absorb stress generated by thermal expansion of the case 512 and decrease the stress applied to the above-mentioned terminals. Therefore, the power conversion device according to the present embodiment has a high reliability in that it can be used in a state where the temperature changes in a wide range or in a state where vibration is always applied thereto.

Referring to FIGS. 22 to 28, the production method and structure of forming the upper and lower arms series circuit (for example, 2 arms in 1 module structure) sandwiched between both the heat dissipation fins 522 and 562 are described hereinbelow.

Basic processes for producing a semiconductor module according to the present embodiment are shown in order. Plates of heat dissipation metal, for example, the heat dissipation fin (side A) 522 and the heat dissipation fin (side B) 562, which are, for example, metal plates with fin structures in the present embodiment are used as base materials and the insulation sheet (side A) 524 and the insulation sheet (side B) 564 are fixed to the inner sides thereof by vacuum thermocompression (see FIG. 28). A conducting member 534 and a first conducting member 544 on the positive electrode side are fixed to the insulation sheet 524 (side A) by vacuum thermocompression. A conducting member 574 and a conducting member (second conducting member) 584 for alternate current on the negative electrode side are fixed to the insulation sheet 564 (side B) by vacuum thermocompression. Fixing of the conducting member 534 and 544 to the heat dissipation fin (side A) 522 and the insulation sheet (side A) 524 is shown in FIGS. 25 and 26, and fixing of the conducting members 574 and 584 to the heat dissipation fin (side B) 542 and the insulation sheet (side B) 546 is shown in FIG. 24.

In addition, the signal conductor 554 of the signal terminal (for the upper arm) 552 to the insulation sheet 524 (side A), the gate conductor 555 of the gate terminal (for the upper arm), the signal conductor 558 of the signal terminal (for the lower arm) 556, and the gate conductor 559 of the gate terminal (for the lower arm) 557 are fixed. The layout of these is as shown in FIG. 23.

The insulation sheet (side A) 524 and the insulation sheet (side B) 564 are explained below. They function as insulation members that electrically insulate the semiconductor chip and conductors constituting the upper and lower arms series circuit of the inverter circuit from the heat dissipation fin (side A) 522 and the heat dissipation fin (side B) 562. They also serve to form a heat conducting path that conducts heat generated by the semiconductor chip and so on to the heat dissipation fin (side A) 522 and the heat dissipation fin (side B) 562. The insulation member may be an insulation sheet or plate made of a resin or a ceramic substrate. For example, it is desirable that the insulation member has a thickness of 350 µm or less in the case of the ceramic substrate and is thinner as thin as 50 µm to 200 µm in the case of the insulation sheet. Note that in decreasing inductance, the insulation member is more efficient when it is thinner, so that the insulation sheet made of the resin has more excellent characteristics than the ceramic substrate.

The IGBT chips 538 and 547 and the diode chips 542 and 550 are soldered on to the protrusions 536, 540, 545, and 548 provided on the conducting members 534 and 544 of the heat dissipation fin (side A) 522 through solder layers 537, 541, 546, and 549, respectively (see FIG. 23). On this occasion, the conducting member 534 and the first conducting member 544 are provided as insulated from each other and the IGBT chips and the diode chips are soldered to the conducting members 534 and 544, respectively. As shown in FIG. 2, a connection plate 594 that connects the emitter electrode of the upper arm to the collector electrode of the lower arm is soldered to the first conducting member 544 in the same manner as in the case of the chips 547 and 550, and the connection plate 594 abuts and is connected to the conducting member for alternate current (second conductor) 584 to constitute the intermediate electrode 69 (see FIG. 2).

Wire bonding is performed to establish connections between the signal emitter electrode 661 of the upper arm IGBT 538 soldered on the conducting member 534 of the heat dissipation fin (side A) and the signal conductor 554 of the signal terminal 552 (for the upper arm) and between a gate electrode 662 of the upper arm IGBT 538 and the gate conductor 555 of the gate terminal (for the upper arm) 553 (see FIG. 27). Similarly, wire bonding is performed to establish connections between the signal emitter electrode of the lower arm IGBT 547 soldered on the conducting member 544 of the heat dissipation fin (side A) 522 and the signal conductor 558 of the signal terminal 556 (for the lower arm) and between a gate electrode of the lower arm IGBT 547 and the gate conductor 559 of the gate terminal (for the lower arm) 557 (see FIG. 27).

As shown in FIG. 23, both the semiconductor chips that constitute the upper and the lower arms, respectively, are fixed to one of the heat dissipation fin, i.e., heat dissipation fin (side A) 522 and the semiconductor chips are provided with the signal conductors 554 and 558 and the gate conductors 555 and 559, respectively. Since the semiconductor chips for the upper and the lower arms and control lines therefor are provided on one of the insulation members as mentioned above, connecting operation to connect signal lines to the semiconductor chips, such as wire bonding, can be gathered in the production process, so that the productivity and reliability of the semiconductor modules can be improved.

When the power conversion device is used in an environment in which large vibrations occur such as an automobile, the power conversion device has improved vibration resistance since the semiconductor chip, one of the members to be wired, and the control line, the other of the members to be wired are fixed to one and the same member, i.e., one of the heat dissipation fins.

In the structure shown in FIG. 23, the semiconductor chip for the upper arm and the semiconductor chip for the lower arm are fixed in the same direction, that is, the respective collector surfaces are fixed to the insulation sheet 524, which is an insulating member. Alignment of the direction of the semiconductor chips improves workability. This is true for the diode chips.

In the structure shown in FIG. 23, the semiconductor chip for the upper arm and the semiconductor chip for the lower arm are separately arranged in the direction of the drawing out the terminals, with one behind and the other front. The direction in which the terminals are drawn out coincides with the direction in which the terminals are inserted into the channel as detailed below. The semiconductor chip for the upper arm and the semiconductor chip for the lower arm are separately arranged in the direction in which the terminals are drawn out, with one behind and the other front. With this arrangement, the arrangement of the electric components in the semiconductor module becomes regular, so that the semiconductor module in whole can be downsized. Since the heat source is divided regularly (i.e., the plurality of IGBTs, which are heat sources, are operated by regular changes of ON/OFF of each of the IGBTs), distribution of heat is excellent. In addition, since the heat dissipation surface is regularly divided, the heat dissipation surface acts efficiently, if the semiconductor module is relatively downsized, to improve cooling efficiency.

The following description is intended to explain the heat dissipation fin (side B) 562. A conducting member is fixed to the heat dissipation fin (side B) 562 through the insulation member, i.e., the insulation sheet 564 by vacuum thermocompression. As shown in FIG. 24, the conducting member 584 for alternate current from which the alternate terminal 582 is drawn out and the conducting member 574 on the negative electrode side from which the negative electrode terminal 572 is drawn out are arranged on the insulation sheet, which is the insulation member. On the conducting members 574 and 584 are provided protrusions 576, 578, 586, and 588 as shown in FIG. 24. The protrusions 576 and 586 are connected to the IGBT chips and the protrusions 578 and 588 are connected to the diode chips.

In FIG. 24, as shown in a partial expanded view S1, D1 and D2 indicate each thickness of the protrusion. Since the diode chip is thicker than the IGBT chip, D1>D2 is established. On the inside of the heat dissipation fin (side A) 522, as shown in FIG. 23, the emitter electrode of the upper arm and the anode of the diode are shaped so as to protrude on the conducting member 534 on the positive electrode side having the positive electrode terminal 532. The emitter electrode for the lower arm and the anode of the diode are formed so as to protrude on the conducting member 544 and the conducting member 594 that constitutes the intermediate electrode 69 is formed so as to protrude on the conducting member 544.

Subsequently, the heat dissipation fin (side A) 522 and the heat dissipation fin (side B) 562 are placed so as to face each other as shown in FIG. 22, and the protrusions 586, 588, 576, and 578 on the conducting members 574 and 584 of the heat dissipation fin (side B) 562 are faced such that they can be connected to the electrodes of the IGBT chips 538 and 547 of the heat dissipation fin (side A) 522 and the electrodes of the diode chips 542 and 550, and these are soldered. The connecting plate 594 provided to the first conducting member 544 of the heat dissipation fin (side A) 522 is arranged so as to face the conducting member 584 for alternate current provided to the heat dissipation fin (side B) 562 and these are soldered. The bottom case 516, the top case 512, and the side case 508 are bonded with an adhesive to the heat dissipation fin (side A) 522 and the heat dissipation fin (side B) 562 constituting an integrated structure (see FIG. 20). The mold resin is filled through a hole 513 in the top case into the inside to form the semiconductor module 500.

As shown in FIGS. 22 and 24, one of the direct current terminals and the alternate current terminal are arranged on one insulation member. In this manner, a wiring member is arranged on the heat dissipation fin (side B) 562 and the semiconductor chips are arranged in a concentrated manner on the heat dissipation fin (side A) 522. With this configuration, the productivity of the semiconductor module can be improved.

The positive electrode terminal 532, the negative electrode terminal 572, the alternate current terminal 582, and the conducting members 534, 574, and 584 in the semiconductor module are formed as an integral body and hence the productivity of the semiconductor module is improved. These conductors are fixed to the heat dissipation metals through the insulating members and sandwich the semiconductor chips therebetween. Because of reactive forces urged by the sandwiched semiconductor chips, the conducting members receive each a force in the direction in which they are pressed against the heat dissipation metal. As a result, the reliability of the fixing is improved. As mentioned above, since the terminals and the conductors therefor respectively are each formed as an integral body, so that the reliability of not only the conductors but also fixing of the terminals is improved. Therefore, when the semiconductor module having the above-mentioned structure is applied to the power conversion device of an automobile, it allows high reliability to be maintained even in an environment in which vibrations and the like are applied.

Figure 34:
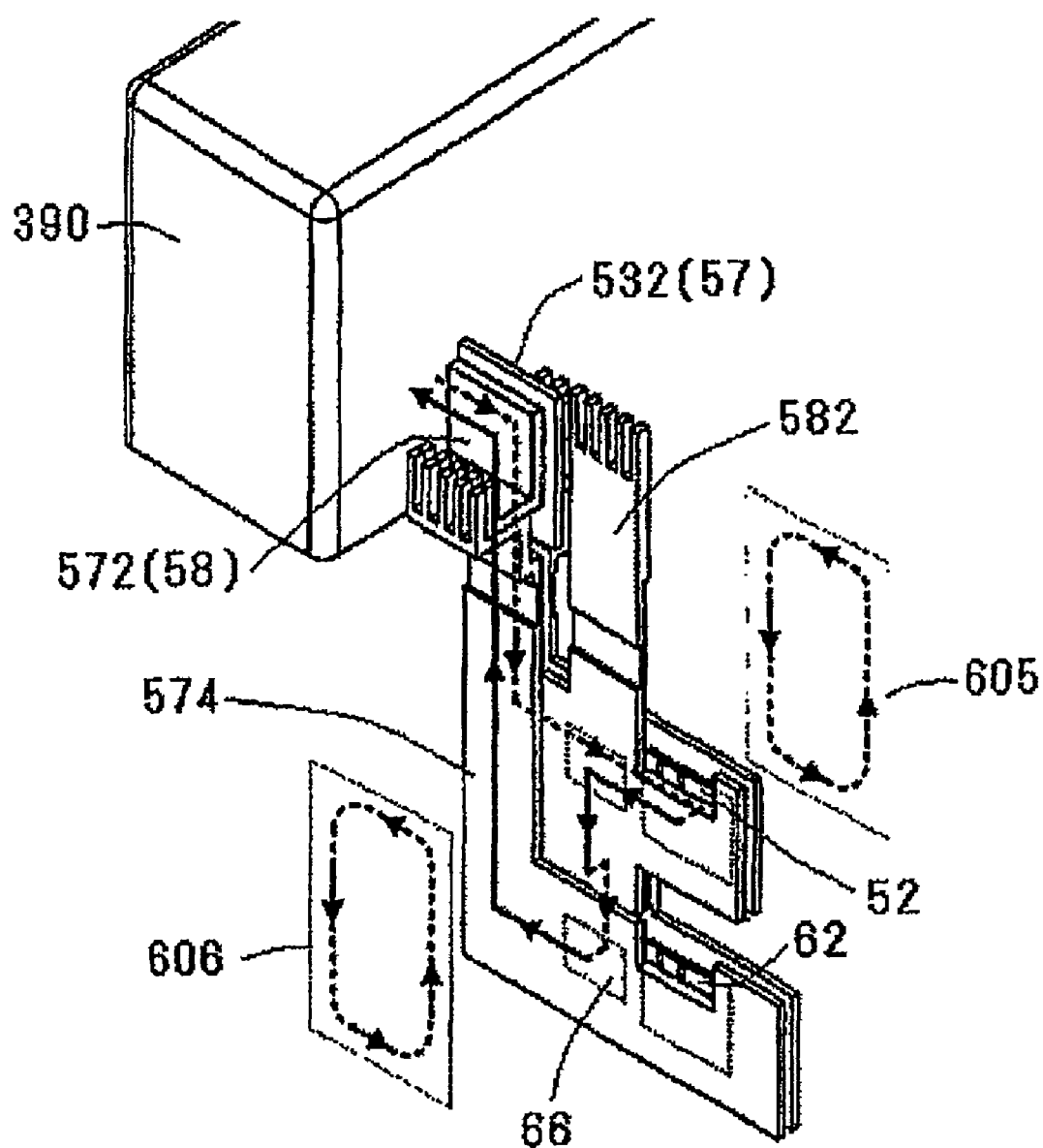
FIG. 34 is a schematic structural layout illustrating an induction reducing effect of the semiconductor module according to an embodiment of the present invention.
Figure 35:
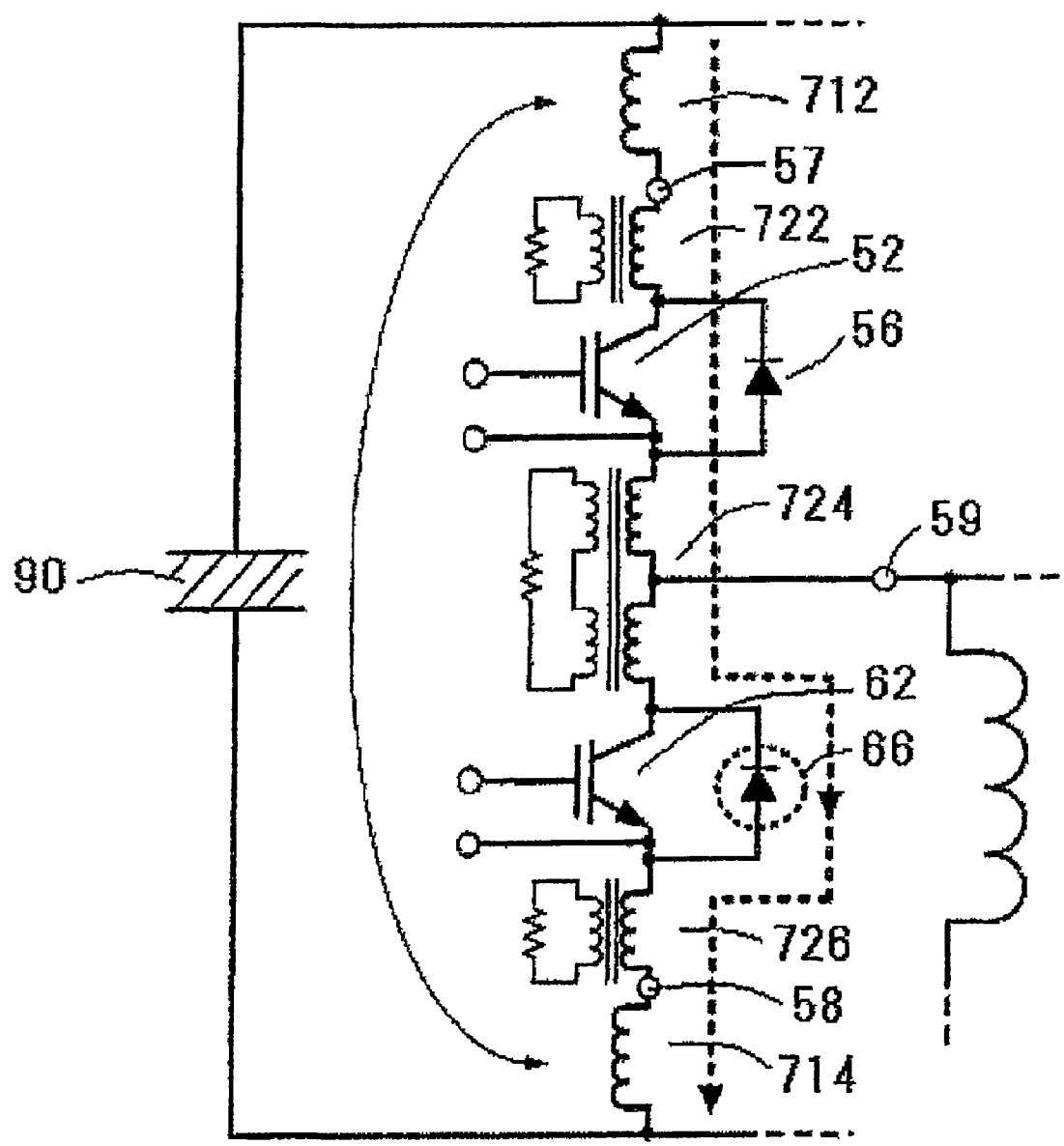
FIG. 35 is a schematic circuit layout illustrating an induction reducing effect of the semiconductor module according to an embodiment of the present invention.

Reduction in inductance by elaborated layout of circuits in the semiconductor module according to the present embodiment is described referring mainly to FIGS. 34 and 35. First, the method of attaching semiconductor chips is summarized again with reference to FIGS. 2, 22, 24, and 25. The upper arm is described. On the side of the heat dissipation fin (side A) 522, the collector and cathode of the semiconductor chip constituted by an IGBT and a diode are soldered to the conducting member 534 (Cu lead), which serves as a positive electrode plate corresponding to the positive electrode terminal 532 (P terminal), and the emitter electrode of the IGBT and the anode of the diode are exposed on the surface of the semiconductor chip. On the side of the heat dissipation fin (side B) 562, the conducting member 584 (Cu lead) is provided thereon with protrusions 586 and 588, respectively, so as to face the emitter electrode and the anode of the heat dissipation fin (side B). The alternate current terminal 582 (that is a terminal to be connected to the U, V, or W phase of the motor generator 92) is provided to an extension of the conducting member 584 for alternate current. Then, the heat dissipation fin (side A) 522 and the heat dissipation fin (side B) 562 are superposed one on another and soldered to form the circuits 52 and 56 in the upper arm as shown in FIG. 2. The alternate current terminal 582 and the positive electrode terminal 532 are shaped so as to protrude through the top case 512 as shown in FIGS. 18 and 22.

The above description relates to basic structures. In the present embodiment, the lower arm (lower semiconductor chip) besides the upper arm (upper semiconductor chip) is similarly formed on the heat dissipation fin (side A) 522 and the heat dissipation fin (side B). As shown in FIG. 23, the GBT 62 and the diode 66 shown in FIG. 2 as the lower arm are soldered onto the conducting member 544 of the heat dissipation fin (side A) 522 similarly to the upper arm. The heat dissipation fin (side A) 522 includes two conducting members arranged in two stages one above another. On the stages are soldered the semiconductor chips of the upper and the lower arms. The emitter electrode of the IGBT and the anode of the diode are exposed on the surface of each semiconductor chip. On the conducting members 574 and 584 of the heat dissipation fin (side B), there are provided protrusions 576, 578, 586, and 588 in positions opposite to the emitter electrodes of the upper and the lower arms and the anode of the heat dissipation fin (side A). The negative electrode terminal 572 is provided on the extension of the conducting member 574, which is the lower stage, of the heat dissipation fin (side B) 562 and the alternate current terminal 582 is provided on the extension of the conducting member 584, which is the upper stage, of the heat dissipation fin (side B) 562.

With this structure, the emitter electrode and the anode 542 of the upper arm IGBT chip 538 are connected to the alternate current terminal 582 through the protrusions 586 and 588. The collector electrode and the cathode of the lower arm IGBT chip 547 are connected to alternate current conductor 584 through the conducting member 544 and protrusion-shaped connecting plate 594 and hence to the alternate current terminal 582. The emitter electrode 547 and the anode 550 of the lower arm IGBT chip 547 are connected to the negative electrode terminal 572 through the protrusions 576 and 578. Thus, the circuitry shown in FIG. 2 is formed. FIG. 23 shows an abutting surface of the heat dissipation fin (side A) 522 and FIG. 24 shows an abutting surface of the heat dissipation fin (side B) 562. The abutting surfaces are contacted and soldered to form a main part of the semiconductor module.

As shown in FIGS. 18 to 28, in the power conversion device according to the present embodiment, the semiconductor module 500 has a structure in which two heat dissipation metals sandwich the semiconductor chip. In the present embodiment, examples of the heat dissipation metal used in the present embodiment include metal plates having heat dissipation fins having an excellent heat releasing function, for example, the heat dissipation fin 522 (side A) and the heat dissipation fin 562 (side B). The semiconductor module 500 is configured such that IGBT chips 538 and 547, which are semiconductor chips, are sandwiched by the conducting members provided on the inside of the two heat dissipation metals. With this structure, low melting point solder can be used as solder for electric connection. When the low melting point solder is used, once the solder is molten to fix the semiconductor chip to one of the heat dissipation metal and then the other heat dissipation metal is put on the semiconductor chip to sandwich it between the two heat dissipation metals. There is a possibility that during this process, the soldered portion is molten again.

However, since the method is adopted in which the both electrodes of the semiconductor chip, for example the collector electrode and the emitter electrode of the IGBT chip in the present embodiment, are firmly sandwiched by the heat dissipation metals, there arises no impediments if the solder layer is molten again. Therefore, the low melting point solder can be used. The low melting point solder not only provides good productivity as compared with high melting point solder but also exhibits superior heat conductivity to high melting point solder. By designing the semiconductor module to have a structure that allows use of low melting point solder, a semiconductor module having excellent heat resistance can be obtained. When such a semiconductor module is applied to a power conversion device that is mounted on an automobile, a significant effect from the viewpoint of reliability can be obtained.

As shown in FIGS. 18 to 28, in the power conversion device according to the present embodiment, the semiconductor module 500 has a structure in which the two heat dissipation metals sandwich the semiconductor chip therebetween. By configuring the semiconductor chip to be sandwiched by the heat dissipation metals, a power conversion device for automobiles can be obtained. This is usable in an environment in which vibrations are always applied and a range of temperature at which it is used is very broad. In the present embodiment, the upper sides of the two heat dissipation metals that sandwich the semiconductor chip therebetween are locked by the top case 512. The positive electrode terminal 532, the negative electrode terminal 572, and the alternate current terminal 582 protrude through the top case 512. On the bases of the positive electrode terminal 532, the negative electrode terminal 572, and the alternate current terminal 582 of the semiconductor module that protrude outward have portions having smaller cross-sectional areas. The conductors 534, 574, and 584 of the respective terminals inside the semiconductor module are fixed to one or the other heat dissipation metal, so that a structure that is resistant to vibrations is obtained. Though not shown in the drawings, parts having smaller cross-sectional areas are provided between the terminals that protrude outward and the inner conductors. This minimizes the possibility that stress due to external vibrations and stress due to thermal expansion are transferred directly to the inner conductor without reduction.

Figure 43:
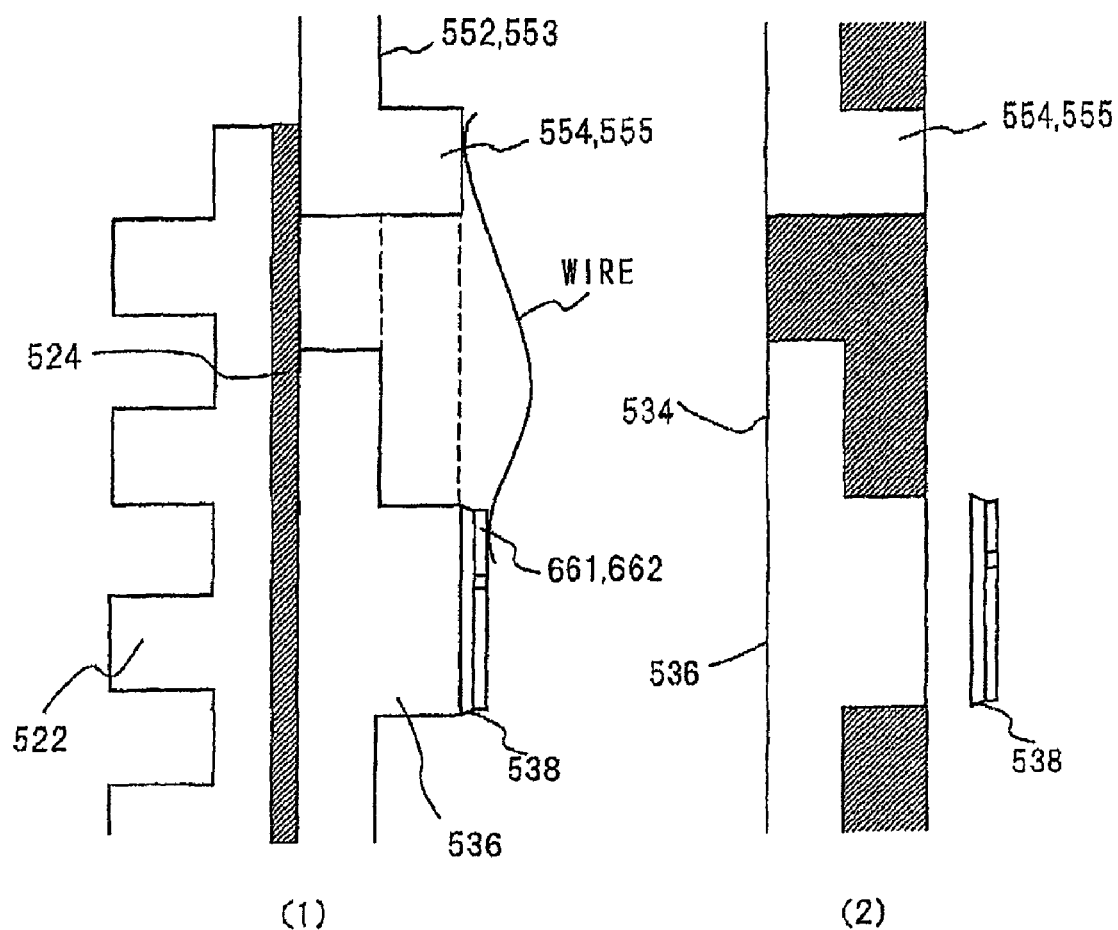
FIG. 43 is a diagram illustrating a method of forming the inverter circuit on the heat dissipation fins on one side (side A) of the semiconductor module according to an embodiment of the present invention.
Figure 44:
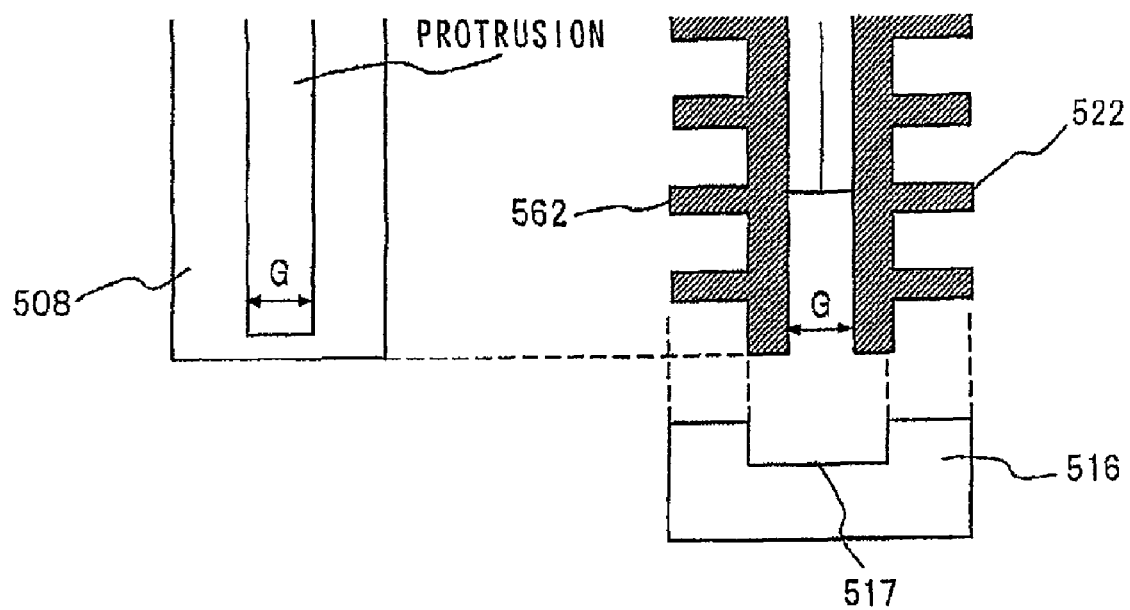
FIG. 44 is a diagram illustrating fixing relationship between the bottom and side cases and the heat dissipation fins in the semiconductor module according to an embodiment of the present invention.

Specific structure and production method of the semiconductor module according to the present invention that bring about improvements of productivity and reliability are described in detail with reference also to FIGS. 43 and 44. FIG. 43 is a diagram illustrating a method of forming the inverter circuit on the heat dissipation fins on one side (side A) of the semiconductor module according to an embodiment of the present invention. FIG. 44 is a diagram illustrating fixing relationship between the bottom and side cases and the heat dissipation fins in the semiconductor module according to an embodiment of the present invention.

Part (1) of FIG. 43 shows a structure which is obtained as follows. That is, the insulation sheet (side A) 524 is fixed to the heat dissipation fin (side A) 522 by vacuum thermocompression. On the insulation sheet (side A) 524 in the resultant structure, there is fixed the conducting member 534 on the positive electrode side similarly by vacuum thermocompression and then the IGBT chip (for the upper arm) 538 is soldered on the conducting member 534. The signal emitter electrode terminal 661 and the signal conductor 554 of the signal terminal (for the upper arm) 552 are connected to each other by wire bonding (see FIGS. 23 and 25).

Part (2) of FIG. 43 shows structural relationships between the positive side conducting member 534 and the signal conductor 554 or gate conductor 555. A conducting member in the form of a flat plate is vacuum thermocompressed to the insulation sheet 524 and the flat conducting member is cut off by, for example, etching to remove the portion hatched in the part (2) of FIG. 43, thus dividing the flat conducting member into the positive electrode side conducting member 534, the protrusion 536 on the positive electrode side conducting member 534, the signal conductor 554, the gate conductor 555, the signal terminal 552, and the gate terminal 553. The protrusion 536 has a face that is opposite to the IGBT chip 538. This exhibits a function of positioning of the chip 538 when the chip 538 is soldered.

When the signal emitter electrode terminal 661 or the gate electrode terminal 662 of the IGBT chip 538 and the signal conductor 554 or the gate conductor 555 are wire bonded, both ends of the wire have heights from the heat dissipation fins 522 and 562 that differ from each other only by the thickness of the IGBT chip 538 (since the signal conductor 554 and the gate conductor 555 are formed as protrusions), so that operations of wire bonding are easier so that bonding errors are difficult to occur. This results in improvement of the productivity and reliability upon production of semiconductor modules. As described above with reference to FIGS. 23, 25, and 26, most parts of the formation of the inverter circuit is finished by the operations on the side of the heat dissipation fin (side A) 522, so that the workability is good and the productivity is improved. The working of the heat dissipation fin (side B) 562 is to set a connecting body that connects each component (IGBT chip, diode chip, etc.) constituting the inverter circuit arranged on the heat dissipation fin (side A) 522 as shown in FIG. 24. Therefore, most production works can be performed on only one of the sides of the heat dissipation fin (side A) 522. Naturally, this also increases the productivity.

As shown in FIG. 23, the collector surfaces of both the upper arm IGBT chip 538 and the lower arm IGBT chip 547 are soldered onto the conducting member on the side of the heat dissipation fin (side A) 522, so that they are excellent in workability (the upper chip and the lower chip having a common soldering surface). The same will true in the case of soldering the diode chips 542 and 550.

As shown in FIG. 44, the heat dissipation fin (side A) having mounted thereon various chips and the heat dissipation fin (side B) are placed so as to face each other (see FIG. 22) and they are soldered to obtain a semiconductor module body of an integrated structure. In the obtained semiconductor module body, there are fitted the bottom case 516, both the side cases 508, and the top case 512 (not shown in FIG. 44) and fixed with an adhesive to construct the semiconductor module 500 (see FIG. 20).

Specifically, the bottom case 516 is formed of a depression 517 that fits with the attaching surface of the fin parts of the heat dissipation fins 522 and 562, respectively. The depression 517 is coated with the adhesive at portions near corners thereof. The fin parts attaching surface of the heat dissipation fin are fitted in the depression 517 and allows it to be fixed with the coated adhesive. On this occasion, there is a tendency that a gap G between the heat dissipation fin 522 and the heat dissipation fin 562 increases due to thermal expansion caused by heat generated by the semiconductor module 500. The depression 517 of the bottom case 516 exhibits a function to prevent the expansion from occurring. This preventive function prevents failure in the action of the semiconductor module due to elongation between the side A 522 and the side B 562 of the heat dissipation fin.

The side cases 508 are provided with protrusions that are fitted in the space or clearance G between the integrated heat dissipation fins 522 and 562. On upright base corners of the protrusions is coated an adhesive. Thus, the clearance between the heat dissipation fins 522 and 562 by the protrusion is maintained by use of the adhesive (maintenance of clearance over the entire height of the heat dissipation fin as shown in FIG. 20). As shown in FIG. 20, the top case 512 is formed of a hole 513 similarly to the bottom case 516 (see FIG. 20). As shown in FIG. 21, the hole 513 serves to prevent expansion of the gap G due to heat from the heat dissipation fins 522 and 562. The distance of the hole 513 of the top case 512 is substantially equal to the width of the fin part attaching surface, so that the hole 513 fits with the fin part attaching. The fitting through the hole 513 provides a preventive function similarly to the depression 517 of the bottom case 516.

As mentioned above, the construction in which the thermal expansion of the clearance G between the heat dissipation fins 522 and 562 is prevented by the bottom case 516 and the top case 512 includes a female structure of the cases 516 and 512 and a male structure of the side cases 508. The material of the bottom case 516, the top case 512, and the side cases 508 may be a plastic having chemical resistance (to cope with coolant) and heat resistance, for example, PPS or PBT.

The reduction in inductance of the semiconductor module according to the present embodiment is described with reference to FIGS. 34 and 35. A transient voltage increase or generation of a large amount of heat in the semiconductor chip occurs at the time of switching action of the upper and the lower arms that constitute the inverter circuit, so that it is desirable that the inductance particularly at the time of switching action is decreased. Since recovery current of the diode is generated upon transient time and hence based on the recovery current, the effect of decreasing inductance is described based on the recovery current taking as an example the recovery current of the diode 66 of the lower arm.

The recovery current of the diode 66 means current that flows in the diode 66 in spite of reverse bias. This is generally said to be caused by carriers filled in the diode 66 in a forward state of the diode 66. When conducting action or blocking action of the upper arm or the lower arm that constitutes the inverter circuit in a predetermined order, three-phase alternate current is generated in the alternate current terminal of the inerter circuit. More particularly, when the semiconductor chip 52 acting as the upper arm is switched from a conducting state to a blocking state, return current flows through the diode 66 of the lower arm in a direction in which the current of the stator coil of the motor generator 92 is maintained. The return current is a forward current of the diode 66 and the inside of the diode is filled with carriers. When the semiconductor chip 52 acting as the upper arm is switched from a blocking state to a conducting state, the recovery current due to carriers as mentioned above flows in the diode 66 of the lower arm. In stationary actions, one or the other of the upper and the lower arms of the upper and lower arms series circuit is in a blocking state, so that no short-circuit current flows through the upper and the lower arms. However, current in a transient state, for example, recovery current flows through the series circuit constituted by the upper and the lower arms.

In the configuration shown in FIGS. 34 and 35, when the IGBT acting as the upper arm of the upper and lower arms series circuit (switching semiconductor element) 52 is changed from OFF to ON, recovery current of the diode 66 flows from the positive electrode terminal 532 (57) to the positive electrode terminal 572 (58) through the IGBT 52 and the diode 66 (as indicated by arrows in FIG. 34). At this moment, the IGBT 62 is in a blocking state. The recovery current flows as follows. As shown in FIG. 34, the conducting members are arranged in parallel near the positive electrode terminal 532 and the positive electrode terminal 572, and the same current flows in the conducting members in reverse directions. Then, magnetic fields generated by the respective currents cancel each other in the space between the conductors, resulting in a decrease in inductance of the current path.

That is, the arrangement of the conductors and terminals in a laminate state such that the conductor 534 and the terminal 532 on the positive electrode side and the conductor 574 and the terminal 572 on the negative electrode side are arranged close to and facing each other provides the effect of reducing inductance. FIG. 35 shows an equivalent circuit of the device of FIG. 34. An equivalent circuit 712 of the conductor 534 and the terminal 532 on the positive electrode side and an equivalent circuit 714 of the conductor 574 and the terminal 572 interact with each other so as to cancel their magnetic fluxes to decrease inductance.

As shown in FIG. 34, the path of the recovery current includes a path in which the currents flow in reverse directions in parallel and subsequently a path in the form of a loop. When current flows through the loop-shaped path, eddy currents 605 and 606 flow in the heat dissipation fin (side A) and the heat dissipation fin (side B). Due to the effect of canceling magnetic fluxes by the eddy currents, the effect of decreasing inductance in the loop-shaped path can be obtained. In the equivalent circuit shown in FIG. 35, the phenomenon in which eddy current is generated is equivalently expressed by inductances 722, 724, and 726. These inductances are arranged close to metal plates that serve as heat dissipation fins, so that the eddy current generated by induction and the generated magnetic flux are in a relationship that they cancel each other. As a result the inductance of the semiconductor module is decreased by the effect of eddy current.

As described above, by the arrangement of the circuitry of the semiconductor module according to the present embodiment, more particularly the effect of the laminate arrangement and the effect of eddy current, inductances can be decreased. It is important to decrease the inductance at the time of the switching action. In the semiconductor module of the present embodiment, the upper and lower arms series circuit is housed in the semiconductor module. This provides a significant effect of decreasing inductance in a transient state. For example, it is possible to decrease inductance for the recovery current of the diode that flows through the upper and lower arm series circuit.

If the inductance is decreased, an induced voltage generated in the semiconductor is lowered, so that a circuitry having a low loss can be obtained. In addition, lower induction results in an improved switching speed. As detailed later on with reference to FIG. 31, when attempts are made to increase capacity of the inverter device by arranging a plurality of the semiconductor modules 500 each including the above-mentioned upper and lower arms series circuit 50 in parallel and connecting them to the capacitors 90 in the capacitor modules 95, respectively, a decrease in inductance of each semiconductor module 500 decreases influence of fluctuation of inductance by the semiconductor modules in the power conversion device 100, so that the action of the inverter device becomes more stable.

Figure 31:
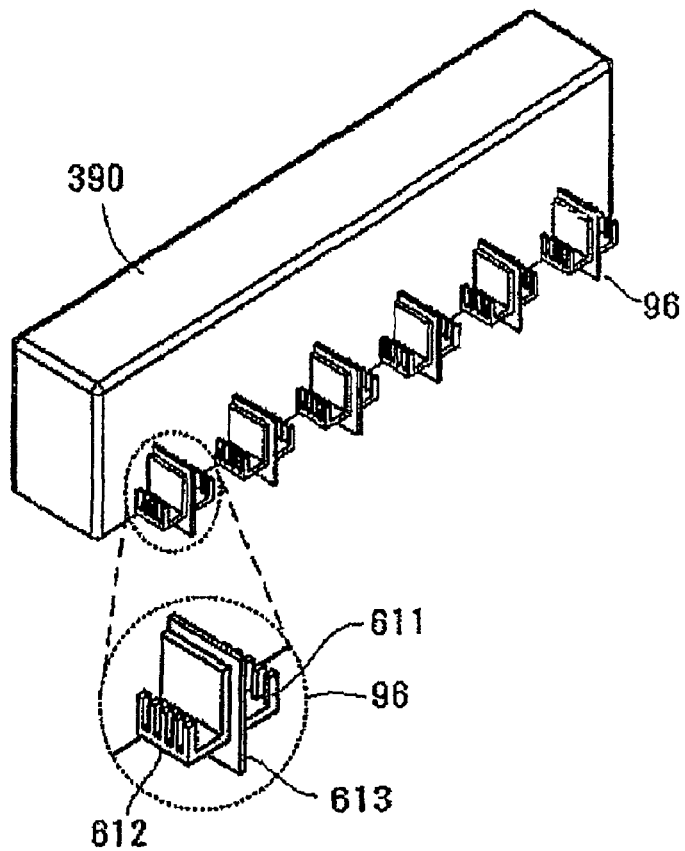
FIG. 31 is a diagram showing the connection terminal of the capacitor module of the power conversion device according to an embodiment of the present invention.

When it is desired to provide a high capacity (for example, 400 A or more) motor generator, it is necessary to provide a high capacity capacitor 90. As shown in FIG. 31, when a plurality of capacitors 90 is arranged in parallel and the capacitor terminals 96 are arranged in parallel as shown in FIG. 31, the positive electrode terminal 532 and the negative electrode terminal 572 of each semiconductor module is connected to each capacitor terminal 96 at an equal distance. This makes current that flows in each semiconductor module distribute uniformly, so that the motor generator can operate in good balance at a low loss. By arranging the positive electrode terminal and the negative electrode terminal in parallel, inductance is decreased due to the laminate effect and it is possible to operate the motor generator at a low loss.

A configuration example of the power conversion device according to the present embodiment is described specifically with reference to the attached drawings. FIG. 18 is a diagram showing an appearance of the semiconductor module with heat dissipation fins having incorporated therein the upper and lower arms series circuit in the power conversion device according to an embodiment of the present invention. FIG. 19 is a cross-sectional view of the semiconductor module shown in FIG. 18. FIG. 20 is an exploded view of the semiconductor module including the case, showing respective terminals of the upper and lower arms series circuit, the heat dissipation fins, and the cases. FIG. 21 is a cross-sectional view of the semiconductor module shown in FIG. 20 as seen in the direction of arrows, illustrating a situation in which the bottom case 516 and the top case 512 are fixed by bonding to the heat dissipation fins 522 and 562. FIG. 22 is an exploded perspective view illustrating soldering of the IGBT chip and the diode chip as well as the connecting plate provided on the conductors of the heat dissipation fin (side A) to the protrusion of the conducting member of the heat dissipation fin (side B).

FIG. 23 shows specific structure on how to arrange the IGBT chip and the diode chip as well as the connecting plate and the details are as mentioned above. FIG. 24 shows specific arrangement of the protrusion on the conductor of the heat dissipation fin (side B). In a partial enlarged figure S1, the thicknesses of protrusions, D1 and D2, are different as mentioned above. FIG. 25 is a perspective view showing specific arrangement of the protrusions on the conducting member of the heat dissipation fin (side A), with S2 being a partial expanded expression in which D3 indicates the thickness of the protrusion 540, D4 indicates the thickness of the protrusion 536, and D5 indicates the thickness of the protrusion 592. Differences in thickness are to make up differences in thickness among the diode chip, the IGBT chip, and the connecting plate 594 themselves. FIG. 26 is a front view of the semiconductor module of FIG. 25. FIG. 27 illustrates a state in which the conducting member (side A) and the conducting member (side B) are superimposed one on another and a state in which the emitter electrode terminal 661 and the gate electrode terminal 662 are wire bonded to the signal conductor 554 and the gate conductor 555, respectively. FIG. 28 is diagram illustrating vacuum thermocompression bonding of the insulation sheets 524 and 564 to the heat dissipation fins 522 and 562, respectively.

In FIGS. 23 and 27, the emitter electrode 538 of the upper arm 52 is shown to have a rectangular geometry. Above and apart from the rectangular emitter electrode 538, there are provided the signal emitter electrode terminal 661 (corresponding to reference numeral 55 in FIG. 2) and the gate electrode terminal 662 (corresponding to reference numeral 54 in FIG. 2). As mentioned above, the signal emitter electrode terminal 661 is wire bonded to the signal conductor 554 and the gate electrode terminal 662 is wire bonded to the gate conductor 555. In the heat dissipation fin (side B) 562, the conductor 584 for alternate current in the form of depression is formed so as to cover the rectangular emitter electrode 538 and through a hollow portion of the depression the signal emitter electrode terminal 661 and the gate electrode terminal 662 are exposed. In the configuration example shown in FIGS. 23 and 27, the rectangular emitter electrode 538 provided on the heat dissipation fin (side A) 522 and the depressed conducting member 584 for alternate current are shown.

In an expanded illustration surrounded by broken line in FIG. 27, the emitter electrode 538 and the conducting member for alternate current has improved configuration of the emitter electrode of the IGBT chip in respect of current capacity and heat dissipation. The improvement attributable to this change in shape is detailed with reference to FIG. 41. In an ordinary IGBT, the shape of the emitter electrode is substantially tetragonal as shown in FIG. 23 and in outer areas of the tetragon, there are provided signal emitter electrode terminal 661, the gate electrode terminal 662, and as necessary other electrodes. On this occasion, the emitter electrode that is substantially tetragonal as shown in FIG. 24 is electrically connected to the conductor 574 or conductor 584.

Figure 41:
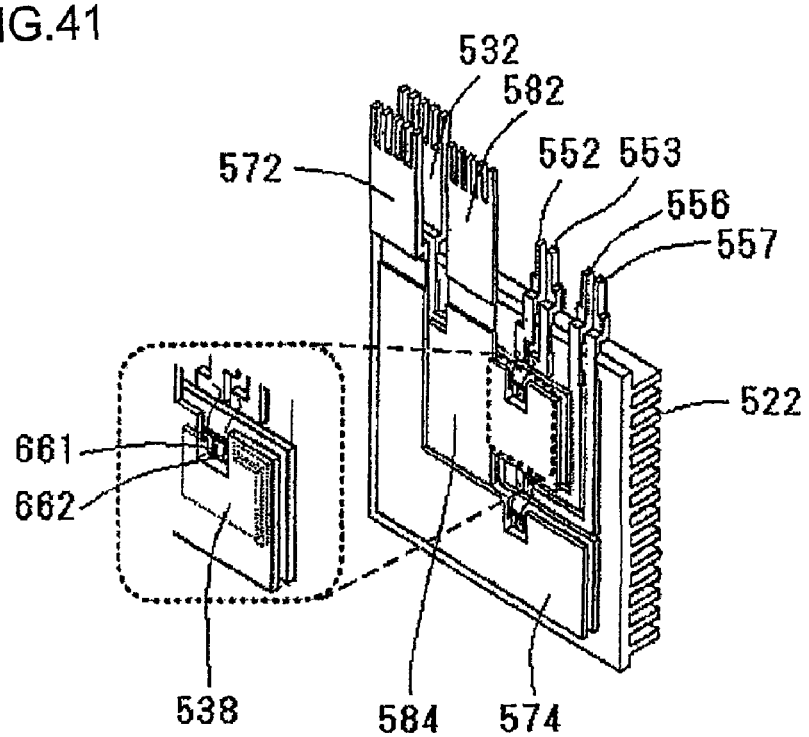
FIG. 41 is a diagram showing a configuration example in which the area of the emitter electrode of IGBT chip in the semiconductor module is expanded.

In FIGS. 27 and 41, the ratio of area of the emitter electrode 538 in the IGBT chip 52 is increased. That is, in place of the rectangular shape shown in FIG. 23, the region of emitter electrode is made concave so that only the signal emitter electrode 661 and the gate electrode 662 are exposed, and the signal emitter electrode terminal 661, the gate electrode terminal 662, and optional other electrodes are provided in the concave region. Each of the conductors 584 and 547 is also provided with a concave portion so that the expanded emitter electrode having the concave portion is electrically connected to the conducting member 584 for alternate current and the conductor 574 so as to have an expanded connection area for connection with the emitter electrode. This expansion of area in the emitter electrode results in a decrease in current density in the emitter of the IGBT chip 52 and an increase in heat dissipation area. By providing the conducting member 584 for alternate current and the conductor 574 with a concave portion such that the concave portion faces a concave outer edge of the emitter electrode 538 having an increased area, the areas of the conducting members 584 and 574 are increased to improve heat diffusion (the conducting members 584 and 574 shown in FIG. 24 do not have hollow portions that conform to the shape of the emitter electrode in contrast to the counterparts shown in FIGS. 27 and 41 having such hollow portions).

Figure 32:
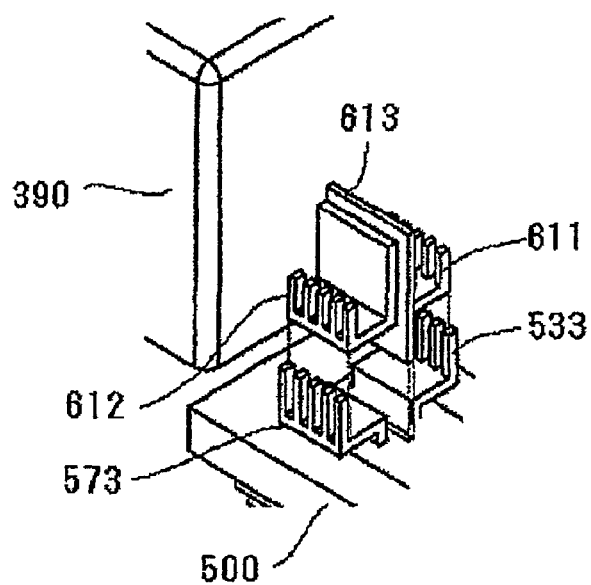
FIG. 32 is a perspective view illustrating connection of the semiconductor module and the capacitor module according to an embodiment of the present invention.
Figure 33:
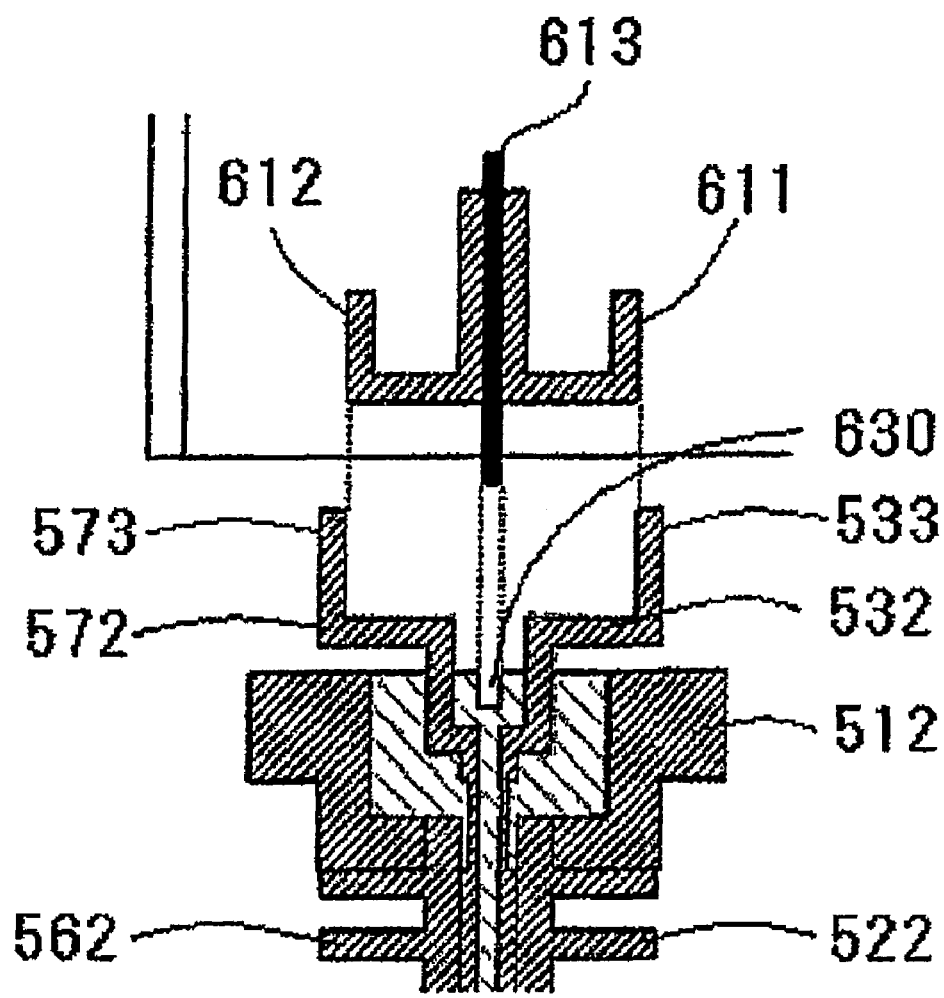
FIG. 33 is a cross-sectional view illustrating connection of the semiconductor module and the capacitor module according to an embodiment of the present invention.

Connection between the semiconductor module and the capacitor module according to the present embodiment is described with reference to FIGS. 31, 32, and 33. The capacitor module may be constituted by a single electrolytic capacitor or a film capacitor. However, it is desirable to obtain larger capacity with a smaller volume. In this respect, it is more preferred to constitute the capacitor module by electrically connecting a plurality of electrolytic capacitors or film capacitors in parallel. Alternatively, by connecting a plurality of unit capacitors in parallel and covering an outer side thereof with a metal that has excellent heat dissipation property, a small, highly reliable capacitor module can be obtained. The electrolytic capacitor generates a larger amount of heat than the film capacitor, so that the electrolytic capacitor is much more effective.

By covering the outer side of the connected unit capacitors with, the unit capacitors in the capacitor module can be more firmly fixed in the power conversion device, so that the power conversion device becomes more resistant to vibrations. For example, vibrations of automobiles include components of various frequencies and there is a possibility that the unit capacitors in the capacitor module are resonated. One or more unit capacitors are firmly fixed in the capacitor module and the capacitor module is firmly fixed in the power conversion device as detailed hereinbelow. For example, the capacitor module is firmly fixed to the channel case.

FIG. 31 is a diagram showing the connection terminal of the capacitor module of the power conversion device according to the present embodiment. FIG. 32 is a perspective view illustrating the state of connection of the semiconductor module and the capacitor module according to the present embodiment. FIG. 33 is a cross-sectional view illustrating the state of connection. In the figures, 390 designates a capacitor module, 96 designates a capacitor terminal, 611 designates a capacitor positive electrode terminal, 612 designates a capacitor negative electrode terminal, 613 designates an insulation guide, 533 designates a comb of the positive electrode terminal of the semiconductor module, 573 designates a comb of the negative electrode terminal of the semiconductor module, and 630 designates an insertion opening of the semiconductor module.

The capacitor module 390 shown in the figures is provided with capacitor terminals 96 for U, V, and W phases, respectively, of the motor. In the capacitor module, capacitors 90 are provided corresponding to the terminals 96.

The positive electrode terminal 611 and the negative electrode terminal 612 of the capacitor terminals 96 are comb-shaped as shown in the figures similarly to the comb shapes 533 and 573 of the positive electrode terminal 532 and the positive electrode terminal 572 in the semiconductor module 390. The comb-like shapes of the connecting terminals of the capacitor module 390 and of the semiconductor module facilitate welding or other fixation connection between their connecting terminals. The terminals of the capacitor module 390 are each provided with an insulation guide 613 in the center thereof. The insulation guide 613 insulates the positive electrode terminal 611 from the negative electrode terminal 612. In addition, the insulation guide 613, which is inserted into the insertion opening 630 of the semiconductor module, serves as a connection guide that guides the connecting terminals of the capacitor module and the semiconductor module.

In the present embodiment, the direct current terminal of the capacitor module 390 is provided corresponding to each terminal on the direct current side of the semiconductor module 500, so that the inductance between the terminal of the capacitor module and the terminal of the semiconductor terminal can be decreased. It is preferred to directly connect the terminal of the capacitor module to the terminal of the semiconductor module as in the present embodiment from the viewpoint of decreasing inductance. However, it is conceivable that the capacitor module and the semiconductor module cannot be arranged close to each other. As shown in FIGS. 2 and 3, the capacitor and each of the upper and the lower arms of the upper and lower arms series circuit are in a relationship of parallel connection. Accordingly, it would also acceptable to configure the power conversion device, for example, as follows. A direct current busbar in which the direct current positive electrode conductor and the direct current negative electrode conductor are arranged so as to face each other is used. One end of the direct current busbar is connected to the positive electrode terminal 611 and the negative electrode terminal 612 of the capacitor module and the other end of the direct current busbar is connected to the positive electrode terminal 532 and the negative electrode end terminal 572. The direct current positive electrode conductor and the direct current negative electrode conductor that constitutes the direct current busbar are arranged opposingly as close as possible to each other such that magnetic fluxes generated by the respective conductors cancel each other. With this arrangement, an increase in inductance can be prevented.

When each phase of the inverter circuit is constituted by parallel connection of a plurality of the upper and lower arms series circuits as shown in FIG. 3, it is desirable that the plurality of the upper and lower arms series circuits that constitutes each phase is placed under the same conditions if the above-mentioned direct current busbar is used. Therefore, it is desirable that the terminal of the semiconductor module that constitutes each phase is provided with a connecting terminal on the semiconductor module side of the direct current busbar. It is also desirable that their shape is like that of the terminal 96 shown in FIG. 31.

Figure 29:
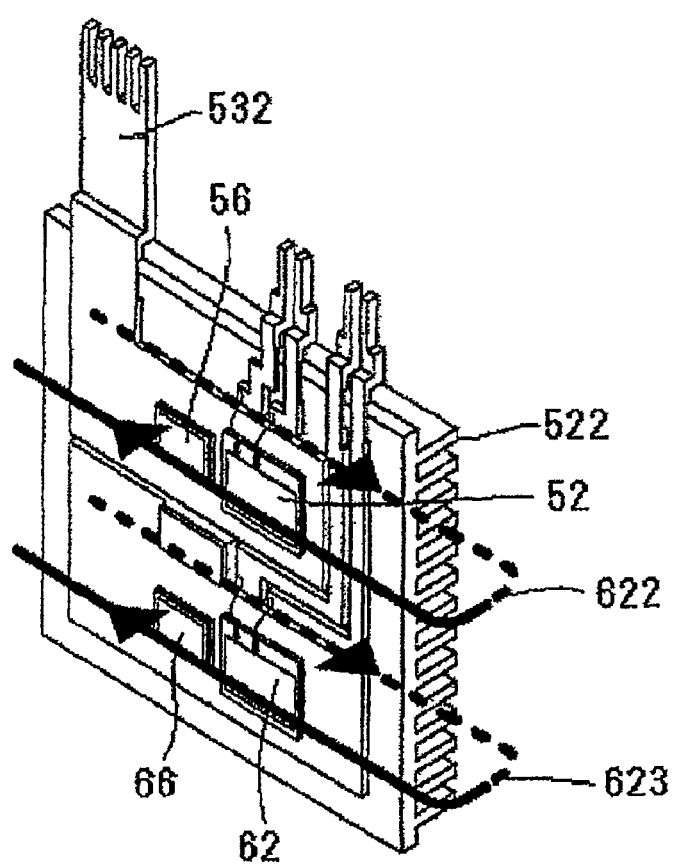
FIG. 29 is a diagram illustrating the flow of cooling water in the heat dissipation fins (side A) in the semiconductor module according to an embodiment of the present invention.
Figure 30:
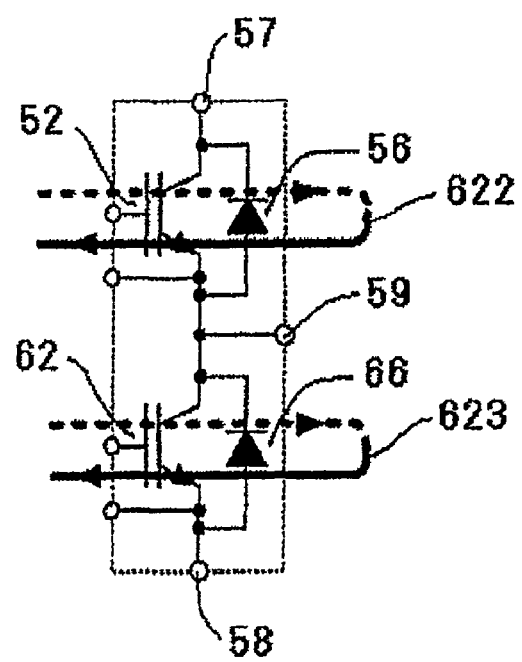
FIG. 30 is a diagram illustrating the relationship between the flow of cooling water and the arrangement of the circuitry in the semiconductor module.

Cooling of the semiconductor module according to the present embodiment is described with reference to FIGS. 29 and 30. FIG. 29 is a diagram illustrating the flow of cooling water in the heat dissipation fins (side A) in the semiconductor module according to an embodiment of the present invention. FIG. 30 is a diagram illustrating the relationship between the flow of cooling water and the arrangement of the circuitry in the semiconductor module. In FIGS. 29 and 31, 622 designates the flow of cooling water in the upper stage of the semiconductor module and 623 designates the flow of cooling water in the lower stage of the semiconductor module.

In the semiconductor module according to the present embodiment, the IGBT chip 52 of the upper arm and the diode chip 56, which are heat generating bodies, are arranged on the same level in the upper stage. Also, the IGBT chip 62 of the upper arm and the diode chip 66, which are heat generating bodies, are arranged on the same level in the lower stage. The upper stage corresponds to the front side in the direction in which the semiconductor module 500 is inserted there while the lower stage corresponds to the rear side in the direction in which the semiconductor module 500 is inserted there.

The semiconductor module 500 has various functions. It maintains the cooling water to be in a state of laminar flow and directs the cooling water in a predetermined direction as well as it exchanges heat with the cooling water. In the present embodiment, ordinarily, the cooling water flows horizontally along the depressions (grooves) of the heat dissipation fin having a concavo-convex shape. Then, the cooling water flowing into the upper stage 622 absorbs heat generated by the diode chip 56 and the IGBT chip 52 as shown by a broken line and flows a return path that passes along the fin depression in the heat dissipation fn (side B). Similarly, the cooling water 623 flowing into the lower stage absorbs heat generated by the IGBT chip 62 and the diode chip 66 without being influenced by the heat generated by the semiconductor chips 52 and 56. By adopting the configuration of the semiconductor module in which the semiconductor chips constituted by the IGBT chip and the diode chip, which are heat generating bodies, are arranged in different levels, one in the upper stage and the other in the lower stage, the effect of cooling is increased.

Figure 16:
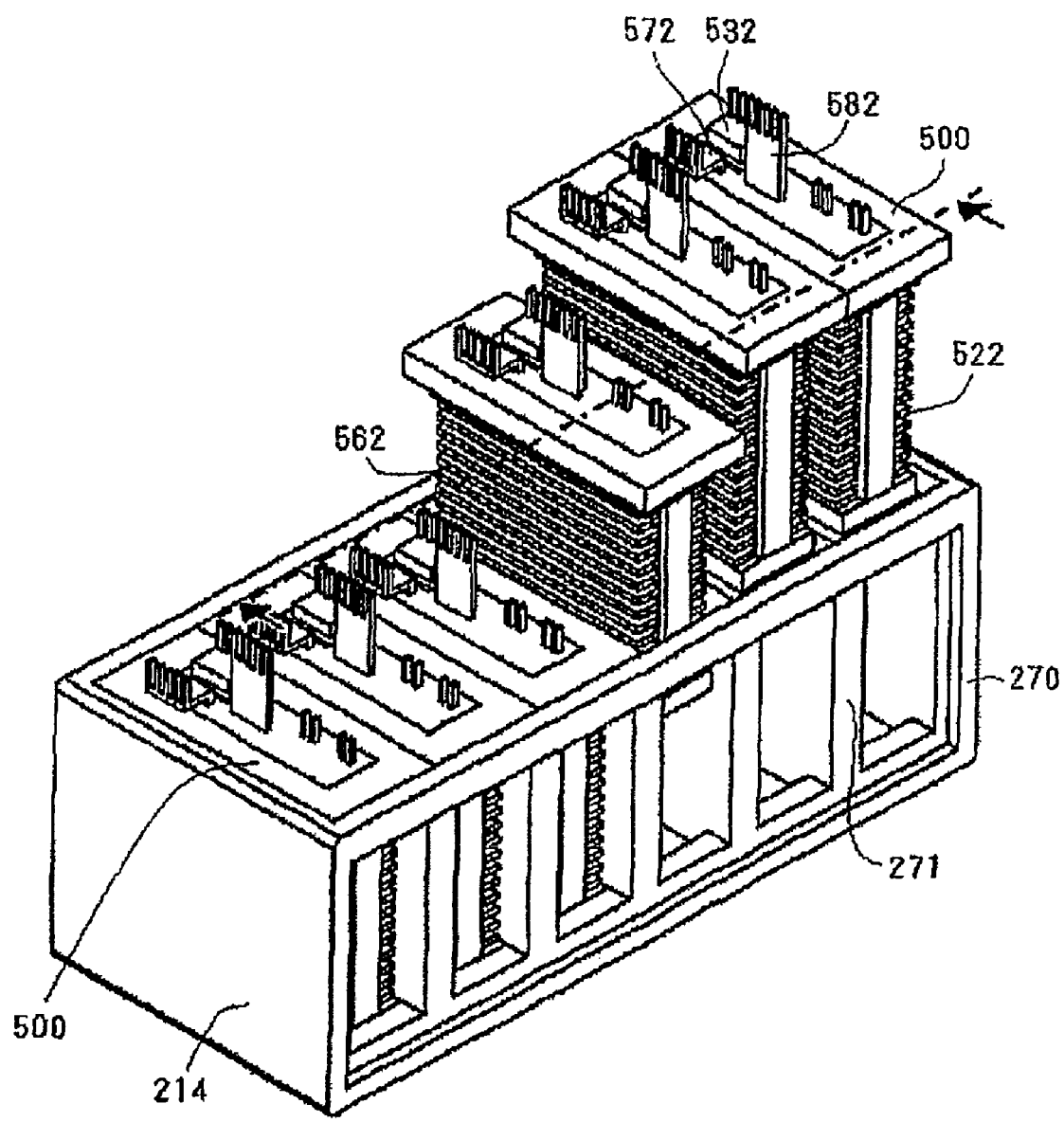
FIG. 16 is a perspective view illustrating a manner in which the channel case is loaded with the semiconductor modules.
Figure 17:
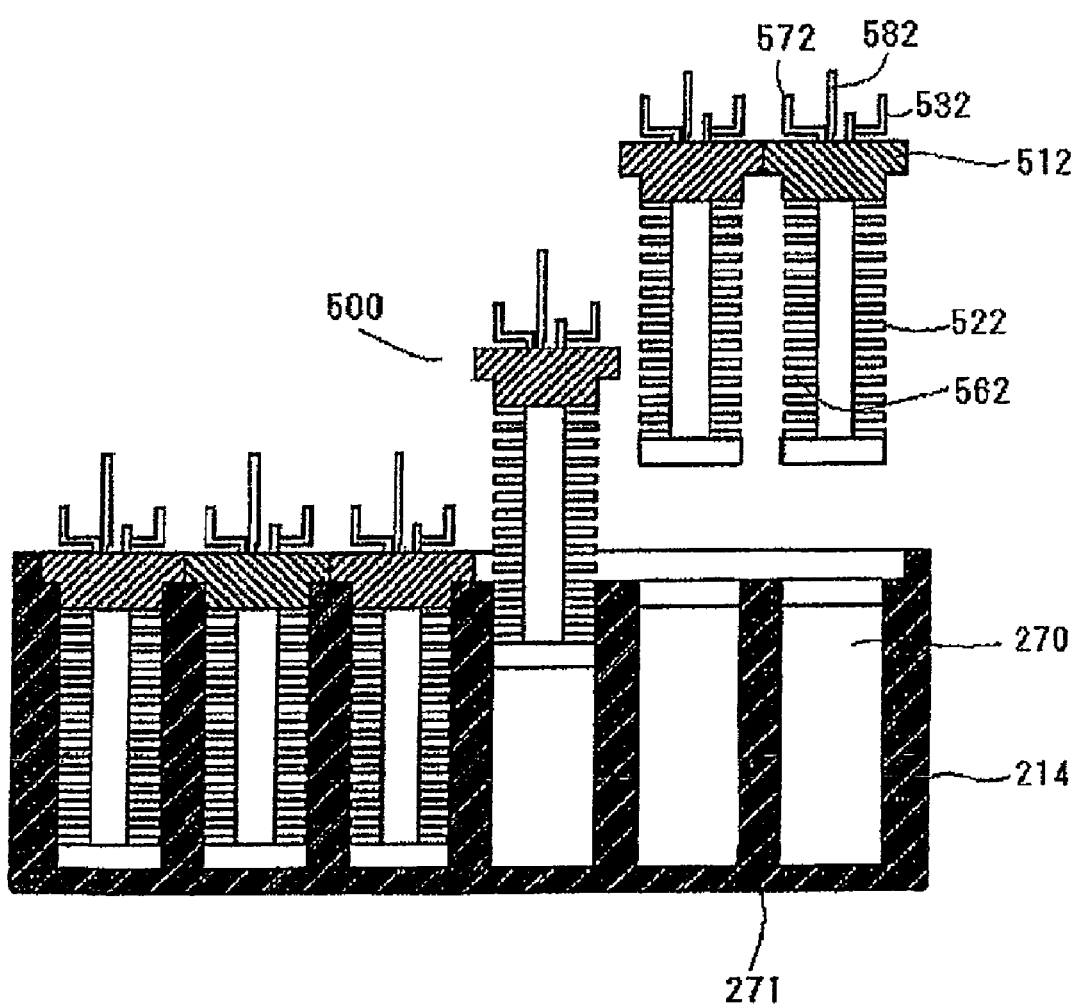
FIG. 17 is a front view illustrating a manner in which the channel case is loaded with the semiconductor modules.

First, the cooling of the semiconductor module according to the present embodiment is outlined. As shown in FIGS. 18 and 19, the semiconductor module 500, in which the upper and lower arms series circuit 50 that includes the semiconductor chips 52, 56, 62, and 66 of the upper and the lower arms, is built-in as sandwiched by the heat dissipation fin (side A) and the heat dissipation fin (side B). The semiconductor module 500 is inserted into the channel case 212 as shown in FIGS. 16 and 17. The semiconductor module 500 is configured so as to be cooled by flowing water along both sides of the heat dissipation member each provide with heat dissipation fins in the semiconductor module. That is, the semiconductor module 500 is of a double-face cooling structure in which the semiconductor chips, which are heat generating bodies, are cooled on both faces, i.e., the heat dissipation fin (side A) 522 and the heat dissipation fin (side B) 562.

In the transition of the method of cooling semiconductor modules, there is a trend that it is being in progress in the order of a single face indirect cooling method, a single face direct cooling method, a double-face indirect cooling method, and a double-face direct cooling method. Many conventional cooling methods adopt the following structure. That is, a plurality of switching semiconductor elements (IGBTs), heat generating bodies, are provided and connected in parallel to each other (in order to diffuse the heat generated and borne by the semiconductor chips). The semiconductor elements connected in parallel are disposed on the heat dissipation member through grease and the insulation layer. The conventional cooling method is a single face cooling method since the heat dissipation member is provided on one side of the semiconductor elements and also is an indirect cooling method since the grease is present between the semiconductor elements and the heat dissipation member. The grease is intended to be used to bond the conducting member (Cu lead having disposed thereon the semiconductor elements) with the insulation layer to the heat dissipation member. The thickness of the grease tends to be uneven, so it is necessary to fasten the conducting member to the heat dissipation member to fix the conducting member. The grease has good heat conducting properties but it has drawbacks in adhesiveness, uniformity in thickness, and heat insulating properties.

According to the present embodiment, the semiconductor module 500 has various improvements as shown in FIGS. 29 and 30, so that it provides improved heat release effect as compared with the conventional methods mentioned above even when the above-mentioned indirect cooling method using grease is adopted and also provides various other effects as mentioned above. As described hereinbelow, the semiconductor chips are fixed to the metal for heat dissipation through the insulation member, so that the heat dissipation effect is further increased. The heat insulation member includes, for example, a ceramic plate and an insulation sheet made of a resin. By fixing the semiconductor chips to the heat dissipation metal through the insulation member, the heat conducing properties are improved and the heat dissipation effect is improved. As compared with the ceramic plate, the insulation sheet to be detailed hereinbelow has a small thickness and provides a greater effect.

The power conversion device according to the present embodiment adopts a double-face direct cooling method such that both faces of the semiconductor module is cooled and an insulating sheet is placed between the heat dissipation member and the conducting member on which the semiconductor chips are mounted without grease and the resultant is vacuum thermocompressed. Thus, the cooling performance is increased. In the present embodiment, as shown in FIGS. 28 and 23, the insulation sheets 524 and 564 for heat dissipation (for example, insulation resin plates of 100 to 350 mm thick) are once vacuum thermocompressed on the heat dissipation fins (heat dissipation members) 522 and 562 made of Cu or Al, and then the obtained insulation sheets are vacuum thermocompressed to the conducting members 534, 455, 574 and 584 (for example, Cu leads) having the positive and the negative electrode terminals 532 and 572, and so on, respectively. Further, the conducting members are attached semiconductor chips by soldering. The semiconductor module is water cooled through the heat dissipation fins on the both sides of the semiconductor module as shown in FIG. 29. Thus, a double-face direct cooling system is obtained. This system is excellent in adhesiveness, uniformity in thickness and insulating properties as compared with grease.

Figure 4:
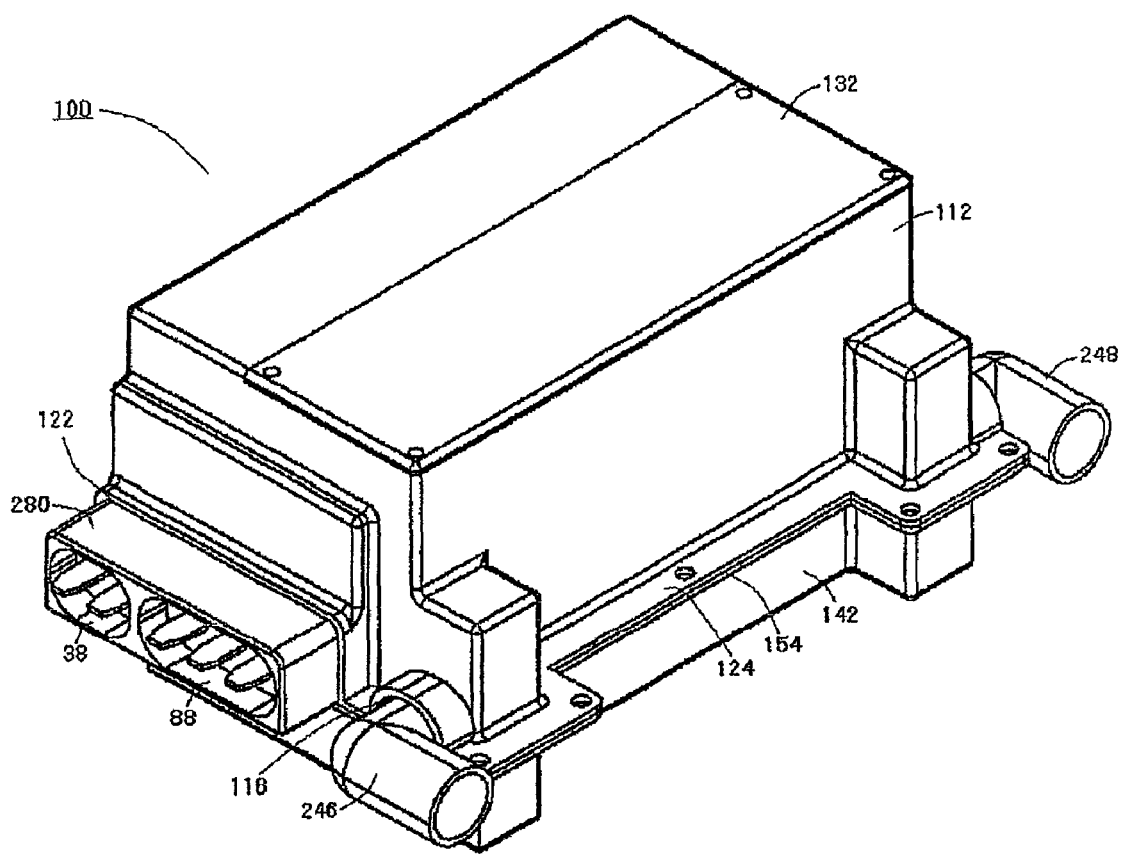
FIG. 4 is a diagram showing an appearance configuration of the power conversion device according to an embodiment of the present invention.
Figure 5:
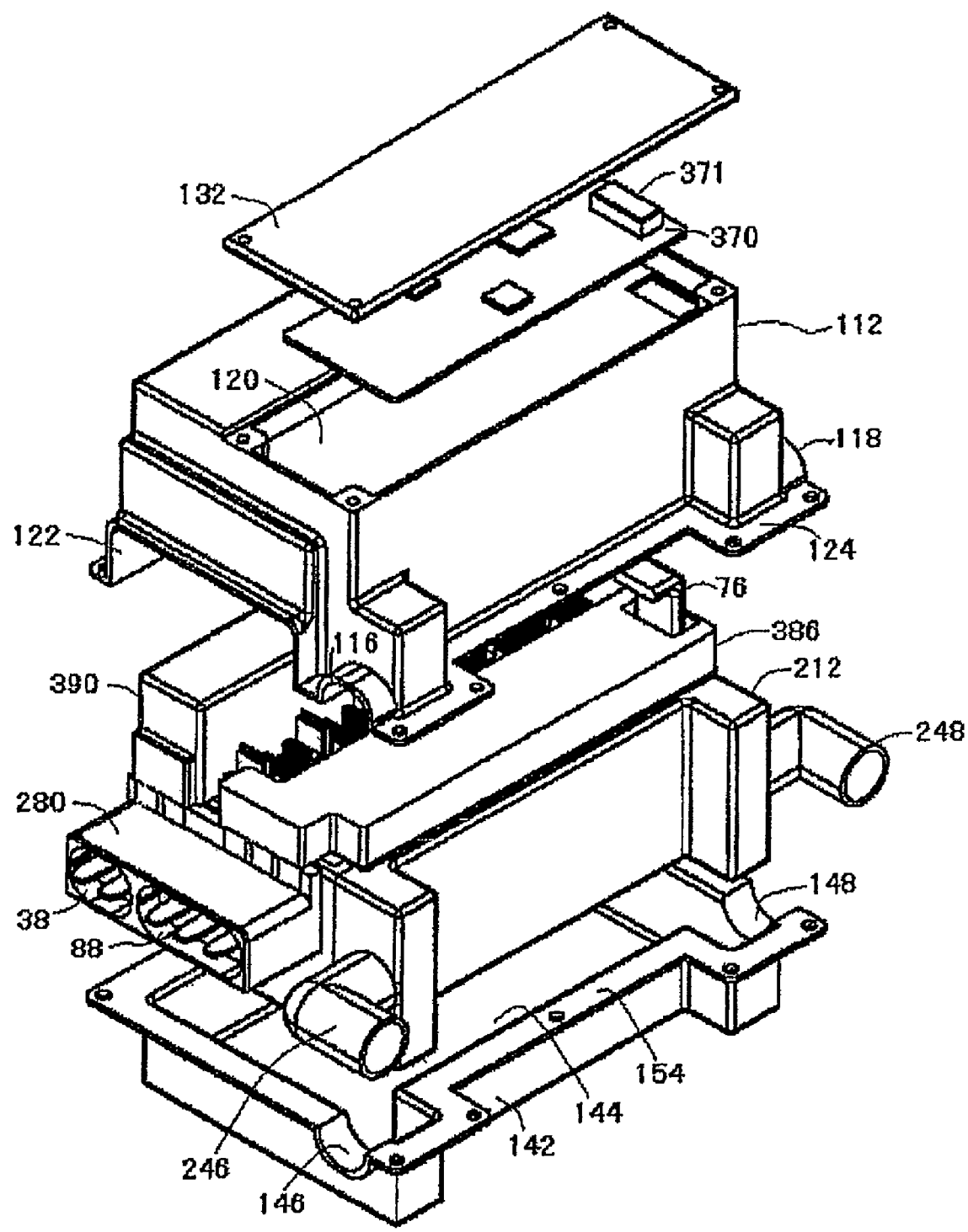
FIG. 5 is an exploded perspective view of an inside structure of the power conversion device according to an embodiment of the present invention.
Figure 6:
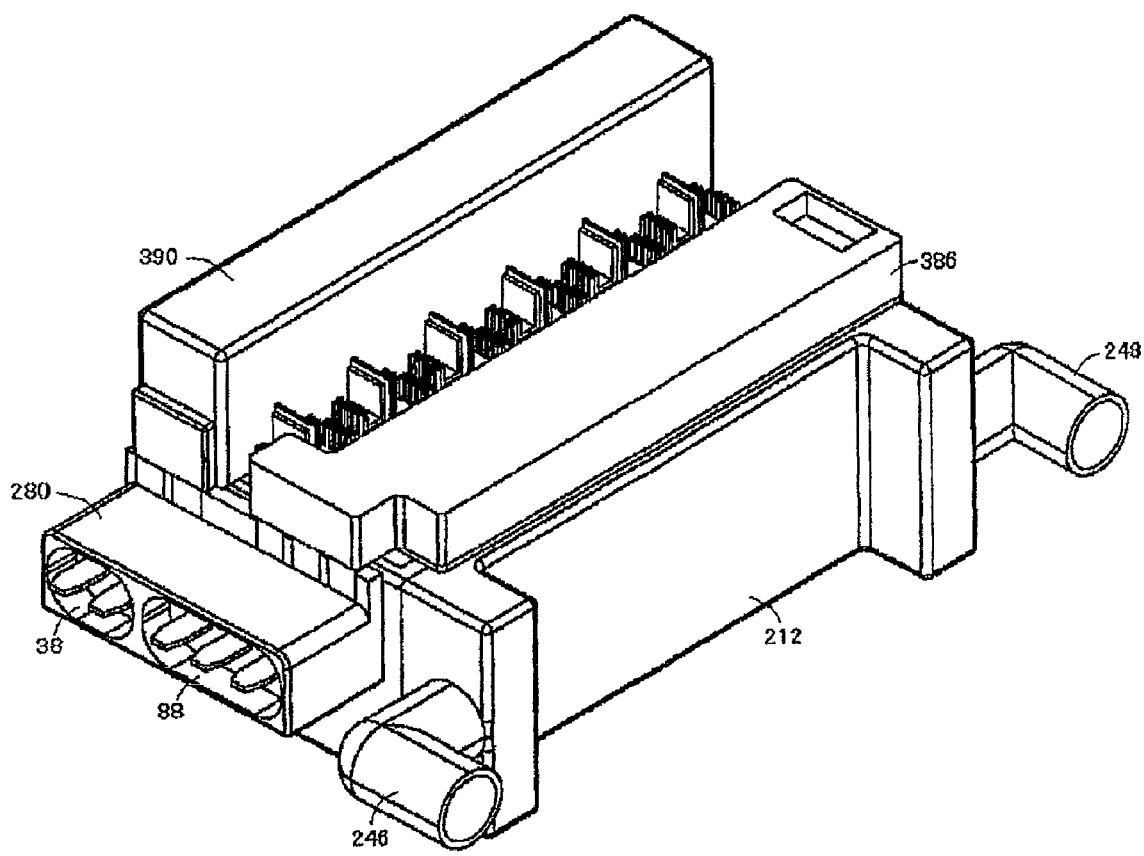
FIG. 6 is a perspective view of the power conversion device according to an embodiment of the present invention from which the upper case has been removed.
Figure 7:
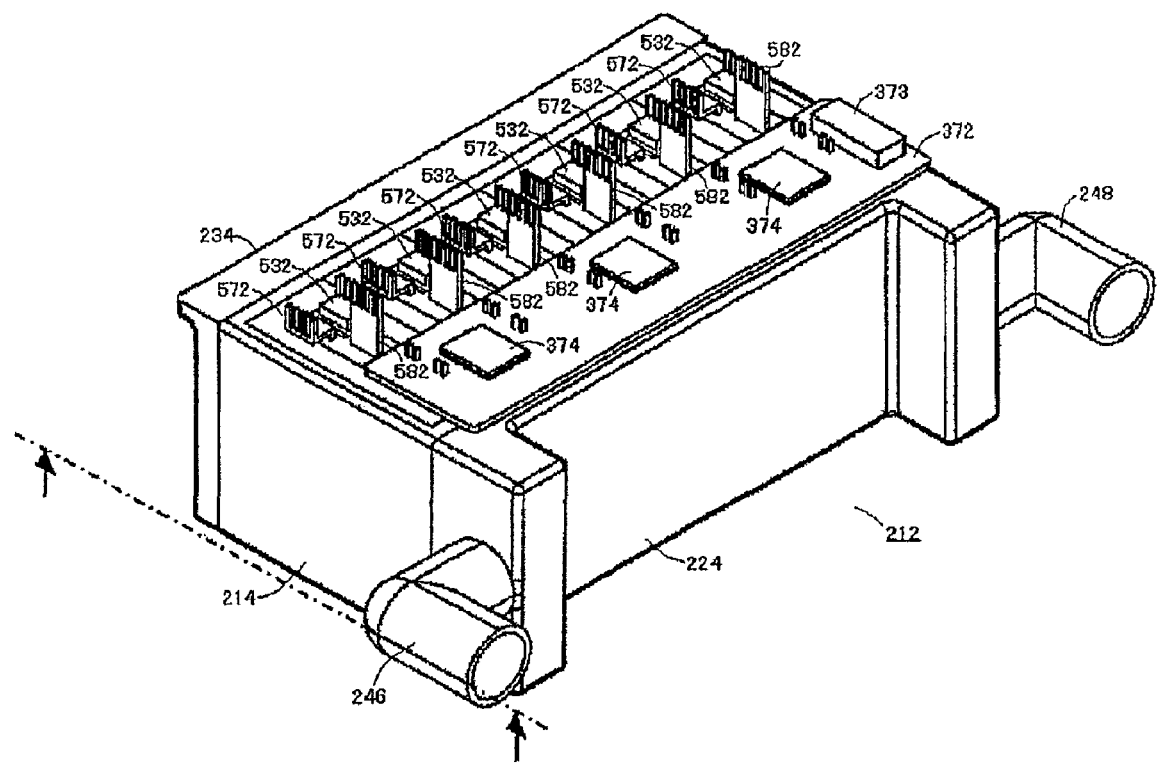
FIG. 7 is a perspective view of the power conversion device according to an embodiment of the present invention from which the upper case, capacitor, and busbar assembly case have been removed.

A specific configuration of the power conversion device with a cooling function according to the present embodiment is described hereinbelow with reference to FIGS. 4 to 7. FIG. 4 is a diagram showing an appearance configuration of the power conversion device according to an embodiment of the present invention. FIG. 5 is an exploded perspective view of an inside structure of the power conversion device according to an embodiment of the present invention. FIG. 6 is a perspective view of the power conversion device according to an embodiment of the present invention from which the upper case has been removed. FIG. 7 is a perspective view of the power conversion device according to an embodiment of the present invention from which the upper case, the control substrate having incorporated therein the control circuit 72, and the busbar assembly have been removed.

In FIGS. 4 to 7, the power conversion device 100 has the following structure. That is, it includes a plurality of the semiconductor modules 500 attached to the channel case 212, the control substrate 372 having incorporated therein the driver circuit 74 and having mounted thereon a driver IC 374, the capacitor module 390 (corresponding to the structure 95 in FIG. 31), the busbar assembly 386, the connector unit 280 that includes the direct current connector 38 and the alternate current connector 88 (see FIG. 2), with these being surrounded by a bottom case 142, an upper case 112 and a cover 132. The busbar assembly 386 includes a direct current bus that connects the direct current terminals of the capacitor module 390 and the semiconductor module 500 to the direct current connector 38 and an alternate current bus that connects the alternate current terminal 582 of the semiconductor module 500 to the alternate current connector 88.

Figure 8:
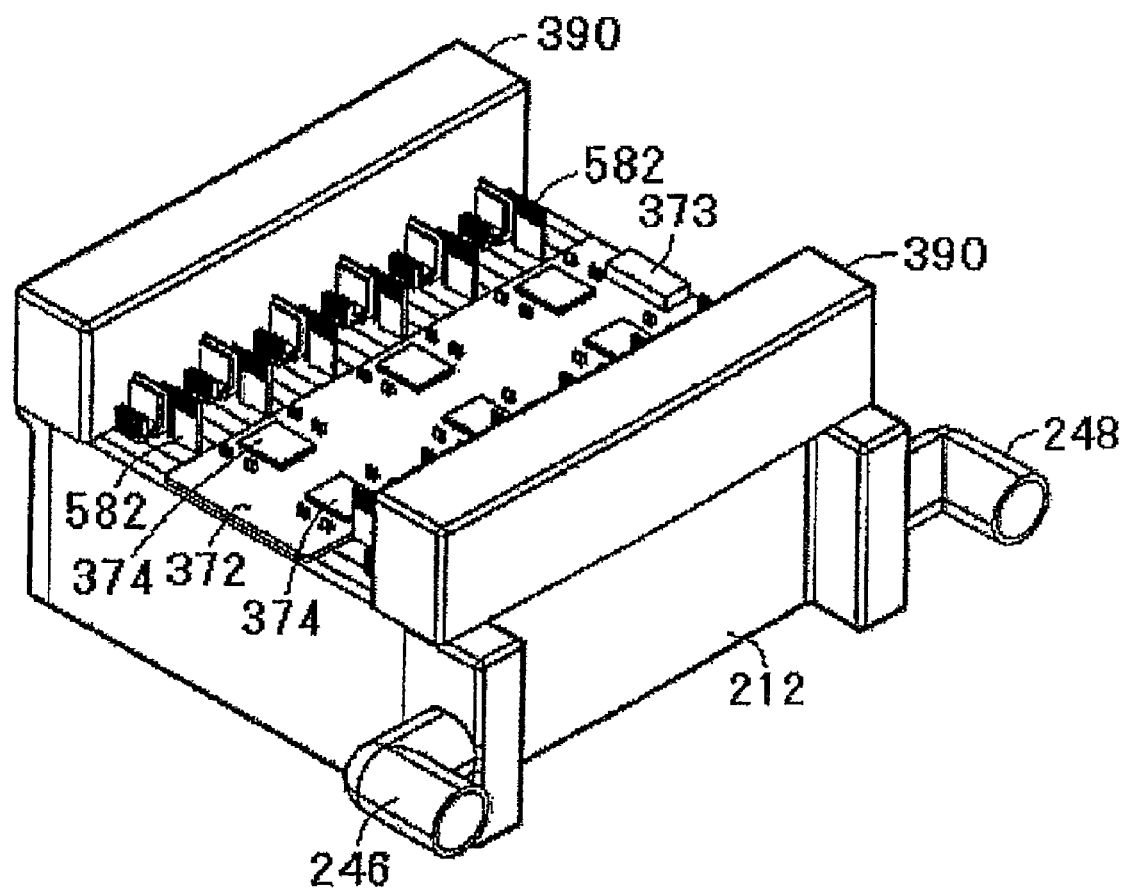
FIG. 8 is a perspective view illustrating an example of two-inverter construction in the power conversion device according to an embodiment of the present invention, with the busbar assembly and the upper case having been removed.

Referring to FIGS. 7 and 8, the channel case 212 is roughly divided into a main body section 214, a front section 224, and a rear section 234, and is provided with an inlet section 246 and an outlet section 248 of the channel. The control substrate 372 has mounted thereon a control circuit connector 373 and the driver IC 374. In the example shown in FIG. 7, the negative electrode terminal 572, the positive electrode terminal 532, and the alternate current terminal 582 of the semiconductor module protrude. The negative electrode terminal 572 and the positive electrode 532 are connected to the capacitor terminals of the capacitor module 390 (see FIGS. 6 and 32). In the configuration example shown in FIG. 7, there are packed six upper and lower arms series circuits 50 (a main circuit of the semiconductor module 50Q, which corresponds to the circuitry of the inverter device 40 shown in FIG. 3. That is, two upper and lower arm series circuits are provided for each of the U, V, and W phases of the motor so that the motor generator 92 having high capacity can be provided.

Figure 9:
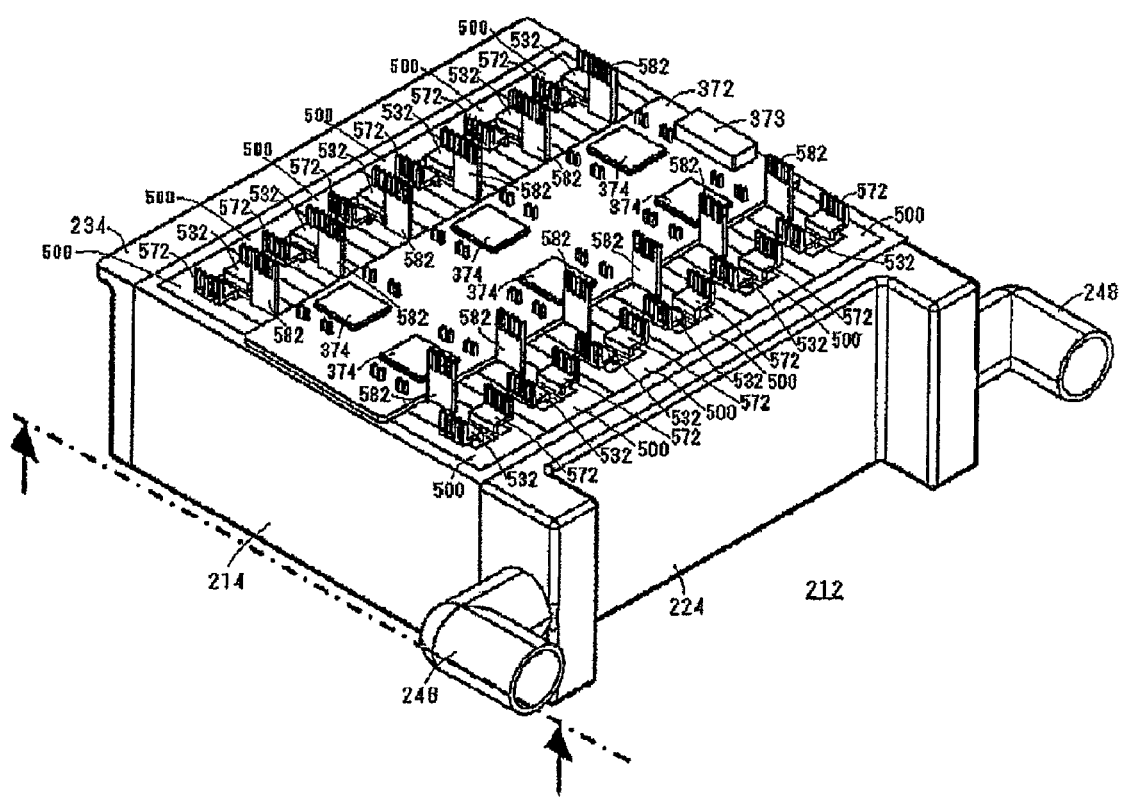
FIG. 9 is a perspective view illustrating an example of two-inverter construction in the power conversion device according to an embodiment of the present invention, with the busbar assembly, the upper case, and the capacitor module having been removed.
Figure 10:
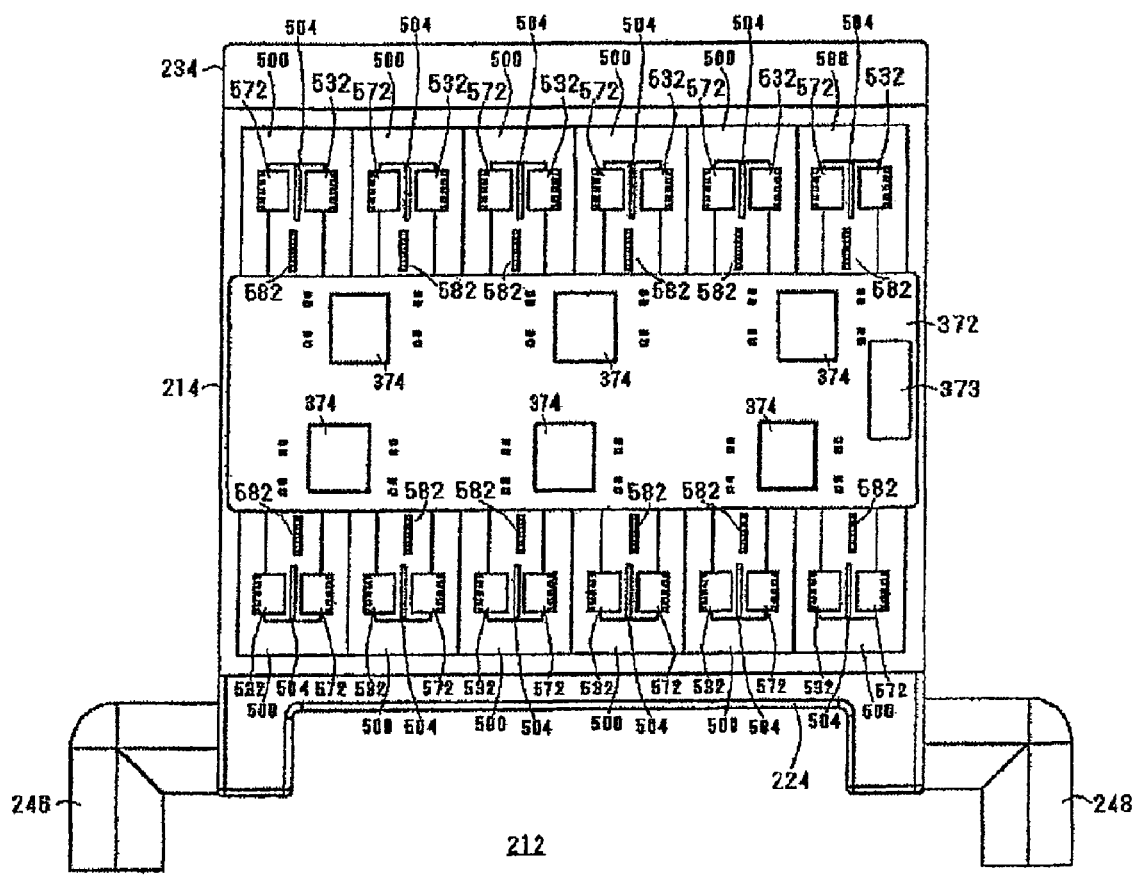
FIG. 10 is a plan view illustrating an example of two-inverter construction in the power conversion device according to an embodiment of the present invention, with the busbar assembly, the upper case, and the capacitor module having been removed.

FIGS. 8, 9, and 10 show a configuration example in which another inverter device 40 shown in FIG. 3 is connected to the battery 36 in parallel and the inverter devices are connected to the respective motor generators. The configuration example shown in FIGS. 8, 9, and 10 is not limited to the power supply to the two motor generators. FIG. 8 is a perspective view illustrating an example of two-inverter construction in the power conversion device according to the present embodiment, with the control substrate 370 having incorporated therein the control circuit 72, the busbar assembly, and the upper case having been removed. FIG. 9 is a perspective view illustrating a configuration example of two-inverter devices in the power conversion device according to the present embodiment, with the control substrate 370 having incorporated therein the control circuit 72, the busbar assembly, the upper case, and the capacitor module having been removed. FIG. 10 is a plan view illustrating an example of two-inverter construction in the power conversion device according to the present embodiment, with the control substrate 370 having incorporated therein the control circuit 72, the busbar assembly, the upper case, and the capacitor module having been removed. In FIG. 8, the busbar assembly 386 is arranged above the control substrate 372 and between the two capacitor modules 390.

Referring to FIGS. 8, 9, and 10, two sets of semiconductor modules 500 are inserted into the channel case 212 in a state in which they are arranged with one of the two sets being arranged in a rotation symmetry at 180 degrees with respect to the other of the two sets. Similarly, the capacitor modules 390 are arranged in a state of rotation symmetry at 180 degrees with respect to each other. The control substrate 372 is arranged between the sets of the semiconductor modules 500 and is constituted by a single substrate. The control circuit connector 373 may be provided as a single common component for the two sets of the semiconductor modules. A single driver IC 374 drives the upper and the lower arms for each phase. Each phase is constituted by two series-connected circuits each being constituted by the upper and the lower arms connected to each other in parallel (see FIG. 3). The single driver IC circuit 374 concurrently supplies a control signal to each of the two upper and lower arms series circuits connected to each other in parallel.

The control substrate having a driver circuit is arranged in a position opposite to the capacitor module with respect to the alternate current terminal. The control terminal of the semiconductor switching element that constitutes the upper and the lower arms is arranged in a position opposite to the capacitor module with respect to the alternate current terminal. With this configuration, the electrical connection of the capacitor module 500 to the semiconductor module and the electrical connection of the control terminal to the substrate 372 having the driver circuit 74 are achieved in an orderly manner. This leads to downsizing of the power conversion device.

In the power conversion device including two inverter devices, it is possible to provide two driver circuits 74 for controlling the two inverter devices in one control substrate 372 by arranging the control substrate 372 having the driver circuit 74 in the center thereof as shown in FIG. 10. This leads to downsizing of the power conversion device and to improvement of productivity.

The manner of loading the semiconductor modules into the channel case in the power conversion device according to the present embodiment and the manner of flow of cooling water in the channel case loaded with the semiconductor modules are described hereinbelow with reference to FIGS. 11 to 17.

Figure 11:
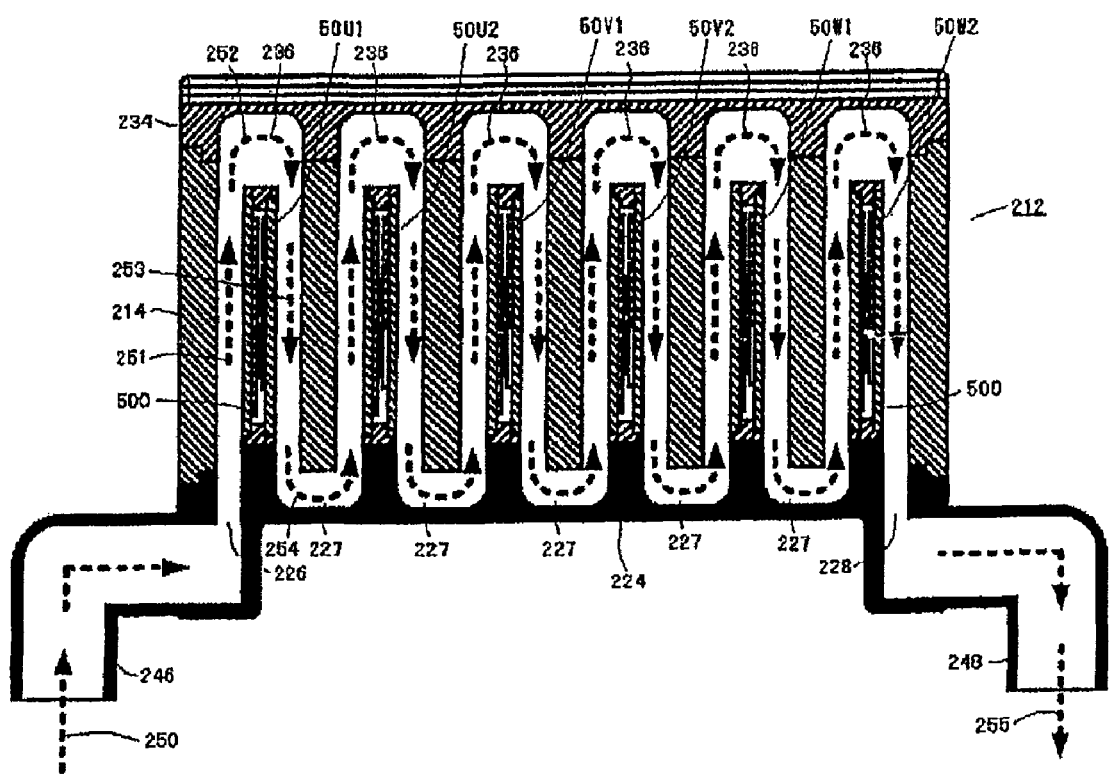
FIG. 11 is a cross-sectional view illustrating flow of cooling water in a channel case loaded with the semiconductor modules according to an embodiment of the present invention.
Figure 12:
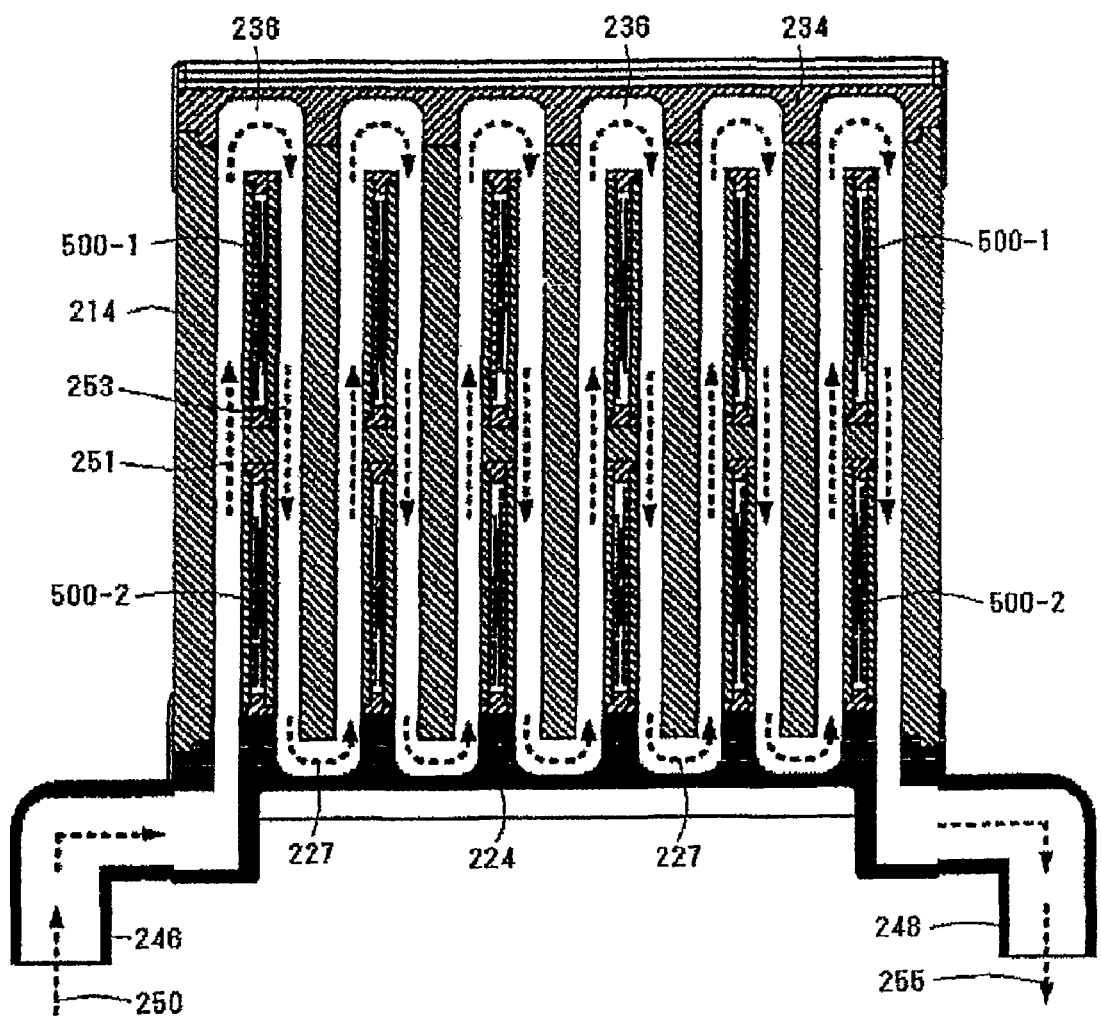
FIG. 12 is a cross-sectional view illustrating flow of cooling water in a channel case loaded with the semiconductor modules in the two-inverter device shown in FIG. 9.
Figure 13:
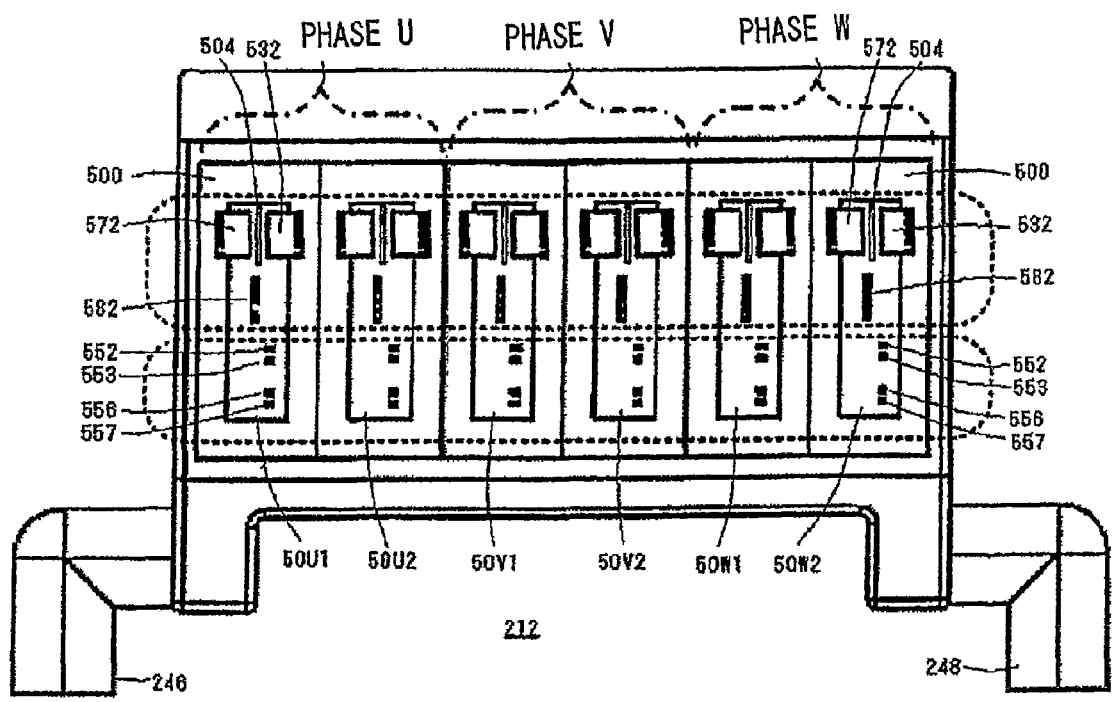
FIG. 13 is a plan view showing arrangements in the channel case of the positive terminal, negative terminal, alternate current terminal, signal terminal, and gate terminal of the semiconductor modules parallel-connected to each phase of the motor shown in FIG. 3.
Figure 14:
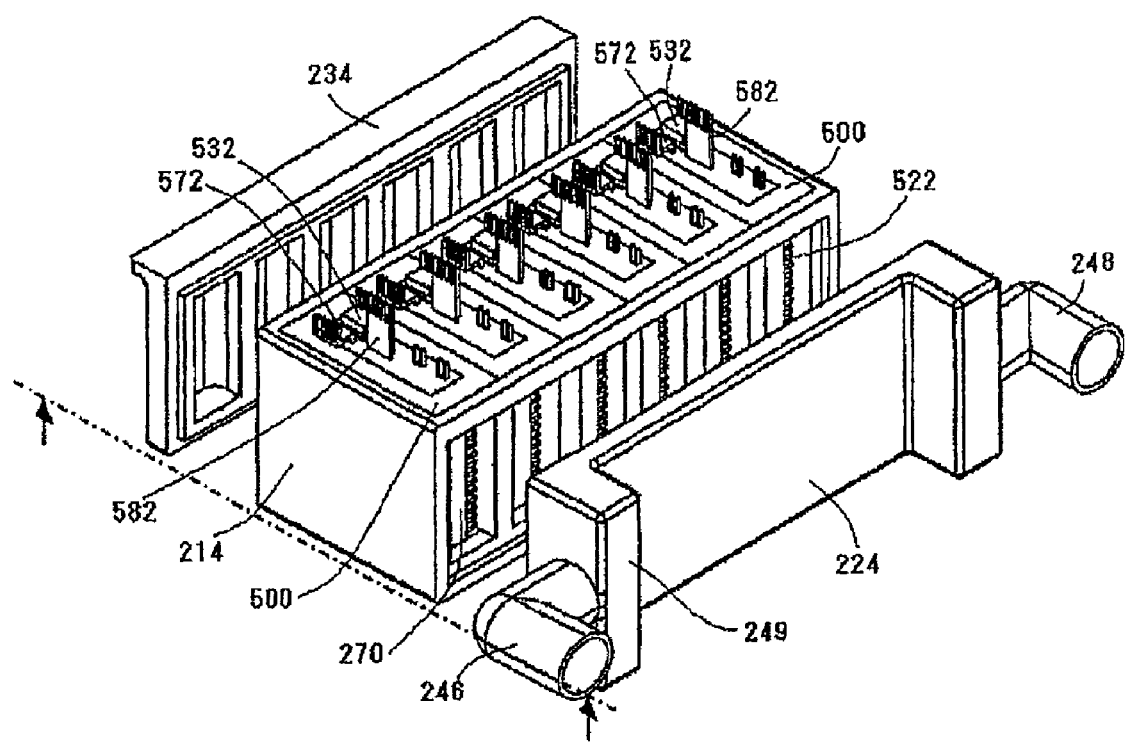
FIG. 14 is an exploded perspective view showing a main body, a front side, and a rear side of the channel case loaded with the semiconductor modules.
Figure 15:
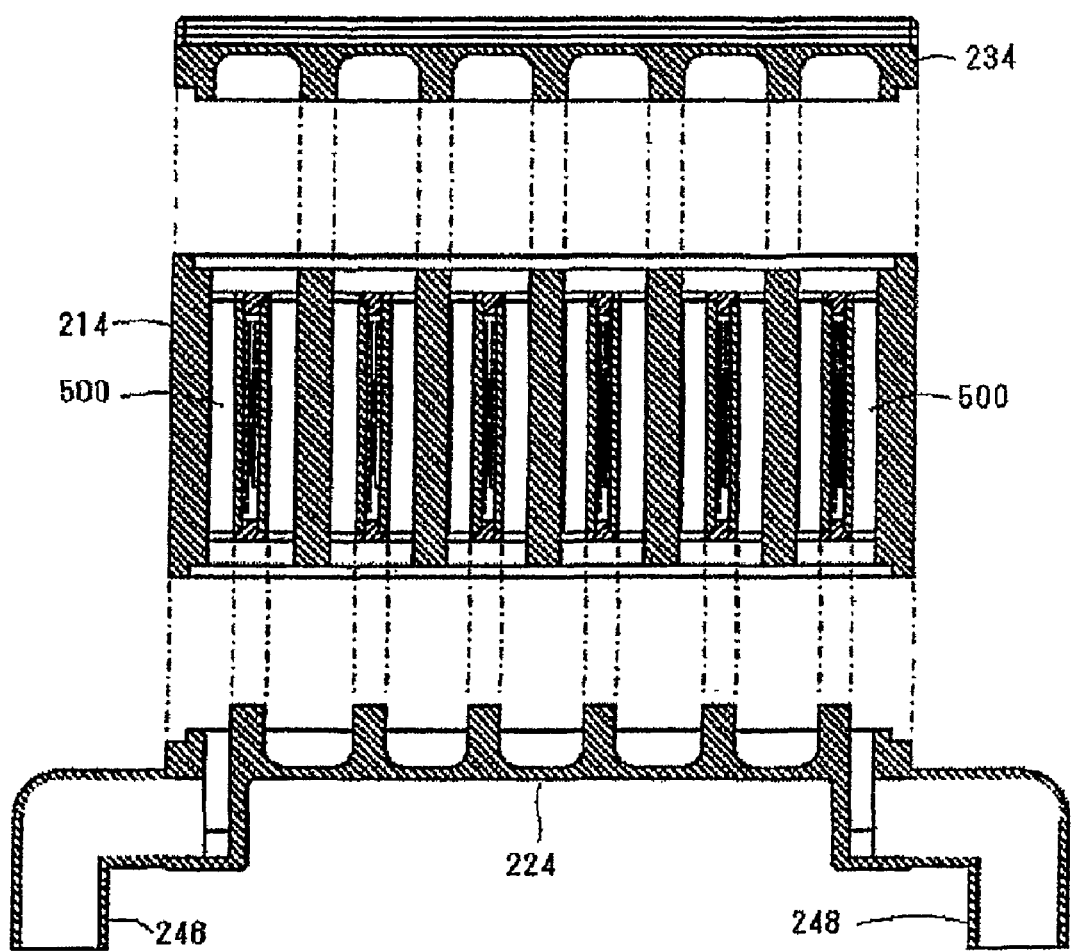
FIG. 15 is an exploded cross-sectional view showing a main body, a front side, and a rear side of the channel case loaded with the semiconductor modules.

FIG. 11 is a cross-sectional view illustrating flow of cooling water in a channel case loaded with the semiconductor modules according to the present embodiment. FIG. 12 is a cross-sectional view illustrating flow of cooling water in a channel case loaded with the semiconductor modules in the two-inverter device shown in FIG. 9. FIG. 13 is a plan view showing arrangements in the channel case of the positive terminal, the negative terminal, the alternate current terminal, the signal terminal, and the gate terminal of the semiconductor modules parallel-connected to each phase of the motor generator shown in FIG. 3. FIG. 14 is an exploded perspective view showing a main body, a front side, and a rear side of the channel case loaded with the semiconductor modules. FIG. 15 is an exploded cross-sectional view showing the main body, the front side, and the rear side of the channel case loaded with the semiconductor modules. FIG. 16 is a perspective view illustrating a manner in which the channel case is loaded with the semiconductor modules. FIG. 17 is a front view illustrating a manner in which the channel case is loaded with the semiconductor modules.

In FIGS. 11 and 12, 212 designates the channel case, 214 designates the main body of the channel case, 224 designates the front section of the channel case, 226 designates an inlet channel in the front section, 234 designates the rear section of the channel case, 236 designates a return channel in the rear section, 246 designates the inlet section, 248 designates the outlet section, and 250 to 255 designate flow of water.

As shown in FIG. 6 and in FIG. 14 to be detailed hereinbelow, there are provided the inlet channel 226 in the front section and the outlet channel 228 in the inlet section 246 between the outlet section 248 and the main body section 214 connected thereto (see FIG. 11). The channel heights of the channels 226 and 228 correspond to the height of the semiconductor module 500 (see water conduit 249 in FIG. 14). Therefore, the water flow 250 from the inlet section 246 is expanded in the inlet channel 226 in the front section to reach such a height that the water flows as high as the total height of the heat dissipation fins 522 and 526 in the semiconductor modules 500 loaded in the main body section 214. The water flows 251, 236, 253, and 227 are explained as follows. That is, the cooling water flows along the total height of the heat dissipation fin (side B) of the semiconductor module (the water flow 251), passes through the return channel 236 in the rear section 234, flows along the total height of the heat dissipation fin (side A) (the water flow 253), and passes through the return channel 227 in the front section 224, and then the cooling water flows to a next semiconductor module 500. In this manner, the semiconductor modules 500 are cooled through the both faces thereof.

FIG. 12 shows a structure in which the semiconductor modules in the two inverter devices are loaded in one channel case and cooled therein. One of the inverter devices includes six semiconductor modules 500-1 and the other of the inverter devices includes six semiconductor modules 500-2. As shown in FIG. 12, the semiconductor modules 500-1 and 500-2 are cascaded along the directions of the flows of water 251 and 253 in the channel case main body 214.

In the present embodiment, the inverter device is configured such that an opening that communicates with the channel is provided in the channel case 212 and the semiconductor module 500 is inserted in the opening. With this configuration, the semiconductor module 500 can be fixed the channel case after it has been produced in a production line for electronic circuits and undergone necessary inspections. This improves the productivity and reliability of the inverter device.

On each side of the semiconductor module 500, there is provided a cooling fin having a larger area and there is formed a flow of water. That is, when the semiconductor module 500 is inserted into the channel, a channel in which the water flows in an opposite orientation is formed. The cooling fin serves not only to release heat but also to form a laminar flow in an opposite orientation. The channel case is made by, for example, die casting and a narrower portion of the channel is defined by the fin of the semiconductor module 500. Therefore, the productivity of the inverter device is improved.

By inserting the semiconductor module 500 into the channel, a channel in which the water flows in an opposite orientation is formed and the channel has a smaller cross-sectional area than ever. Assuming that the flow rate of the cooling water at which it is supplied is, for example, unchanged, a decrease in cross-sectional area results in an increase in flow rate. As a result, the cooling effect is increased.

FIG. 14 shows a situation in which all the six semiconductor modules 500 are loaded in the channel case when the semiconductor modules are connected in parallel to each phase of the motor generator (see the circuitry shown in FIG. 3). FIGS. 16 and 17 show a situation in which the semiconductor modules 500 are loaded in the main body section 214 of the channel case 212 in sequence. The main body section 214 of the channel case includes a channel forming section 270 and partitions 271 that separate the channel forming section 270. The semiconductor modules 500 are loaded into the channel forming section 270 from above. On upper edge (s) of the top case 512 and/or the channel forming section 270 of the semiconductor module 500 is coated an adhesive to bond them. As shown in the figures, the channel forming section 270 and the heat dissipation fins 522 and 562 of the semiconductor module 500 is of substantially the same size, so that the cooling water flows along the depressed area.

As shown in FIG. 14, the front section 224 of the channel case 212 includes a water conducting section 249 having substantially the same volume as the channel forming section 270 (see FIG. 16) of the main body section subsequent to the channel inlet section 246. The water conducting section 249 enables formation of a water flow that is substantially uniform all along the height of the semiconductor module.

As shown in FIGS. 14 and 15, the channel case 212 is divided into the main body section 214, the front section 224, and the rear section 234. As a result, the main body section is configured to have a space serving as a channel that is open to both the front side and the rear side. This makes it possible to adopt the die casting method that involves use of aluminum as a material for the water channel. Also, it is possible to adopt the die casting method for producing the front section 224 and the rear section 234. Therefore, the productivity of the inverter device is improved.

FIG. 13 shows arrangement of the six semiconductor modules 500 in the channel case 212 when the semiconductor modules are connected in parallel to each phase of the motor generator (see the circuitry shown in FIG. 3). The upper and lower arms series circuits 500 shown in FIG. 3 are arranged as shown in FIG. 13, more particularly, 50V1 and 50V2 for the phase V, 50U1 and 50U2 for the phase U, and 50 WU1 and 50W2 for the phase W. The capacitor terminals 96 of the capacitor module are arranged in the same direction as that in which the positive electrode terminal 532 and the negative electrode terminal are arranged, so that the terminals of the semiconductor modules are directly connected to the terminals of the capacitor module. As a result, parasitic inductance is low and uniform and each semiconductor module operates uniformly and stably.

It is important that the plurality of upper and lower arm series circuits that constitute the respective phases U, V, and W have electric properties as uniform as possible. For example, the series circuits 50U1 and 50U2 that constitute the phase U have as same as possible electric properties. In the present embodiment, the capacitor module is fixed so as to face in the same direction as the direction of the arrangement of the direct current terminals 572 and 532 of the semiconductor module 500 that constitutes the series circuit 50U1 and of the semiconductor module 500 that constitutes the series circuit 50U2, respectively. As a result, a physical relationship between the terminal of the semiconductor module that constitutes the series circuit 50U1 and the terminal of the capacitor module connected thereto is the same as a physical relationship between the terminal of the semiconductor module that constitutes the series circuit 50U2 and the terminal of the capacitor module connected thereto. By arranging the capacitor modules in the direction in which the direct current terminals are arranged and providing the capacitor terminals, the electric properties of the series circuits 50U1 and 50U2 can be made substantially equal to each other.

In the present embodiment, the terminals of the semiconductor modules and the terminals of the capacitor modules are directly connected to each other. This is the most preferred configuration. However, they need not be directly connected. For example, when they are connected through a direct current busbar, which is, for example, a connecting conductor shaped such that a positive electrode conductor and a negative electrode conductor are arranged close to each other so as to face each other, the inductance can be maintained at considerably low levels.

The terminals 552, 553, 556, and 557 for control or detection are arranged so as to be directly connected to the control substrate 372 as shown in FIG. 7. Therefore, components of fluctuation for each phase due to the wiring between the semiconductor module 500 and the control circuit and driver circuit in the control substrate 372 is made small and uniform. When an additional semiconductor module 500 is to be connected to each phase that is constituted by two semiconductor modules 500 connected in parallel to each other to form a parallel connection between the three semiconductor modules 500, it is only needed to that the third semiconductor module 500 is simply arranged collaterally in FIG. 13, so that the semiconductor module 500 has excellent property of assembling additional ones.

Figure 36:
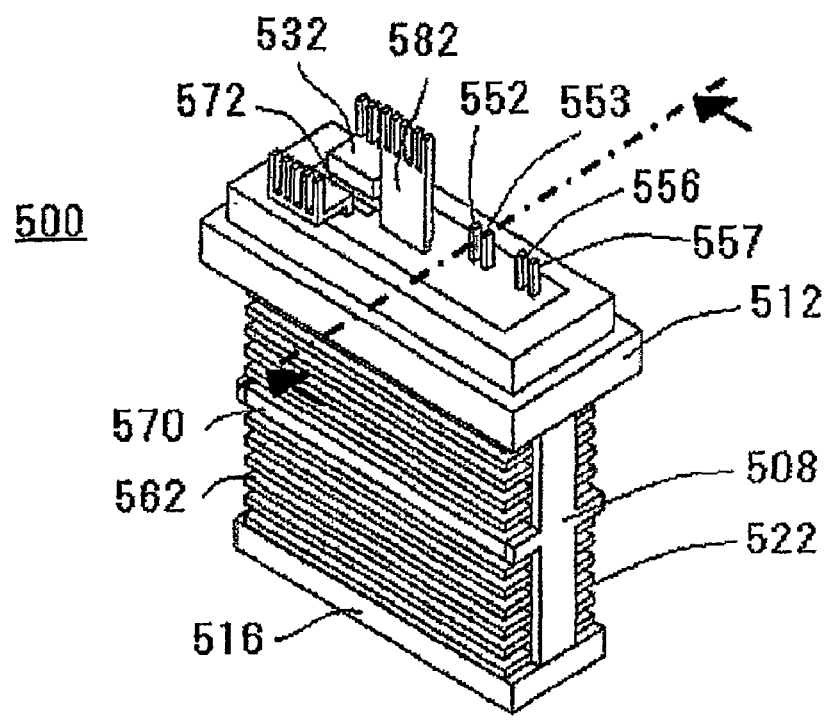
FIG. 36 is a perspective view showing another construction of the semiconductor module according to an embodiment of the present invention.
Figure 37:
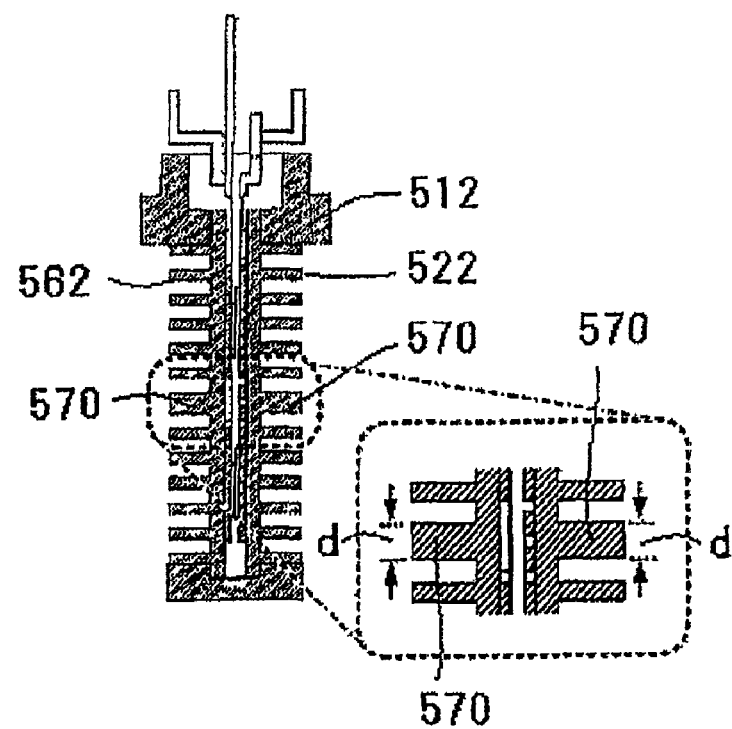
FIG. 37 is a cross-sectional view showing another construction of the semiconductor module according to an embodiment of the present invention as seen from the broken line in FIG. 36.
Figure 38:
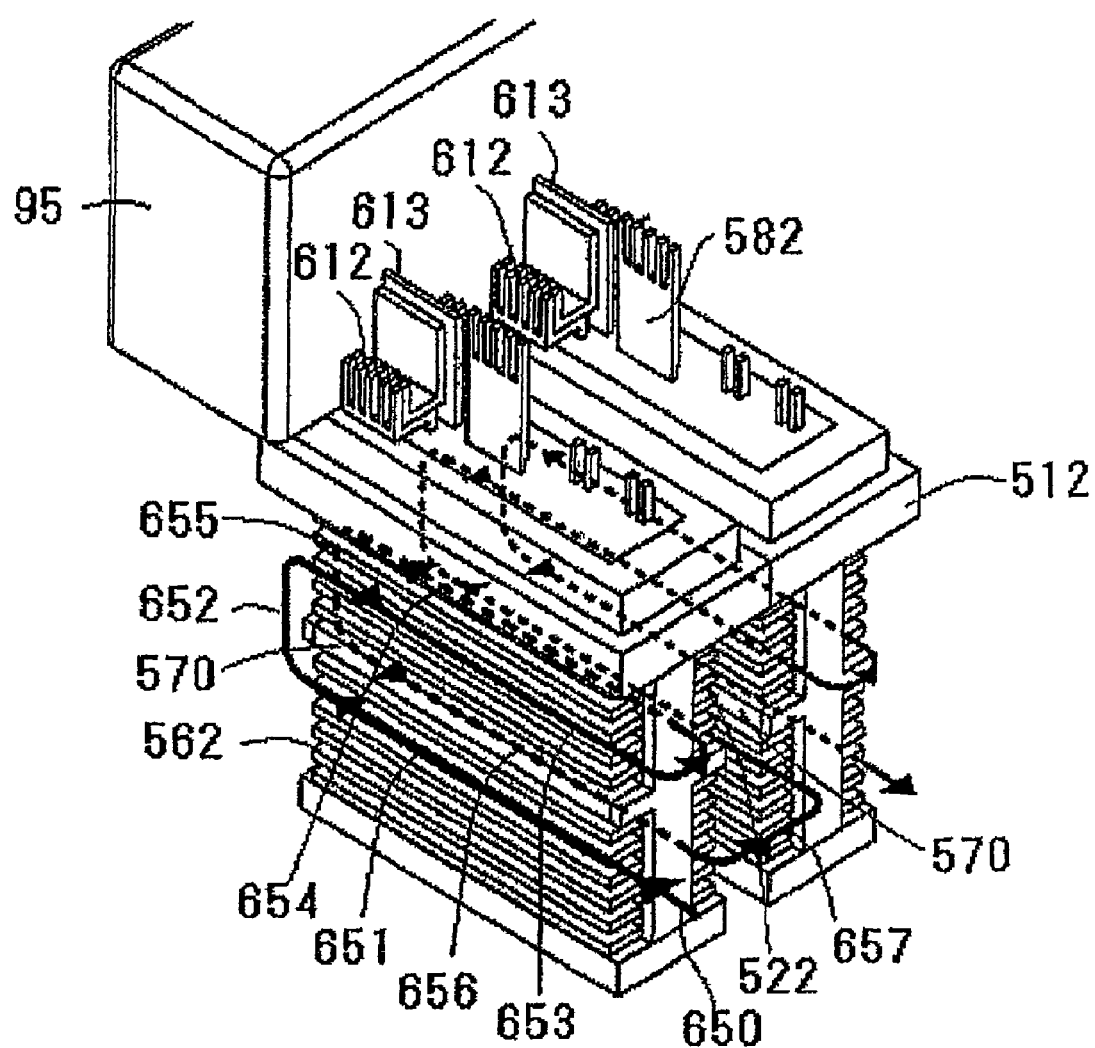
FIG. 38 is a perspective view illustrating the flow of cooling water in another configuration example of the semiconductor module according to an embodiment of the present invention.
Figure 39:
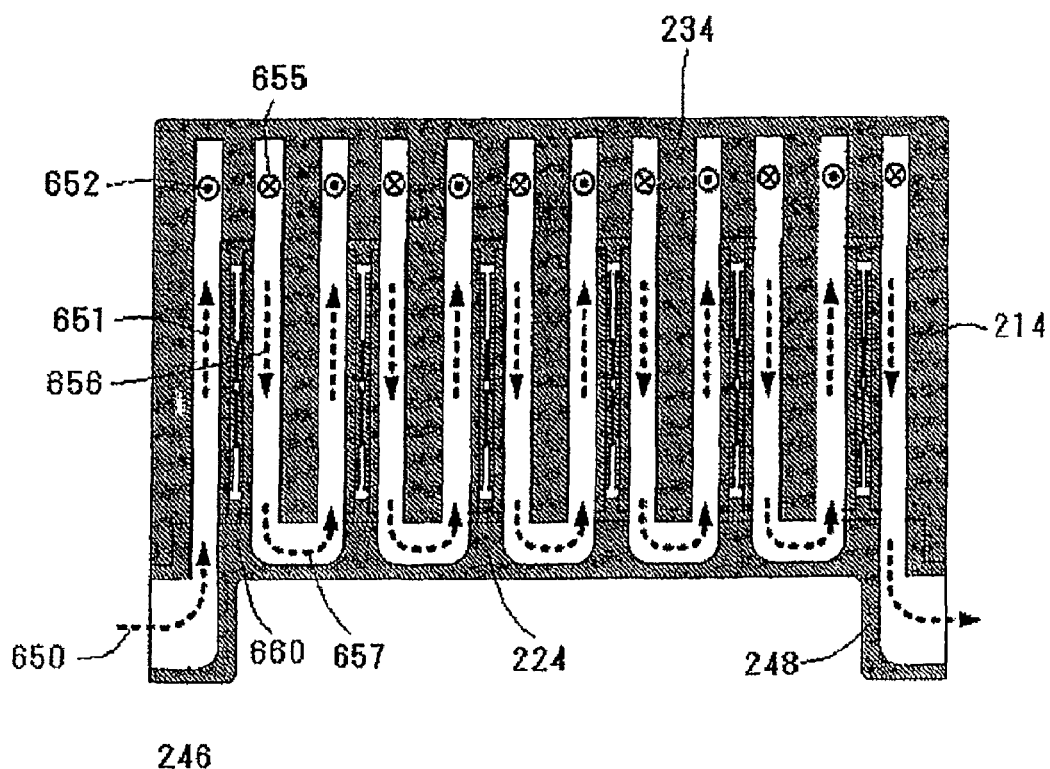
FIG. 39 is a cross-sectional view illustrating the flow of cooling water in the case where another configuration example of the semiconductor module according to an embodiment of the present invention is loaded in the water cooling case.
Figure 40:
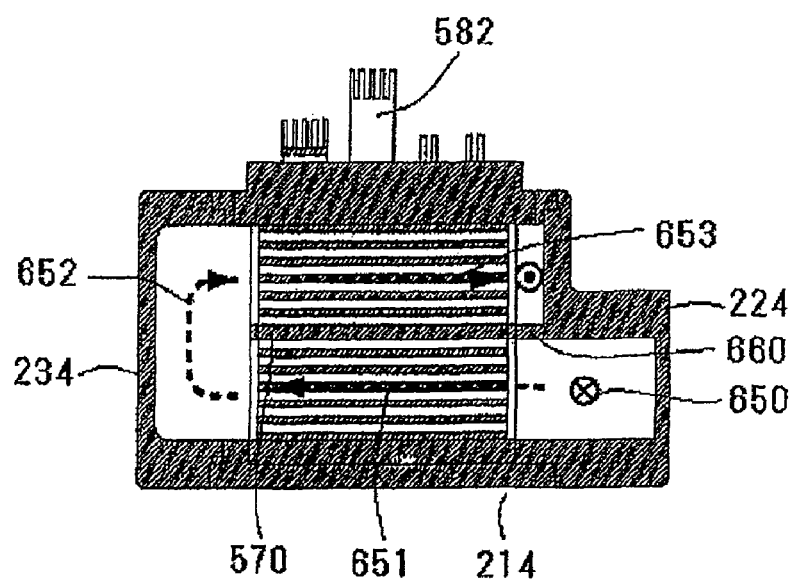
FIG. 40 is another cross-sectional view illustrating upper and lower flows of cooling water in the case where another configuration example of the semiconductor module according to an embodiment of the present invention is loaded in the water cooling case.

Other configuration examples of the semiconductor module and the cooling structure of the semiconductor module according to the present embodiment are described hereinbelow with reference to FIGS. 36 to 40. FIG. 36 is a perspective view showing another configuration example of the semiconductor module according to the present embodiment. FIG. 37 is a cross-sectional view showing another configuration example of the semiconductor module according to the present embodiment as seen from the direction of the broken line in FIG. 36. FIG. 38 is a perspective view illustrating the flow of cooling water in another configuration example of the semiconductor module according to the present embodiment. FIG. 39 is a cross-sectional view illustrating the flow of cooling water in the case where another configuration example of the semiconductor module according to the present embodiment is loaded in the water cooling case. FIG. 40 is another cross-sectional view illustrating upper and lower flows of cooling water in the case where another configuration example of the semiconductor module according to the present embodiment is loaded in the water cooling case.

The semiconductor module 500 shown in FIGS. 36 and 37 is different from the semiconductor module 500 shown in FIG. 18 in the structure of the heat dissipation fin. Specifically, the heat dissipation fin (side A) 522 and the heat dissipation fin (side B) 562 are each provided with a central fin 570 which is as thick as d in the center thereof. The position of the central fin 570 is a position at which the chips 52 and 56 of the upper arm and the chips 62 and 66 of the lower arm are vertically separated. With the central fin 570 (for example, the thickness d is about 1.5 to about 2 times as large as the thickness of other fins), the water flow can be separated into two stages one above another.

FIG. 38 schematically shows the flow of cooling water in the heat dissipation fins of the two semiconductor modules 500. The water flow 650 from the channel inlet section 246 (see FIG. 39) flows into only a lower portion (a lower half of the central fin 570) of the heat dissipation fin (side B) 562 of the first semiconductor module to form water flow 651. The water flow 651 becomes water flow 652 that ascends in the rear section 234 of the channel case to form water flow 653 in an upper portion (an upper half of the central fin 570) on the same heat dissipation fin (side B) 562 side. Subsequently, the water flow 653 turns its direction in the front section of the channel case to form water flow 654 in an upper portion of the heat dissipation fin (side A) 522. Subsequently, the water flow 654 is changed to a descending flow 655 to form water flow 656 in a lower portion of the heat dissipation fin (side A) 522. The water flow 57 turns its direction in the front section 224 in order to perform cooling of the next semiconductor module 500.

As will be understood from the structure shown in FIGS. 39 and 40, the reason why the water flow 651 is formed only in the lower portion of the heat dissipation fin (side B) of the semiconductor module is that a guide portion 660 is provided so as to extend from the inlet section 246 of the front section 224 of the channel case. The thickness d of the central fin 570 and close arrangement of the central fin 570 to the wall or partition 271 (see FIG. 17) serve to separate the flows that flow in the lower stage and the upper stage.

The following is an explanation made on the cooling effect obtainable when the other configuration example of the semiconductor module 500 shown in FIG. 36 is loaded in the channel case shown in FIGS. 39 and 40 to constitute a power conversion device. The explanation is made in comparison with the path of the cooling water in the channel case shown in FIG. 14 (i.e., the path formed corresponding to the total height of the heat dissipation fin of the semiconductor module). As shown in FIG. 23, by causing the cooling water to flow separately in the upper stage portion and the lower stage portion of the heat dissipation fin, the cross-sectional area of the path is approximately a half. Assuming that the income flow rate of the cooling water that flows into the inlet section 246 of the channel case 212 is constant (because of the large volume of the source of the cooling water that comes in), the flow rate of the cooling water that passes through the upper stage portion or the lower stage portion of the heat dissipation fin is approximately doubled. When the flow rate is increased, the amount of heat absorbed from the heat dissipation fin increases corresponding to the flow rate (since the amount of heat absorbed by the cooling water increases substantially proportional to the flow rate within a certain range of the flow rate). That is, when the semiconductor module having the central fin 570 as shown in FIG. 36 is adopted and paths of cooling water are formed separately with respect to time in the upper stage portion and the lower stage portion, the cooling effect of the semiconductor module is further increased.

Since the channel case is divided into the main body section 214, the front section 224, and the rear section 234 as shown in FIG. 39, the channel case can be produced by a die casting method, so that the productivity of the channel case is improved.

Figure 42:
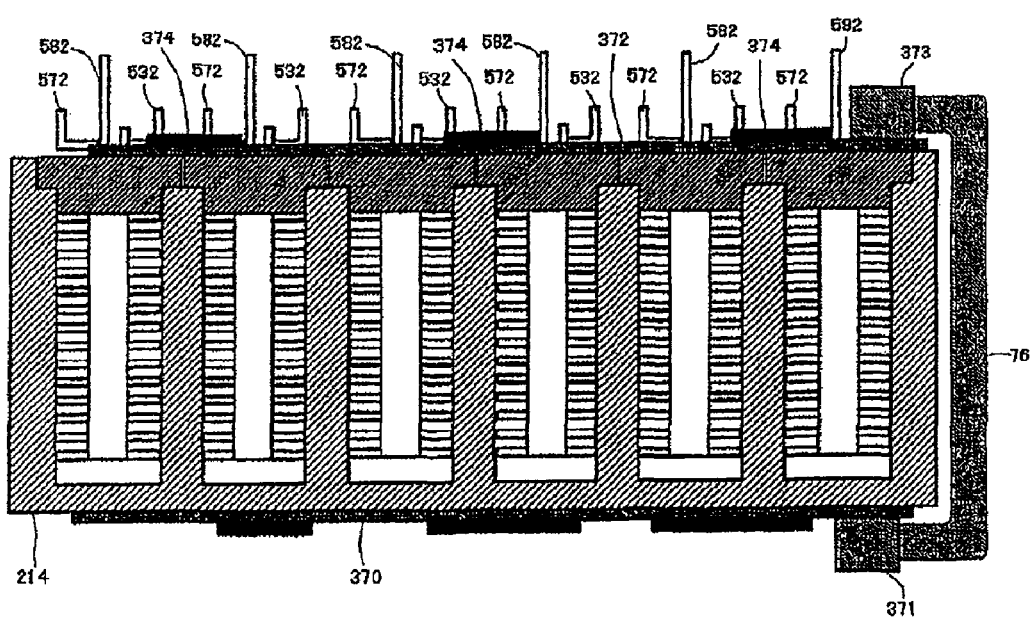
FIG. 42 is a diagram showing a configuration example in which the control substrate having the control circuit shown in FIG. 5 is arranged on the bottom of the channel case.

FIG. 42 shows another embodiment of the structure shown in FIG. 5 in which the control substrate 370 shown in FIG. 5 is arranged on the bottom of the channel case. In FIG. 5, the control substrate 370 having the control circuit 72 is arranged below the cover 132 and signals are sent from the connector 371 to the control substrate 372 having the driver circuit 74 through the signal line 76. The control substrate 370 is cooled in the upper case.

In FIG. 42, the control substrate 370 having the control circuit 72 is arranged on the bottom of the channel case 214 and fixed thereto. In this manner, the control substrate 370 is cooled and arranged utilizing the bottom space, so that the cooling effect is improved and downsizing of the device is possible. By arranging the control substrate 372, which is susceptible to noises since it includes the control circuit 72, on the bottom of the channel case 214, i.e., by arranging the terminals of the semiconductor module on one side and the control substrate 370 on the other side of the channel case 214, there can be obtained a structure having high reliability with respect to noises.

The above described embodiments are examples, and various modifications can be made without departing from the scope of the invention.

What is claimed is:
1. A power conversion device comprising:
a power semiconductor module that inverts direct current into alternating current; and
a channel-case having formed therein a channel adapted to flow a coolant therein, wherein
the power semiconductor module includes a power semiconductor element, a case that is adapted to accommodate the power semiconductor element, a main terminal that transmits the direct current or the alternating current, and a control terminal that transmits a control signal to the power semiconductor element,
the case includes a first heat dissipation member and a second heat dissipation member facing opposite to each other through the power semiconductor element, and a top case section with a flange,
the flange of the top case section has a surface configuration larger than a surface configuration of a bottom surface of the case,
the power semiconductor module is arranged in the channel, with the flange of the top case section being fixed to the channel-case,
the top case section is provided with a through-hole communicating an outside of the case with a space between the first heat dissipation member and the second heat dissipation member,
the main terminal and the control terminal extend through the through-hole to protrude out of the case, and
a mold resin material is filled in the space between the first and second heat dissipation members and in the through-hole.
2. A power conversion device according to claim 1, wherein when projected from a direction in which the main terminal protrudes, the through-hole has a projection that is larger than a projection of the space between the first and second heat dissipation members.

3. A power conversion device according to claim 1, wherein
the case includes the top case section, a bottom case section, and a side case section, and
the top case section, the bottom case section, and the side case section are separately formed and bonded together with an adhesive.

4. A power conversion device according to claim 1, wherein
the channel-case is provided with an opening communicating with the channel,
the flange of the top case section blocks the opening of the channel-case,
a first channel is provided between the first heat dissipation member of the case and one inner wall of the channel-case, and
a second channel is provided between the second heat dissipation member of the case and another inner wall of the channel-case.

5. A power conversion device according to claim 1, wherein
the power semiconductor module has incorporated therein an upper and lower arms series circuit of an inverter circuit constituted by the power semiconductor element,
the first and the second heat dissipation members have each a heat dissipation surface on one side and a conducting member formed on another side through an insulation member, the first and the second heat dissipation plates being disposed with the heat dissipation surfaces thereof facing each other;
a fixing portion is provided on the heat dissipation surface of the first heat dissipation member that fixes collector surfaces of semiconductor chips of the upper and lower arms of the semiconductor module, and a gate conductor connected to the control terminal is provided,
the gate electrode terminal of the semiconductor chip and the gate conductor is electrically connected to each other, and
the conducting member formed on the second heat dissipation member is connected to an emitter surface of the semiconductor chip fixed to the first heat dissipation member.

6. A power conversion device according to claim 5, wherein
the fixing conducting member and the gate conductor provided on the conducting member on the first heat dissipation member have the same height as seen from the first heat dissipation member, and
the gate electrode terminal provided on an emitter surface side of the semiconductor chip and the gate conductor are electrically connected through wire bonding.

7. A power conversion device according to claim 5, wherein
the conducting member provided on the first heat dissipation member through an insulating member includes a fixing portion that fixes a collector surface of a semiconductor chip and the gate conductor being formed by cutting,
the fixing portion and the gate conductor are both convex and soldered to the collector surface of the semiconductor chip arranged opposite to the fixing portion,
the fixing portion and the gate conductor are each convex and soldered to the collector surface of the power semiconductor element arranged opposite to the fixing portion, and
a gate electrode terminal provided on the soldered emitter surface side of the semiconductor chip and the gate conductor are wire bonded to each other.

8. A power conversion device according to claim 5, wherein
the conducting member provided with the fixing portion that fixes the collector surface is provided so as to extend as a direct current positive electrode terminal of the main terminal,
the conducting member provided with the gate conductor electrically connected to the gate electrode terminal of the semiconductor chip is provided so as to extend as a control terminal of the semiconductor module,
the conducting member provided on the second heat dissipation member connected to the emitter surface of the semiconductor chip of the lower arm is provided so as to extend as a direct current negative electrode terminal of the main terminal, and
the current positive electrode terminal and the direct current negative electrode terminal are arranged facing each other.

* * * * *